United States Patent
Tamaki

(10) Patent No.: US 9,825,163 B2
(45) Date of Patent: Nov. 21, 2017

(54) POWER MOSFET, AN IGBT, AND A POWER DIODE

(71) Applicant: RENESAS ELECTRONICS CORPORATION, Tokyo (JP)

(72) Inventor: Tomohiro Tamaki, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/855,980

(22) Filed: Sep. 16, 2015

(65) Prior Publication Data

US 2016/0035880 A1    Feb. 4, 2016

Related U.S. Application Data

(63) Continuation of application No. 13/548,687, filed on Jul. 13, 2012, now Pat. No. 9,166,036.

(30) Foreign Application Priority Data

Aug. 12, 2011    (JP) .................................. 2011-176794

(51) Int. Cl.
*H01L 29/78* (2006.01)
*H01L 29/40* (2006.01)
(Continued)

(52) U.S. Cl.
CPC ...... *H01L 29/7811* (2013.01); *H01L 29/0634* (2013.01); *H01L 29/402* (2013.01);
(Continued)

(58) Field of Classification Search
None
See application file for complete search history.

(56) References Cited

U.S. PATENT DOCUMENTS 6,844,592 B2   1/2005  Yamaguchi et al.
8,253,163 B2   8/2012  Kusunoki et al.
(Continued)

FOREIGN PATENT DOCUMENTS

JP    2007-116190    5/2007
JP    2010-267655    11/2010
(Continued)

OTHER PUBLICATIONS

Japanese Office Action received in corresponding Japanese Application No. 2011-176794 dated May 21, 2015.
(Continued)

*Primary Examiner* — Fazli Erdem
*Assistant Examiner* — Scott R Wilson
(74) *Attorney, Agent, or Firm* — Mattingly & Malur, PC

(57) ABSTRACT

Super-junction MOSFETs by trench fill system requires void-free filling epitaxial growth. This may require alignment of plane orientations of trenches in a given direction. Particularly, when column layout at chip corner part is bilaterally asymmetrical with a diagonal line between chip corners, equipotential lines in a blocking state are curved at corner parts due to column asymmetry at chip corner. This tends to cause points where equipotential lines become dense, which may cause breakdown voltage reduction. In the present invention, in power type semiconductor active elements such as power MOSFETs, a ring-shaped field plate is disposed in chip peripheral regions around an active cell region, etc., assuming a nearly rectangular shape. The field plate has an ohmic-contact part in at least a part of the portion along the side of the rectangle. However, in the portion corresponding to the corner part of the rectangle, an ohmic-contact part is not disposed.

6 Claims, 44 Drawing Sheets

(51) Int. Cl.
*H01L 29/868* (2006.01)
*H01L 29/66* (2006.01)
*H01L 29/739* (2006.01)
*H01L 29/861* (2006.01)
*H01L 29/06* (2006.01)
*H01L 29/16* (2006.01)
*H01L 29/417* (2006.01)
*H01L 29/10* (2006.01)
*H01L 29/872* (2006.01)

(52) U.S. Cl.
CPC ...... *H01L 29/404* (2013.01); *H01L 29/66727* (2013.01); *H01L 29/7396* (2013.01); *H01L 29/868* (2013.01); *H01L 29/8611* (2013.01); *H01L 29/0615* (2013.01); *H01L 29/0638* (2013.01); *H01L 29/0696* (2013.01); *H01L 29/1095* (2013.01); *H01L 29/1608* (2013.01); *H01L 29/41766* (2013.01); *H01L 29/872* (2013.01)

(56) References Cited

U.S. PATENT DOCUMENTS

| 8,809,969 | B2 | 8/2014 | Tarui et al. |
| 2005/0098826 | A1 | 5/2005 | Yamaguchi et al. |
| 2007/0057280 | A1* | 3/2007 | Hayashi ............... H01L 23/5225 257/127 |
| 2011/0115033 | A1* | 5/2011 | Tamaki ............... H01L 29/7395 257/409 |
| 2011/0204442 | A1 | 8/2011 | Guan et al. |

FOREIGN PATENT DOCUMENTS

| JP | 2011-108906 | 6/2011 |
| JP | 2011-129622 | 6/2011 |

OTHER PUBLICATIONS

Japanese Office Action received in corresponding Japanese Application No. 2016-119559 dated Mar. 16, 2017.

* cited by examiner

POWER MOSFET, AN IGBT, AND A POWER DIODE

CROSS-REFERENCE TO RELATED APPLICATIONS

The disclosure of Japanese Patent Application No. 2011-176794 filed on Aug. 12, 2011 including the specification, drawings and abstract is incorporated herein by reference in its entirety.

BACKGROUND

The present invention relates to a technology effectively applicable to a cell periphery layout technology or a breakdown voltage enhancing technology in a semiconductor device (or a semiconductor integrated circuit device).

In Japanese Unexamined Patent Publication No. 2007-116190 (Patent Document 1) or, or US Patent No. 2005-098826 (Patent Document 2) corresponding thereto, various structures are disclosed regarding the cell region periphery layout (edge termination structure) of a power MOSFET (Metal Oxide Semiconductor Field Effect Transistor) having a super-junction structure manufactured by a multi-epitaxy system or a trench insulation film filling system (trench inside ion implanting system). Examples thereof include a $P^-$ resurf region, and a potential fixing electrode with rounded corner parts, and assuming a generally rectangular shape.

Japanese Unexamined Patent Publication No. 2011-108906 (Patent Document 3) mainly discloses a cell region periphery layout (edge termination structure) of a two-dimensional or three-dimensional super-junction type by a trench fill system.

[Patent Document 1]
Japanese Unexamined Patent Publication No. 2007-116190
[Patent Document 2]
US Patent No. 2005/098826 A1
[Patent Document 3]
Japanese Unexamined Patent Publication No. 2011-108906

SUMMARY

The super-junction MOSFET by the trench fill system requires void-free filling epitaxial growth. This may require the alignment of the plane orientations of the trenches in a given direction. Further, in order to keep a desirable breakdown voltage with the super-junction structure, the column layout of the peripheral structure is important. Particularly, the column layout at the chip corner part may be bilaterally asymmetrical with respect to the diagonal line between the chip corners due to the restriction on the plane orientations. In this case, the equipotential lines in a blocking state are rendered in a curved manner at the corner parts due to the column asymmetry at the chip corner. As a result, the point at which the equipotential lines become dense tends to occur, which may cause a breakdown voltage reduction.

The present invention was done in order to solve these problems.

It is an object of the present invention to provide a high-reliability power type semiconductor device.

The foregoing and other objects, and the novel features of the present invention will be apparent through the description in this specification and the accompanying drawings.

Summaries of the representative ones of the inventions disclosed in the present application will be described in brief as follows.

Namely, in accordance with one invention of the present application, in power type semiconductor active elements such as power MOSFETs, in the chip peripheral regions around an active cell region assuming a nearly rectangular shape, and the like, a ring-shaped field plate is disposed. The field plate has an ohmic contact part at at least apart of the portion along the side of the rectangle. However, an ohmic contact part is not disposed in the portion corresponding to each corner part of the rectangle.

The effects obtainable by the representative ones of the inventions disclosed in the present application will be described in brief as follows.

Namely, in power type semiconductor active elements such as power MOSFETs, in the chip peripheral regions around an active cell region assuming a nearly rectangular shape, and the like, a ring-shaped field plate is disposed. The field plate has an ohmic contact part at at least apart of the portion along the side of the rectangle. However, an ohmic contact part is not disposed in the portion corresponding to each corner part of the rectangle. As a result, it is possible to prevent the reduction of the breakdown voltage at the chip corner parts.

DETAILED DESCRIPTION

Summary of Embodiments

Figure 1:
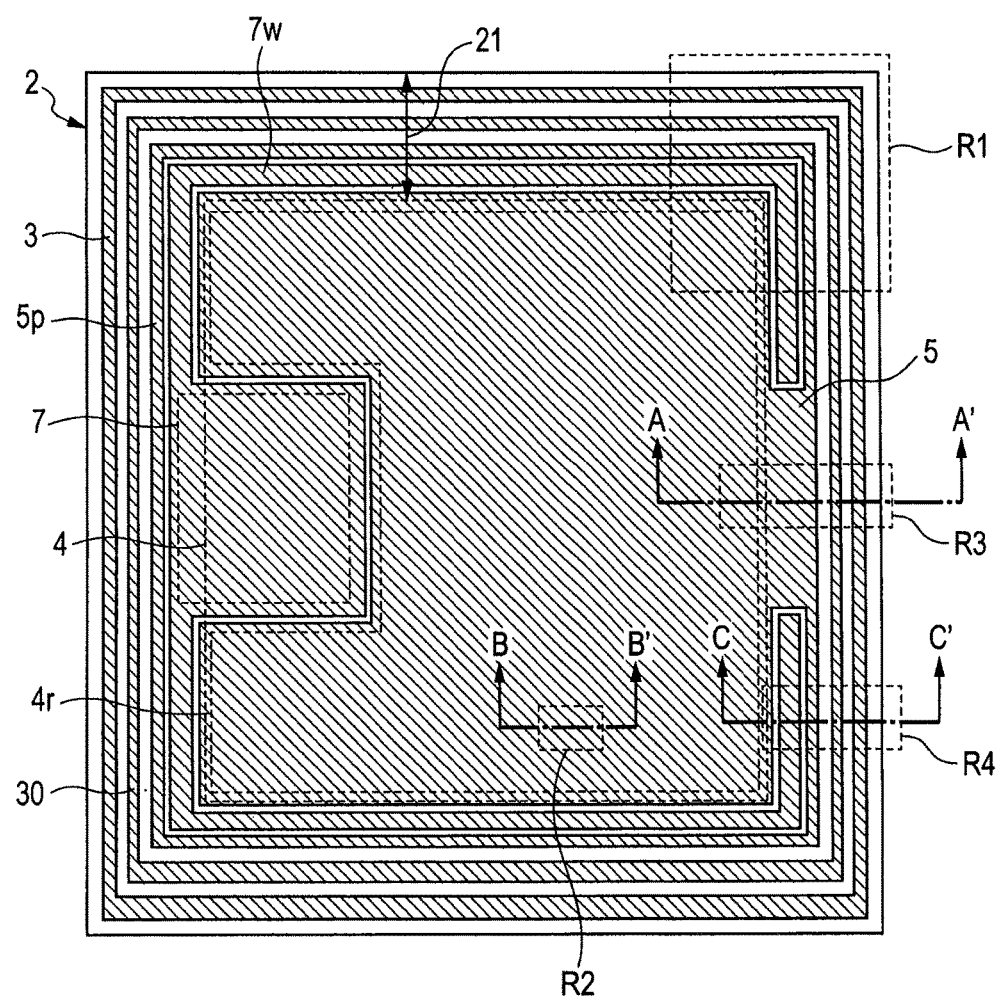
FIG. 1 is an entire top view (mainly the front surface) of a semiconductor chip for illustrating the device structure (basic structure) and the like of one example (two-dimensional resurf structure) of a power MOSFET (power type semiconductor active element) of one embodiment of the present application.

First, a summary will be described regarding the representative embodiments of the inventions disclosed in the present application.

1. A power MOSFET includes: (a) a source electrode formed over a first main surface of a semiconductor substrate, the semiconductor substrate having the first main surface and a second main surface, and assuming a nearly rectangular shape; (b) a first conductivity type drift region disposed in a semiconductor surface region over the almost entire surface on the first main surface side of the semiconductor substrate; (c) an active cell region disposed at the nearly central part over the first main surface, being almost equal in orientation to the semiconductor substrate, and having a nearly rectangular shape, a plurality of peripheral side regions disposed along each side of the active cell region, and in the outside thereof, and, a plurality of peripheral corner regions disposed in the outside of each corner part of the active cell region; and (d) a ring-shaped field plate disposed over the first main surface in such a manner as to surround the active cell region. The field plate has an ohmic contact part between the semiconductor surface region and it in at least any one of the peripheral side regions, and does not have an ohmic contact part between the semiconductor surface region and it in each of the peripheral corner regions.

2. In the power MOSFET according to the item 1, the semiconductor substrate is a silicon type semiconductor substrate.

3. The power MOSFET according to the item 1 or 2, further includes: (e) a super-junction structure disposed in the almost entire surface of the semiconductor substrate, and in the drift region.

4. In the power MOSFET according to any one of the items 1 to 3, the field plate mainly includes an aluminum type wiring layer.

5. In the power MOSFET according to the item 3 or 4, the super-junction structure in the peripheral side regions has a two-dimensional resurf structure.

6. In the power MOSFET according to the item 3 or 4, the super-junction structure in the peripheral side regions has a three-dimensional resurf structure.

7. An IGBT includes: (a) an emitter electrode and a gate electrode formed over a first main surface of a semiconductor substrate, the semiconductor substrate having the first main surface and a second main surface, and assuming a nearly rectangular shape; (b) a first conductivity type drift region disposed in a semiconductor surface region over the almost entire surface on the first main surface side of the semiconductor substrate; (c) an active cell region disposed at the nearly central part over the first main surface, being almost equal in orientation to the semiconductor substrate, and having a nearly rectangular shape, a plurality of peripheral side regions disposed along each side of the active cell region, and in the outside thereof, and, a plurality of peripheral corner regions disposed in the outside of each corner part of the active cell region; and (d) a ring-shaped field plate disposed over the first main surface in such a manner as to surround the active cell region. The field plate has an ohmic contact part between the semiconductor surface region and it in at least any one of the peripheral side regions, and does not have an ohmic contact part between the semiconductor surface region and it in each of the peripheral corner regions.

8. In the IGBT according to the item 7, the semiconductor substrate is a silicon type semiconductor substrate.

9. The IGBT according to the item 7 or 8, further includes: (e) a super-junction structure disposed in the almost entire surface of the semiconductor substrate, and in the drift region.

10. In the IGBT according to any one of the items 7 to 9, the field plate mainly includes an aluminum type wiring layer.

11. In the IGBT according to the item 9 or 10, the super-junction structure in the peripheral side regions has a two-dimensional resurf structure.

12. In the IGBT according to the item 9 or 10, the super-junction structure in the peripheral side regions has a three-dimensional resurf structure.

13. A power diode includes: (a) an anode electrode formed over a first main surface of a semiconductor substrate, the semiconductor substrate having the first main surface and a second main surface, and assuming a nearly rectangular shape; (b) a first conductivity type drift region disposed in a semiconductor surface region over the almost entire surface on the first main surface side of the semiconductor substrate; (c) a main diode region disposed at the nearly central part over the first main surface, being almost equal in orientation to the semiconductor substrate, and having a nearly rectangular shape, a plurality of peripheral side regions disposed along each side of the main diode region, and in the outside thereof, and, a plurality of peripheral corner regions disposed in the outside of each corner part of the main diode region; and (d) a ring-shaped field plate disposed over the first main surface in such a manner as to surround the main diode region. The field plate has an ohmic contact part between the semiconductor surface region and it in at least any one of the peripheral side regions, and does not have an ohmic contact part between the semiconductor surface region and it in each of the peripheral corner regions.

14. In the power diode according to the item 12, the semiconductor substrate is a silicon type semiconductor substrate.

15. The power diode according to the item 13 or 14, further includes: (e) a super-junction structure disposed in the almost entire surface of the semiconductor substrate, and in the drift region.

16. In the power diode according to any one of the items 13 to 15, the field plate mainly includes an aluminum type wiring layer.

17. In the power diode according to the item 15 or 16, the super-junction structure in the peripheral side regions has a two-dimensional resurf structure.

18. In the power diode according to the item 15 or 16, the super-junction structure in the peripheral side regions has a three-dimensional resurf structure.

[Explanation of Description Form, Basic Terms, and Methods in the Present Application]

1. In the present application, in the following description of embodiments, the description may be divided into a plurality of parts and sections for convenience, if required. However, unless otherwise specified, these are not independent of each other, but, are respective parts of a single example, in a relation such that one is a detailed explanation of a part of the other, a modification example of a part or the whole, or the like of the other. Further, in principle, the repetitive description of the same parts will be omitted. Whereas, respective constitutional elements in embodiments are not essential, unless otherwise specified, or except for the case where the number is theoretically limiting, and unless otherwise apparent from the context.

Further, in the present application, the term "semiconductor devices" mainly means various transistors (active elements) alone, or those prepared by integrating resistors, capacitors, and the like centering thereon over a semiconductor chip or the like (e.g., a single crystal silicon substrate). Herein, as a representative one of various transistors, there can be exemplified a MISFET (Metal Insulator Semiconductor Field Effect Transistor) represented by a MOSFET (Metal Oxide Semiconductor Field Effect Transistor). In this regard, as typical ones of various single transistors, there can be exemplified a power MOSFET and IGBT (Insulated Gate Bipolar Transistor).

Incidentally, in the present application, the term "semiconductor active element" represents a transistor, a diode, or the like.

2. Similarly, in the description of embodiments, and the like, the term "X including A" or the like for the material, composition, or the like does not exclude the one including an element other than A as a main constitutional element unless otherwise specified and unless otherwise apparent from the context. For example, for the component, the term is used to embrace "X including A as a main component", and the like. For example, it is naturally understood that the term "silicon member" or the like herein used is not limited to pure silicon, but also embraces a SiGe alloy, other multinary alloys containing silicon as a main component, and other members containing additives, and the like. Similarly, it is naturally understood that the terms "silicon oxide film", "silicon oxide type insulation film", and the like are used to embrace thermal oxide films and CVD oxide films of not only relatively pure undoped silicon dioxide, but also FSG (Fluorosilicate Glass), TEOS-based silicon oxide, SiOC (Silicon Oxicarbide) or Carbon-doped Silicon oxide or OSG (Organosilicate glass), PSG (Phosphorus Silicate Glass), BPSG (Borophosphosilicate Glass), and the like, silica type Low-k insulation films (porous type insulation films) obtained by introducing voids into coating type silicon oxides such as SOG (Spin On Glass), and nano-Clustering Silica: NSC, and the same members as these, composite films with other silicon type insulation films containing these as main constitutional elements, and the like.

Whereas, the silicon type insulation films commonly used in the semiconductor field as with silicon oxide type insulation films include silicon nitride type insulation films. Materials belonging to the system are SiN, SiCN, SiNH, SiCNH, and the like. The term "silicon nitride" as used herein includes both of SiN and SiNH unless otherwise specified otherwise. Likewise, the term "SiCN" as used herein means both of SiCN and SiCNH unless otherwise specified.

Incidentally, SiC has a property similar to that of SiN. However, SiON should often rather be classified into a silicon oxide type insulation film.

3. Similarly, preferred examples will be described regarding figures, positions, attributes, and the like. However, it is naturally understood that the present invention is not strictly limited thereto unless otherwise specified and unless otherwise apparent from the context.

4. Further, also when specific numerical values and quantities are mentioned, unless otherwise specified, except when they are theoretically limited to the numbers, and unless otherwise apparent from the context, each numerical value may be a numerical value of more than the specific numerical value, or may be a numerical value of less than the specific numerical 5. The term "wafer" herein used generally denotes a single crystal silicon wafer for forming a semiconductor device (or a semiconductor integrated circuit device or an electronic device) thereover. However, it is naturally understood that the term "wafer" also embraces a composite wafer or the like of an insulating substrate such as an epitaxial wafer, a SOI substrate, or a LCD glass substrate and a semiconductor layer or the like.

6. Generally, in the super-junction structure, in a semiconductor region of a given conductivity type, columnar or plate-shaped column regions of the opposite conductivity type are inserted roughly equidistantly so as to keep the charge balance. The term "super-junction structure" by a trench fill system as referred to in the present application denotes the structure in which in principle, into a semiconductor region of a given conductivity type, "column regions" which is of the opposite conductivity type and is plate-shaped (generally, which is flat-plate-shaped, but may also be bent or distorted) are inserted roughly equidistantly so as to keep the charge balance. In embodiments, a description will be given to the structure formed by spacing, in an N type semiconductor layer (e.g., drift region), P type columns equidistantly in parallel with one another. Further, the thicknesses Wp of the P type columns at respective portions (e.g., FIG. 4) may be mutually different from one site to another. However, when the structure is manufactured with a trench fill system, the columns desirably have the mutually same thickness Wp (width). This is because a different in trench width results in a difference in filling characteristics among respective parts.

Incidentally, in the present application, a drift region not having a super-junction structure may be referred to as a single conductivity type drift region.

For the super-junction structure, the term "orientation" denotes the longitudinal direction (in a plane in parallel with the main surface of the chip or the wafer) when the P type columns or N type columns forming the super-junction structure are seen two-dimensionally correspondingly to the main surface of the chip.

Whereas, the term "peripheral super-junction region" represents a peripheral outer region of an active cell region (e.g., a chip peripheral region 21 of FIG. 2), namely, a region which is a peripheral edge termination area, and in which a super-junction structure is disposed.

Further, in the present application, the structure in which the degree of flexibility of expansion of the depletion layer in the main region of the peripheral super-junction region (except for a part of the corner part) is 3 is referred to as a "3D (three-dimensional)-Resurf structure". Whereas, the structure with the same degree of flexibility of 2 is referred to as a "2D (two-dimensional)-Resurf structure".

In the present application, for the resurf (Reduced Surface Field) structure, a surface resurf region (specifically, a "P-type resurf region") or "Junction Termination Extension" denotes a region formed in a surface region of the drift region, coupled to the end of the P type body region (P type well region) forming the channel region, is of the same conductivity type, and has a lower impurity concentration than that (which is the concentration of such a degree as to cause full depletion when the main junction is applied with a reverse voltage). Generally, the region is formed in a ring form in such a manner as to surround the cell part.

Whereas, the field plate at the source electrode end denotes a portion which is a conductor film pattern coupled to the source potential or a potential equivalent thereto, extends over the surface (device side) of the drift region via an insulation film, and surrounds the cell part.

On the other hand, the field plate in the chip peripheral region denotes the one which is a field plate in a nearly ring form, and electrically coupled to the underlying semiconductor substrate. Incidentally, in the present application, the term "ring shape" generally denotes the shape forming a closed loop (the shape of the loop may be a nearly rectangle, a nearly circle, or a nearly elliptical ring so long as it satisfies given conditions described later). However, the loop is not required to be strictly closed, and may be outwardly closed. Namely, the loop may be a ring-shaped array of mutually separated conductors.

Further, in the present application, the term "rectangle" or "rectangular shape" denotes a nearly square or rectangular shape. However, the shape may have bumps and dips having a relatively smaller area relative to the total area, or may be subjected to a rounding or chamfering processing, or the like. Incidentally, for the rectangles, the wording "being equal in orientation" denotes that at least ones of the symmetry axes of rotation in the corresponding plane figure are roughly the same. In other words, the corresponding sides are roughly in parallel with one another.

Further, the floating field ring or the field limiting ring denotes an impurity region or an impurity region group disposed apart from the P type body region (P type well region) in the surface (device side) of the drift region, having the same conductivity type as that, having the similar concentration (which is the concentration of such a degree as not to cause full depletion when the main junction is applied with a reverse voltage), and surrounding the cell part in a ring form one-fold or multi-fold.

Further, in the present application, the wording "the local charge balance is kept" denotes that the charge balance is kept within the range of the distances of about the thicknesses (Wp and Wn), for example, when the chip main surface is seen in plan view.

Details of Embodiments

The embodiments will be further described in details. Below, the details of the embodiments will be described by way of a plurality of divided parts. Unless otherwise specified, the cited "sections", "embodiments", and the like denote those belonging to the same part in principle.

In respective figures, the same or similar portions are indicated with the same or similar signs or reference numbers. The description thereon is not repeated in principle.

Further, in the accompanying drawings, hatching or the like may be omitted even in cross section when it rather complicates the drawing, or when it is apparently distinct from the gap. In conjunction with this, when apparent from the description or the like, even for a two-dimensionally closed hole, the background outline may be omitted. Further, even not in cross section, hatching may be added in order to clearly demonstrate that the part is not a gap.

Incidentally, the number of the P type columns shown in each figure is about 3 to 5 for, for example, the peripheral side region or the like for convenience of showing. However, the number may exceed about 10 in actuality (incidentally, the total number of the P type columns in the whole chip is considered to be generally several hundreds to several thousands, but, for convenience of showing, it is represented by a small number). The examples herein shown will be described by taking a product with a breakdown voltage of about several hundreds of volts as an example. In the following examples, a description will be given by taking a product with a breakdown voltage of about several hundreds of volts (specifically, for example, about 600 volts) as an example.

Incidentally, as the applied patent publications regarding the MOSFET having a super-junction structure and the like by the present inventors, there are, other than the Laid-open patent application (Japanese Unexamined Patent Publication No. 2011-108906), for example, Japanese Patent Application No. 2010-109957 (Japanese Application Date: May 12, 2010), Japanese Patent Application No. 2010-81905 (Japanese Application Date: Mar. 31, 2010), Japanese Patent Application No. 2010-116466 (Japanese Application Date; May 20, 2010), Japanese Patent Application No. 2010-292117 (Japanese Application Date: Dec. 28, 2010), Japanese Patent Application No. 2010-292119 (Japanese Application Date: Dec. 28, 2010), and Japanese Patent Application No. 2010-292118 (Japanese Application Date: Dec. 28, 2010).

1. Explanation of Device Structure (Basic Structure) and the Like of One Example (Two-Dimensional Resurf Structure) of Power MOSFET (Power Type Semiconductor Active Element) of One Embodiment of the Present Application (Mainly FIGS. 1 to 7)

In this example, a specific description will be given by taking a planar type MOSFET formed in a silicon type semiconductor substrate, and having a source-drain breakdown voltage of about 600 volts as an example (the same also applies to the following sections for the planar type power MOSFET). It is naturally understood that the description is applicable to power MOSFETs having other breakdown voltage values, and other devices.

Figure 3:
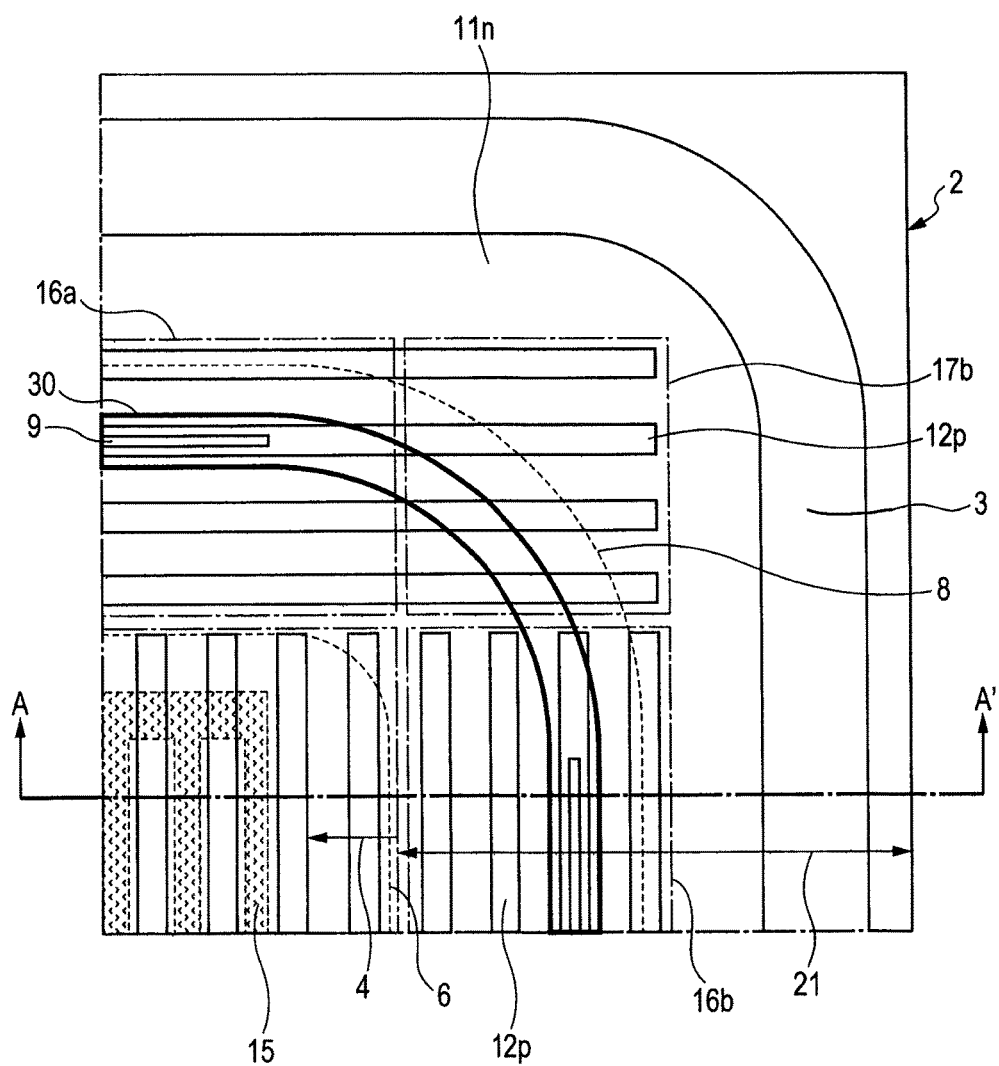
FIG. 3 is a chip top surface partial schematic enlarged view corresponding to a chip corner part cut-out region R1 of FIG. 2 (FIG. 1)

Incidentally, in the present application, when detailed planar structure and the like are described, a description is given by taking one chip corner part as an example, as in FIG. 3. However, respective corner parts are different in orientation, but have roughly the same layout. For this reason, the description given on a specific corner part also holds true for other corner parts.

Figure 2:
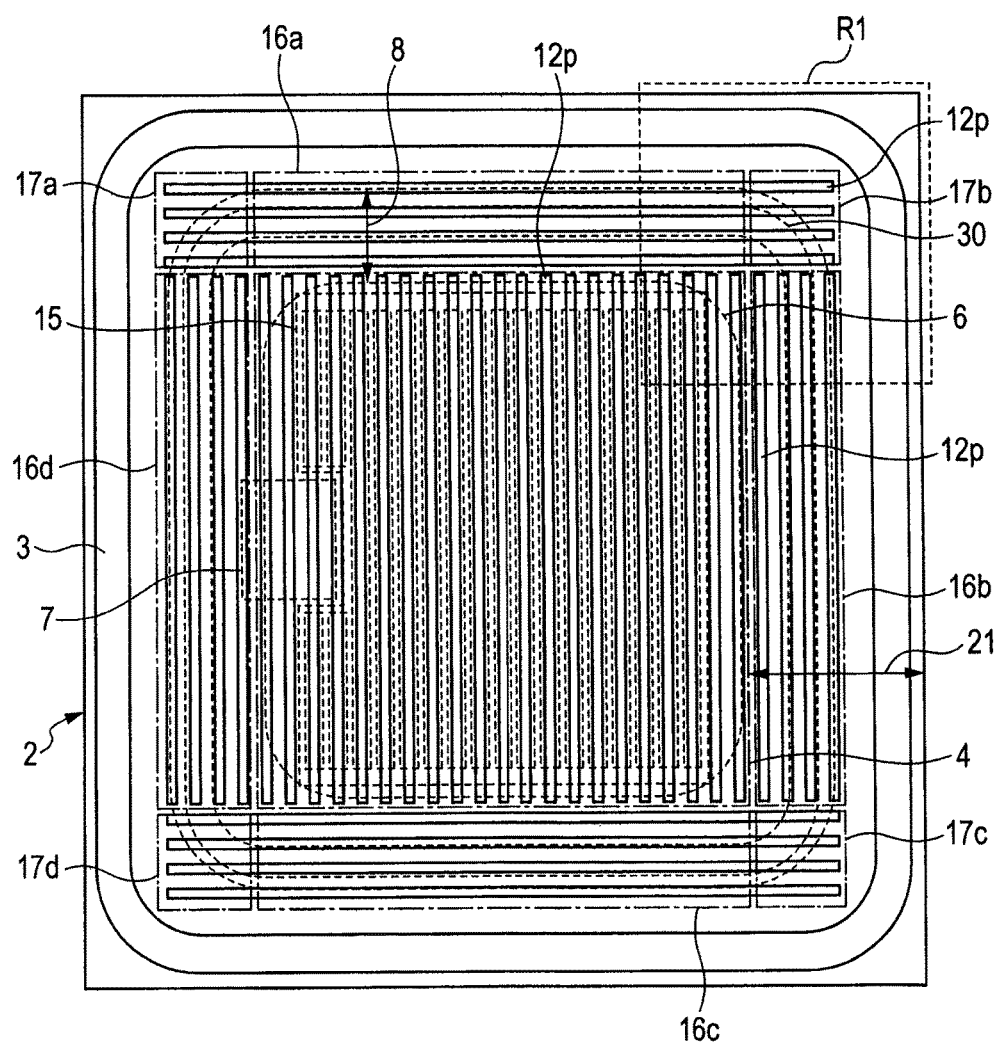
FIG. 2 is an entire top view (mainly an impurity region structure) of the semiconductor chip for illustrating the situation under a metal electrode of FIG. 1.
Figure 4:
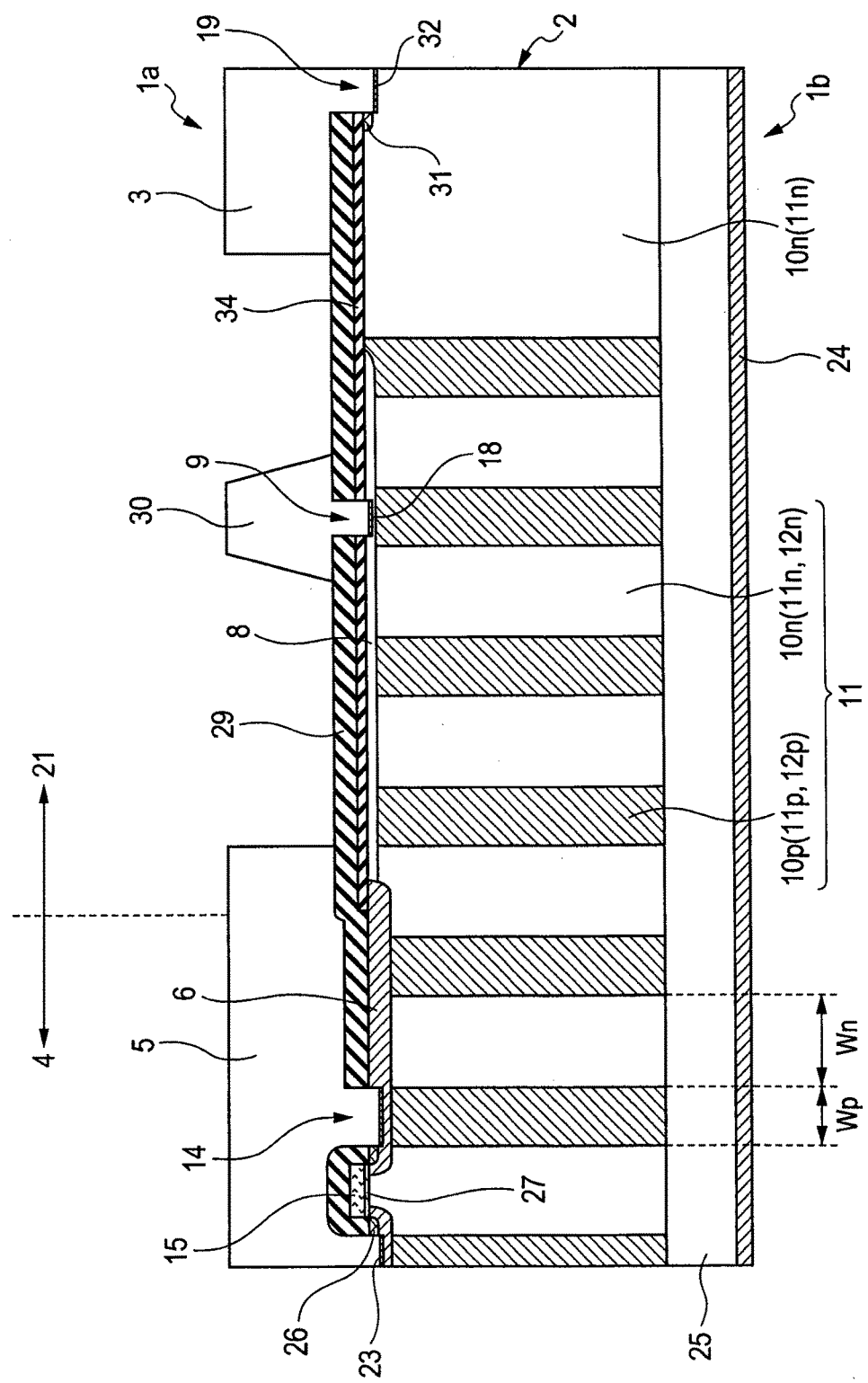
FIG. 4 is a schematic chip cross-sectional view corresponding to the A-A' cross section of FIG. 3 (also roughly corresponding to the A-A' cross section of an active cell part and a chip end cut-out region R3 of FIG. 1)
Figure 5:
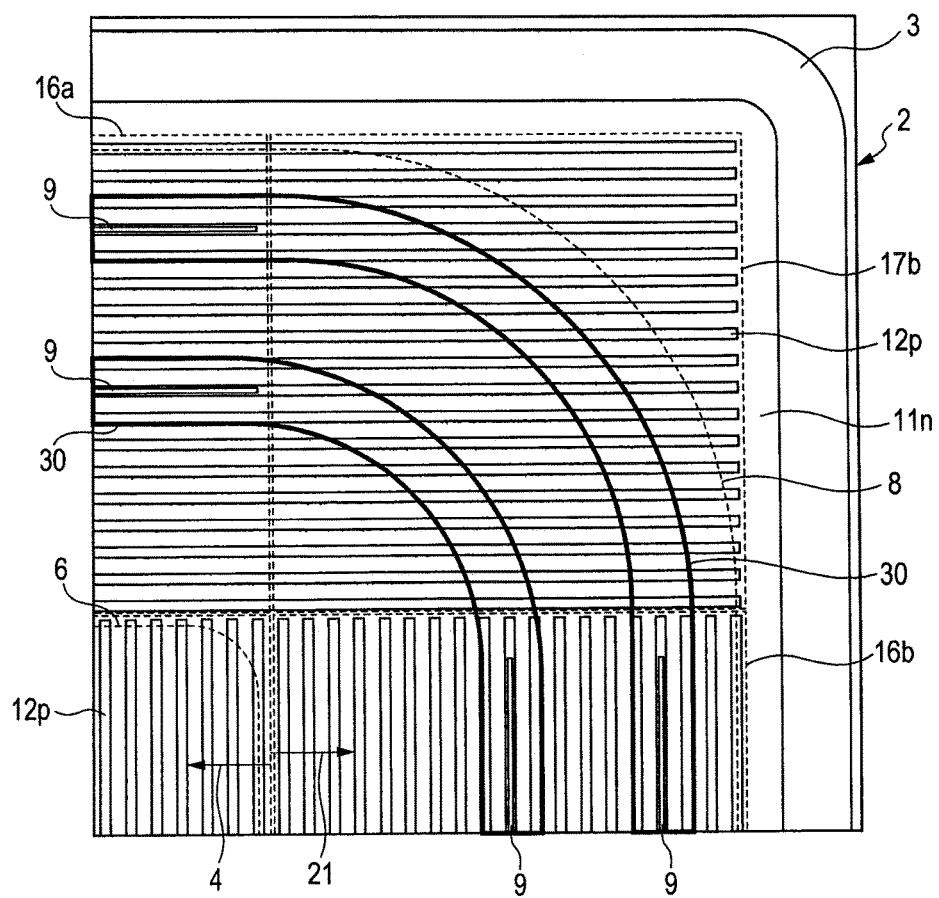
FIG. 5 is a chip top surface partially enlarged view corresponding to the chip corner part cut-out region R1 corresponding to FIG. 2 (FIG. 1) closer to the real one than FIG. 3.
Figure 6:
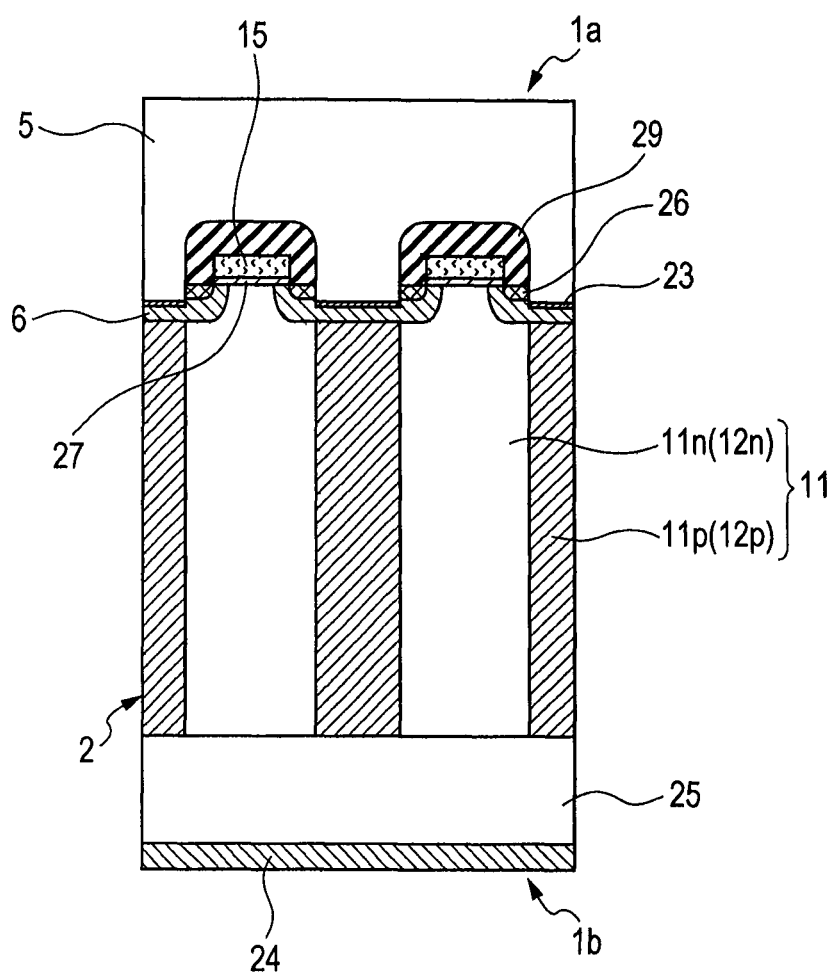
FIG. 6 is a chip cross-sectional view corresponding to the B-B' cross section of the active cell part cut-out region R2 of FIG. 1.
Figure 7:
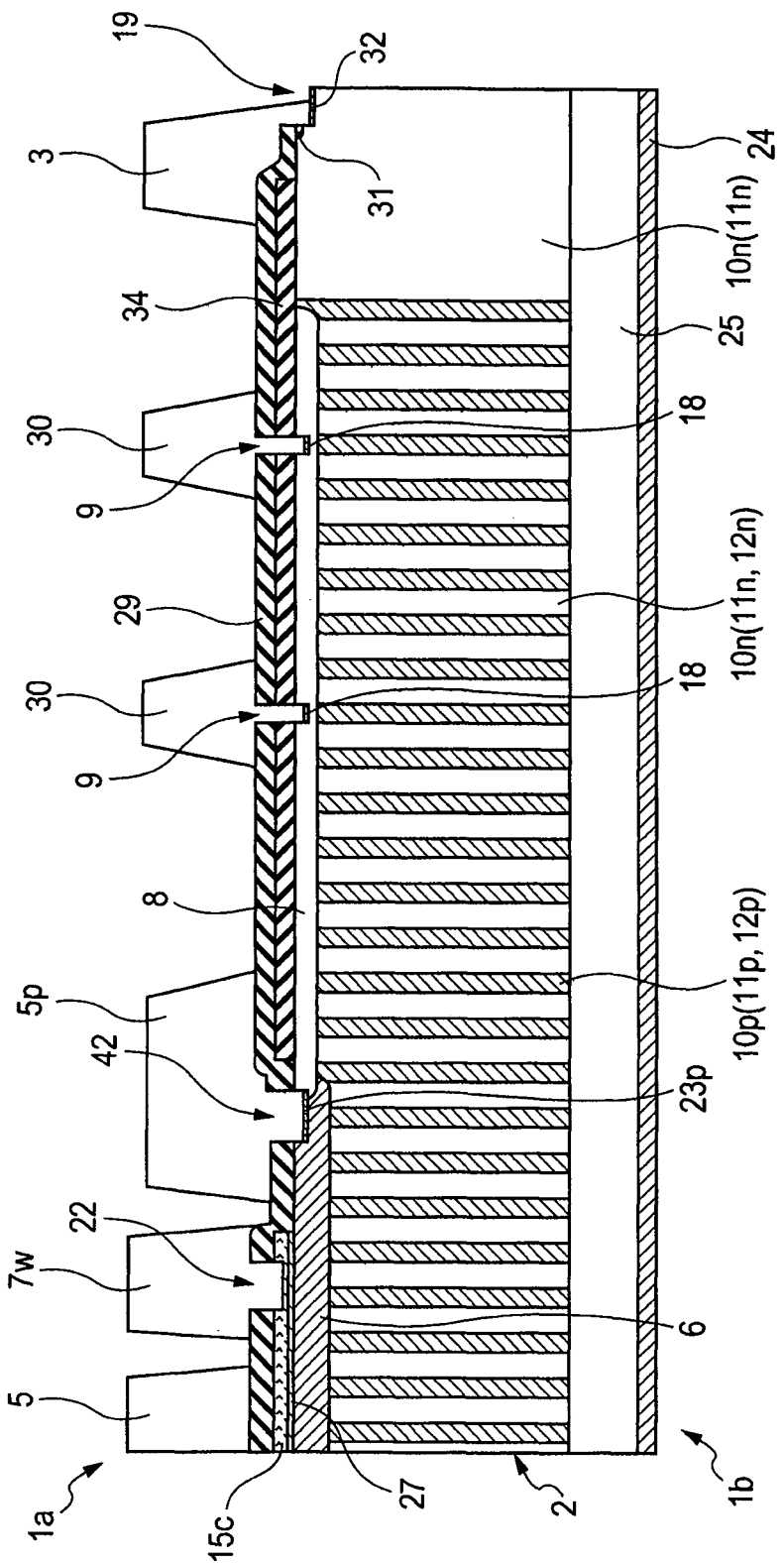
FIG. 7 is a chip cross-sectional view corresponding to the C-C' cross section of the active cell end & chip end cut-out region R4 of FIG. 1 closer to the real one than FIG. 4.

FIG. 1 is an entire top view (mainly the front surface) of a semiconductor chip for illustrating the device structure (basic structure) and the like of one example (two-dimensional resurf structure) of a power MOSFET (power type semiconductor active element) of one embodiment of the present application. FIG. 2 is an entire top view (mainly an impurity region structure) of the semiconductor chip for illustrating the situation under a metal electrode of FIG. 1. FIG. 3 is a chip top surface partial schematic enlarged view corresponding to a chip corner part cut-out region R1 of FIG. 2 (FIG. 1). FIG. 4 is a schematic chip cross-sectional view corresponding to the A-A' cross section of FIG. 3 (also roughly corresponding to the A-A' cross section of an active cell part and a chip end cut-out region R3 of FIG. 1). FIG. 5 is a chip top surface partially enlarged view corresponding to the chip corner part cut-out region R1 corresponding to FIG. 2 (FIG. 1) closer to the real one than FIG. 3. FIG. 6 is a chip cross-sectional view corresponding to the B-B' cross section of the active cell part cut-out region R2 of FIG. 1. FIG. 7 is a chip cross-sectional view corresponding to the C-C' cross section of the active cell end & chip end cut-out region R4 of FIG. 1 closer to the real one than FIG. 4. Based on these, a description will be given to the device structure (basic structure) and the like of one example (two-dimensional resurf structure) of the power MOSFET (power type semiconductor active element) of one embodiment of the present application.

First, a description will be given to the schematic layout of the top surface of the chip (generally, several millimeters square). As shown in FIGS. 1 and 2, in a power MOSFET element chip 2 in which an element is formed over a square or rectangular (i.e., tetragonal) plate-shaped silicon type semiconductor substrate (which is a wafer 1 before division into individual chips 2), a metal source electrode 5 (aluminum type electrode) present at the central part over the device main surface 1a (first main surface) accounts for the major area. Under the metal source electrode 5, there is disposed an active cell region 4. The outer end thereof becomes a P type main junction 6 (the outer edge of the P body region). Incidentally, the periphery of the chip which is the outside of the active cell region 4 is referred to as a chip peripheral region 21.

The inside of the P type main junction 6 is a repeating structural part 4r of active cell region 4. On the outside of the ring-shaped P type main junction 6, there are disposed a similarly ring-shaped P− type surface resurf region 8 and a peripheral super-junction region (a region in which linear P columns 12p and N type drift regions 11n therebetween are periodically arranged roughly equidistantly in a peripheral drift region 11, or a collective region thereof). Herein, the outer end of the P− type surface resurf region 8 is, for example, in the vicinity of the outer end of the peripheral super-junction region. Incidentally, in this example, the peripheral super-junction region includes four peripheral side regions 16a, 16b, 16c, and 16d and four peripheral corner regions 17a, 17b, 17c, and 17d.

Further, therearound, an aluminum type metal guard ring 3 is disposed. Between the aluminum type metal guard ring 3 and the metal source electrode 5, there are disposed a metal gate electrode 7 (including a metal gate wire 7w) for extracting the polysilicon gate electrode to the outside, and a metal source electrode peripheral part 5p (the field plate part at the source electrode end). Incidentally, in FIG. 1 (the same for FIGS. 2 and 3), the peripheral edge termination area is drawn in an exaggerated manner with an increased width for ease of understanding of the structure thereof.

Then, a description will be given to the planar diffusion structure (impurity doped structure) and device layout of the chip 2. As shown in FIG. 2, at the central part of the chip 2, there is disposed the active cell region 4 (an active cell part super-junction structure is present at the underlying part). In the inside thereof, there are disposed a large number of linear polysilicon gate electrodes 15. Further, in the outside of the ring-shaped P type main junction 6 which is the outer edge of the active cell region 4, and surrounds the circumference thereof, there is disposed a ring-shaped P− type surface resurf region 8 coupled with the P type main junction 6, and surrounding the active cell region 4.

Then, a description will be given to the super-junction structure in the periphery of the active cell part super-junction structure, namely, the peripheral super-junction region. In the peripheral side regions 16a and 16c, there are disposed super-junction structures not coupled with the active cell part super-junction structure, and each having an orientation orthogonal thereto, respectively. On the other hand, in the peripheral side regions 16b and 16d, there are disposed super-junction structures not coupled with the active cell part super-junction structure, and each having the same periodicity and orientation as that, respectively. Incidentally, with the column layout, respective peripheral corner regions 17a, 17b, 17c, and 17d are the extended regions of the peripheral side regions 16b and 16d on the left or right side thereof.

Then, FIG. 3 shows a schematic (the number of the P columns 12p is reduced to a smaller number than the actual number to make clear the relation among the elements) expanded view of FIG. 2 corresponding to the chip corner part cut-out region R1 of FIG. 1. As shown in FIG. 3, the outer end of the P− type surface resurf region 8 is, entirely therearound, in the vicinity of the outer end of the peripheral super-junction region. As shown in FIG. 1, in the repeating structural part 4r in the active cell region, there is disposed a periodic structure (one-dimensional periodic structure) in which the P+ body contact regions 23 (see FIG. 6) and the polysilicon gate electrodes 15 are alternately repeated. Further, in the peripheral super-junction region (FIG. 1), a ring-shaped field plate 30 (metal field plate in the chip peripheral regions) is disposed in such a manner as to surround the active cell region 4. Further, in the field plate 30, field plate contact parts 9 (contact grooves or contact holes) extending roughly in parallel are disposed along the sides of the active cell region 4 in a nearly rectangular shape. On the other hand, in each portion of the field plate 30 in the peripheral corner regions 17b (17a, 17c, and 17d), the field plate contact part 9 is not disposed. This is due to the following fact: the potential obtained through the contact part 9 in the peripheral side region 16a (16b, 16c, or 16d) in which the distribution of equipotential planes is relatively flat is supplied to the field plate 30 over the peripheral corner region 17b (17a, 17c, or 17d).

Then, the A-A' cross section of FIG. 3 is shown in FIG. 4. As shown in FIG. 4, over the surface of an N+ drain region 25 (N type single crystal silicon substrate) on the back surface 1b of the chip 2, there is disposed a metal back surface drain electrode 24. Over the N+ drain region 25, there is a drift region 11, which includes N columns 12n, P columns 12p (P type drift regions), N type drift regions 11n, and the like. In the surface region of the drift region 11, there is disposed the P type main junction 6 (P well, P body region, or the outer edge thereof). In the P body region 6, there are disposed an N+ source region 26, a P+ body contact region 23, and the like. In the outside of the P type main junction 6, there is disposed the P− type surface resurf region 8 coupled therewith. In the surface region of the N type drift region 11n at the end of the chip 2, there are disposed an N+ channel stop region 31, a P+ chip peripheral contact region 32, and the like. Over the semiconductor surface between a pair of N+ source regions 26, there is disposed a polysilicon gate electrode 15 via a gate insulation film 27. Over the polysilicon gate electrode 15 and the field insulation film 34, there is disposed an interlayer insulation film 29. Over the interlayer insulation film 29, there are formed aluminum type electrode films such as the metal source electrode 5 and the metal guard ring 3, which are electrically coupled with the N+ drain region 25, the P+ body contact region 23 (via the contact part 14 in the cell region) and the N+ channel stop region 31 (via the chip peripheral contact part 19, i.e., the peripheral recess part), the P+ chip peripheral contact region 32, and the like, respectively. Incidentally, the width Wn (thickness) of the N column 12n, and the width Wp (thickness) of the P columns 12p are, for example, about 6 micrometers and about 4 micrometers, respectively. Whereas, the impurity concentration of the N column 12n is, for example, about $3.3 \times 10^{15}/cm^3$ (e.g., phosphorus). The impurity concentration of the P column 12p is, for example, about $5.0 \times 10^{15}/cm^3$ (e.g., boron).

Herein, in this example, between the metal source electrode 5 and the metal guard ring 3, there is disposed a nearly ring-shaped metal field plate 30 formed of an aluminum type electrode film or the like at the same layer as these. The metal field plate 30 is electrically coupled (i.e., is in ohmic-contact) with the contact region 18 disposed in the surface 1a of the semiconductor substrate 2 via the contact part 9.

Incidentally, a part of the drift region 11 in this example is a super-junction structure in which, for example, N type drift regions 11n (i.e., N column regions 12n) formed of an N type epitaxial region 10n, and P type drift regions 11p (i.e., P column regions 12p) formed of a P type epitaxial region 10p are alternately arranged. On the other hand, the other part thereof is formed of an N type drift regions 11n formed of a single conductivity type, for example, N type epitaxial region 10n.

Then, the view obtained by making the plan view of FIG. 3 closer to a real device is shown in FIG. 5. As shown in FIG. 5, in the example of the drawing, the configuration is roughly the same, but the number of the ring-shaped metal field plates 30 is plural (two). In actuality, it is considered that the number is desirably about two to five.

Then, in accordance with FIG. 5, the device cross-sectional view of the active cell part cut-out region R2 of FIG. 1 is shown in FIG. 6. As shown in FIG. 6, over the surface of the N+ drain region 25 (N type single crystal silicon substrate) on the back surface 1b of the chip 2, there is disposed the metal back surface drain electrode 24. Over the N+ drain region 25, there is the drift region 11, which is formed of the N columns 12n (N type drift regions 11n), and the P columns 12p (P type drift regions 11p). In the surface region of the drift region 11, there is disposed the P body region 6. In the P body region 6, there are disposed N+ source regions 26, P+ body contact regions 23, and the like. Over the semiconductor surface between a pair of the N+ source regions 26, a polysilicon gate electrode 15 is disposed via a gate insulation film 27. Over the polysilicon gate electrode 15, there is disposed an interlayer insulation film 29. Over the interlayer insulation film 29, aluminum type electrode films such as the metal source electrode 5 are formed, which are electrically coupled with the N+ drain region 25 and the P+ body contact regions 23.

Then, in accordance with FIG. 5, the device cross-sectional view of the active cell end & chip end cut-out region R4 of FIG. 1 is shown in FIG. 7. As shown in FIG. 7, the configuration is roughly the same as that of FIG. 4. However, in the example of this drawing, the number of the metal field plates 30 is plural. In addition, there is shown a polysilicon gate electrode lead-out part 15c for coupling the polysilicon gate electrode 15 to a metal gate wire 7w via a gate contact part 22. Whereas, in the surface region of the semiconductor substrate 2 at the outer end of the P type main junction 6, there is disposed a P+ body contact region 23p for establishing an electrical coupling with the metal source electrode peripheral part 5p (the field plate part at the source electrode end) via the contact part 42.

2. Explanation of Manufacturing Process Regarding Power MOSFET (Power Type Semiconductor Active Element) of the One Embodiment of the Present Application (Mainly FIGS. 8 to 22)

In this section, the process corresponding to the structure of Section 1 will be described. However, also for other structures, the steps are basically common. Therefore, the following description is not repeated in principle on the other structures.

Figure 8:
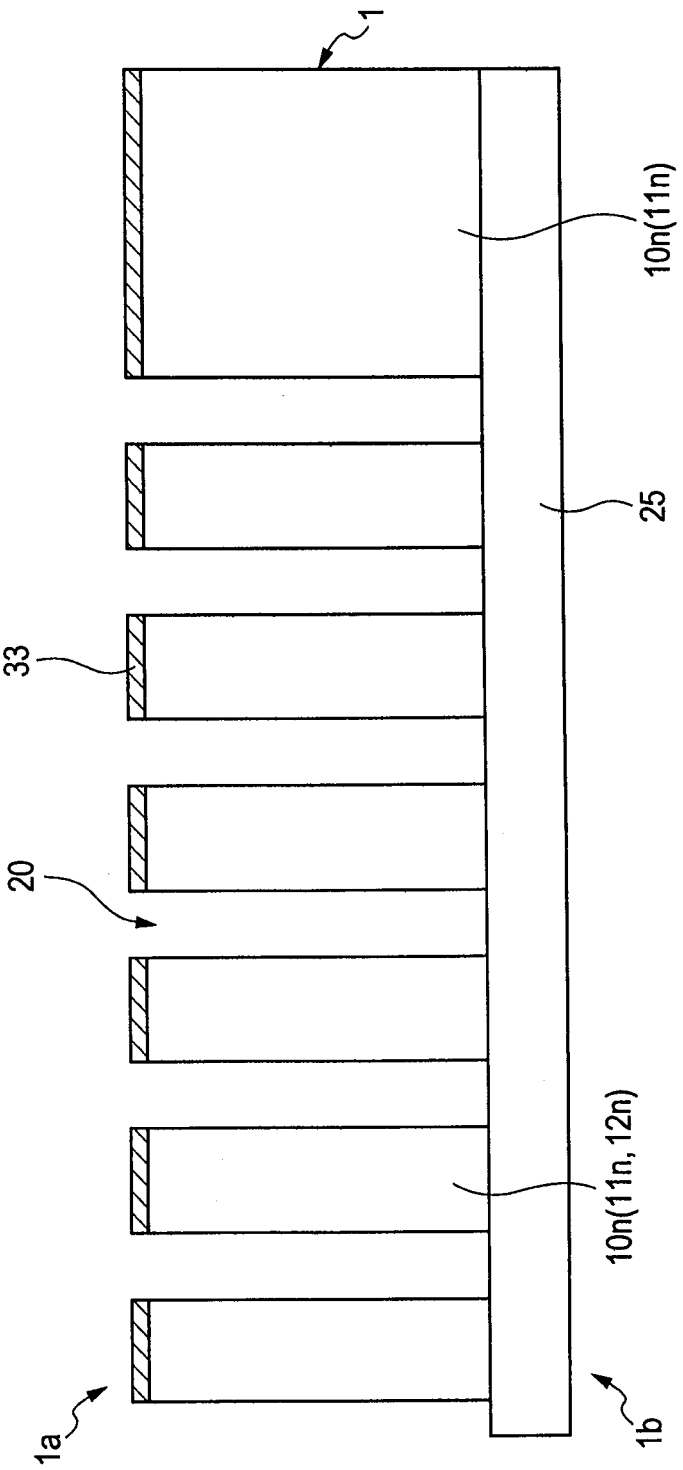
FIG. 8 is a schematic chip cross-sectional view during a manufacturing step (trench forming step) corresponding to FIG. 4 for illustrating a manufacturing process on the power MOSFET (power type semiconductor active element) of the one embodiment of the present application.
Figure 9:
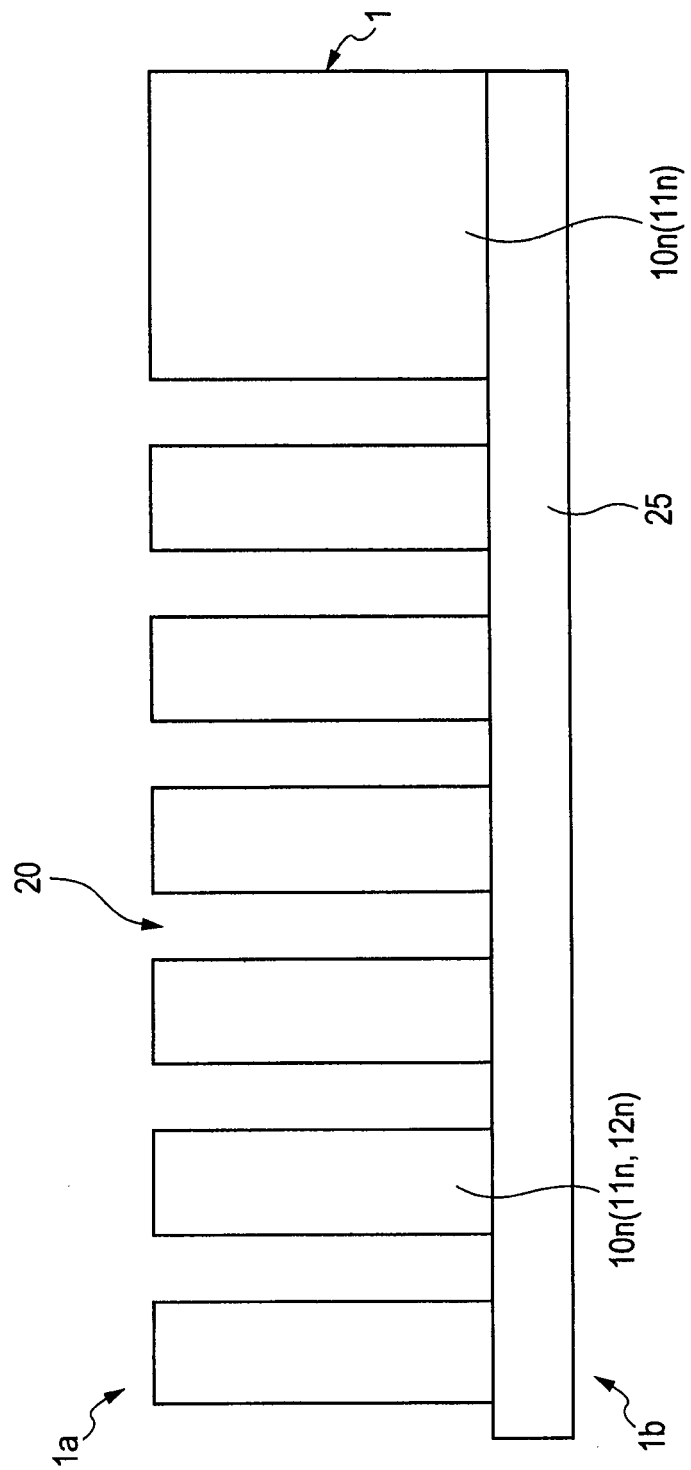
FIG. 9 is a schematic chip cross-sectional view during a manufacturing step (trench forming hard mask removing step) corresponding to FIG. 4 for illustrating a manufacturing process on the power MOSFET (power type semiconductor active element) of the one embodiment of the present application.
Figure 10:
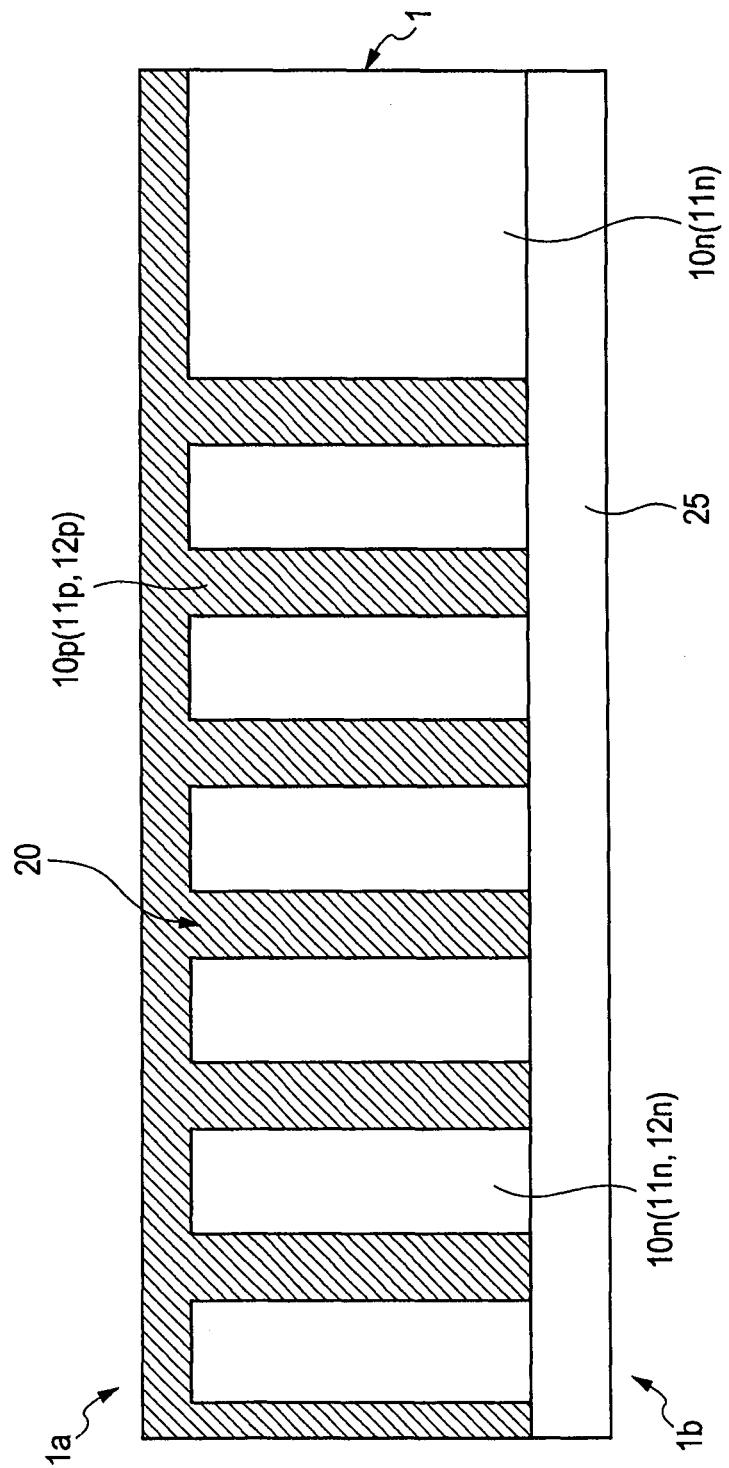
FIG. 10 is a schematic chip cross-sectional view during a manufacturing step (trench filling step) corresponding to FIG. 4 for illustrating a manufacturing process on the power MOSFET (power type semiconductor active element) of the one embodiment of the present application.
Figure 11:
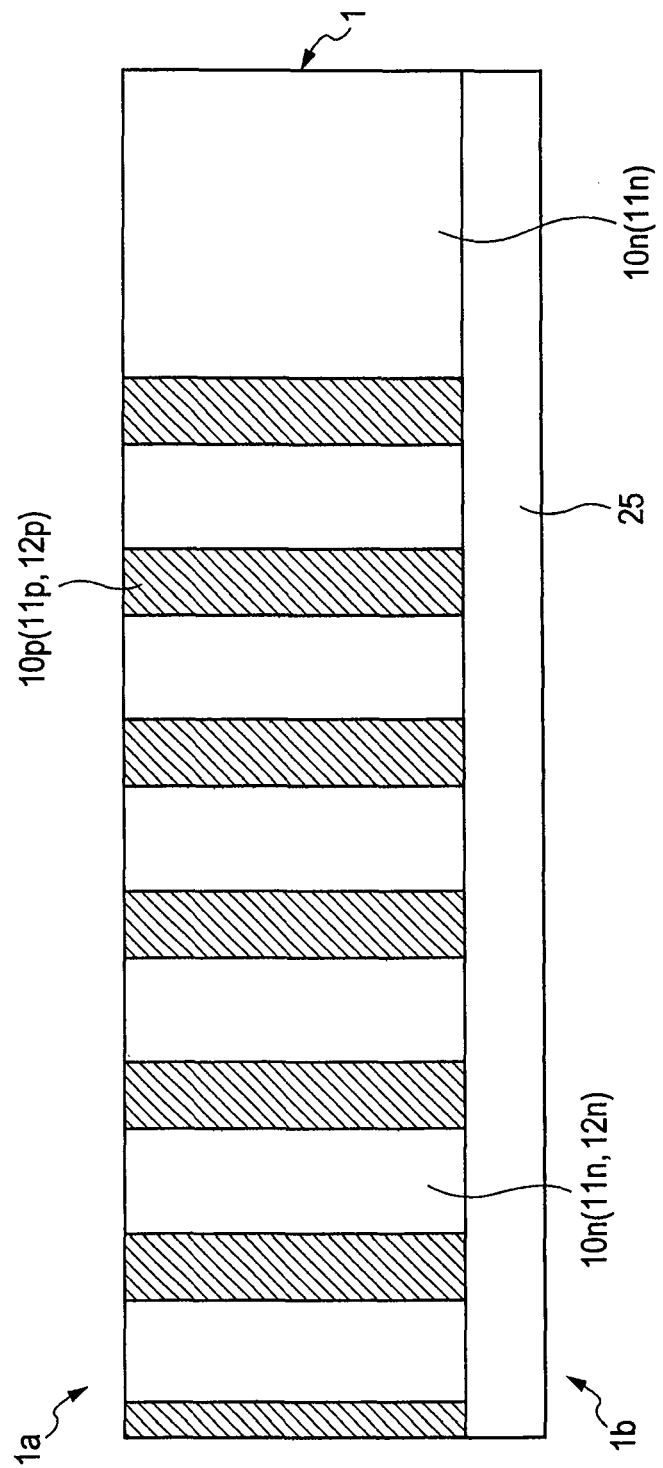
FIG. 11 is a schematic chip cross-sectional view during a manufacturing step (planarizing step) corresponding to FIG. 4 for illustrating a manufacturing process on the power MOSFET (power type semiconductor active element) of the one embodiment of the present application.
Figure 12:
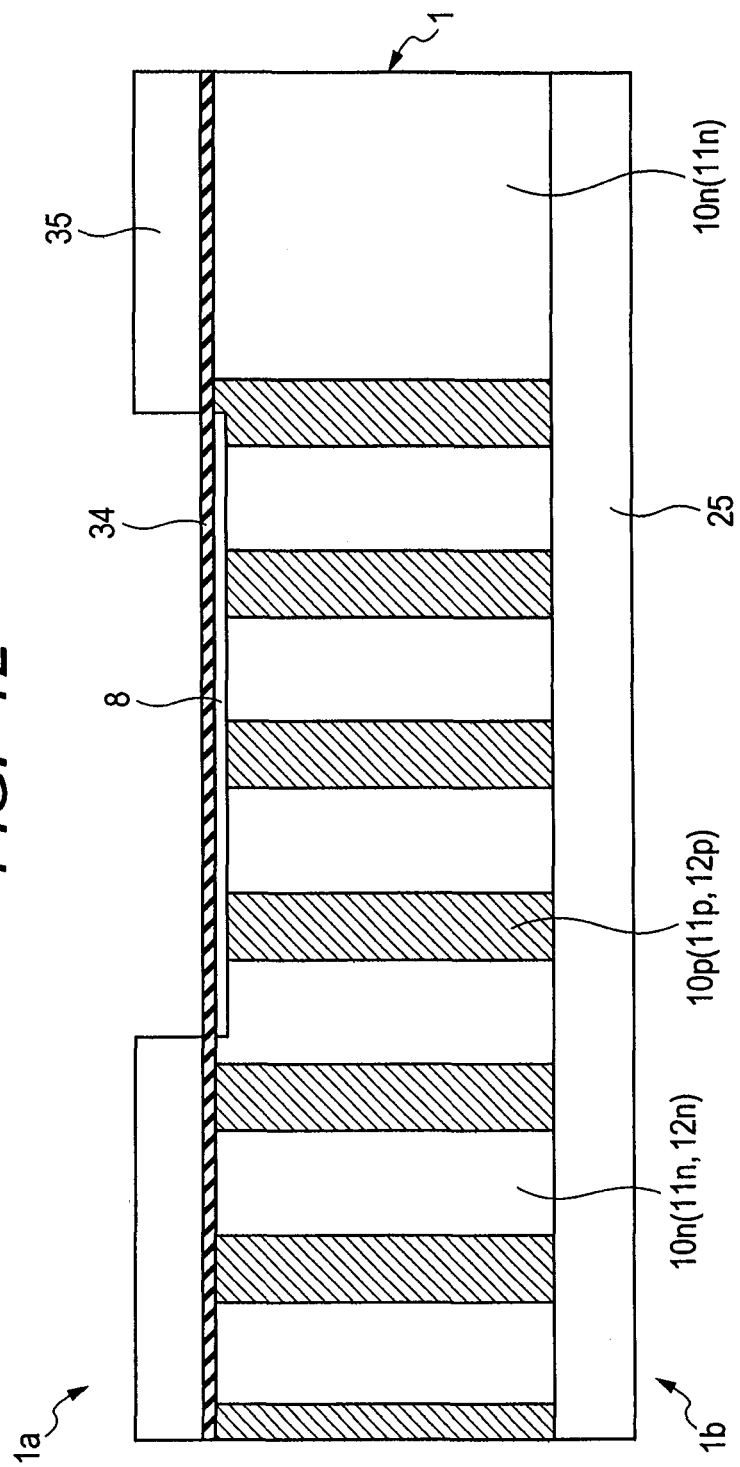
FIG. 12 is a schematic chip cross-sectional view during a manufacturing step (P− type surface resurf region introducing step) corresponding to FIG. 4 for illustrating a manufacturing process on the power MOSFET (power type semiconductor active element) of the one embodiment of the present application.
Figure 13:
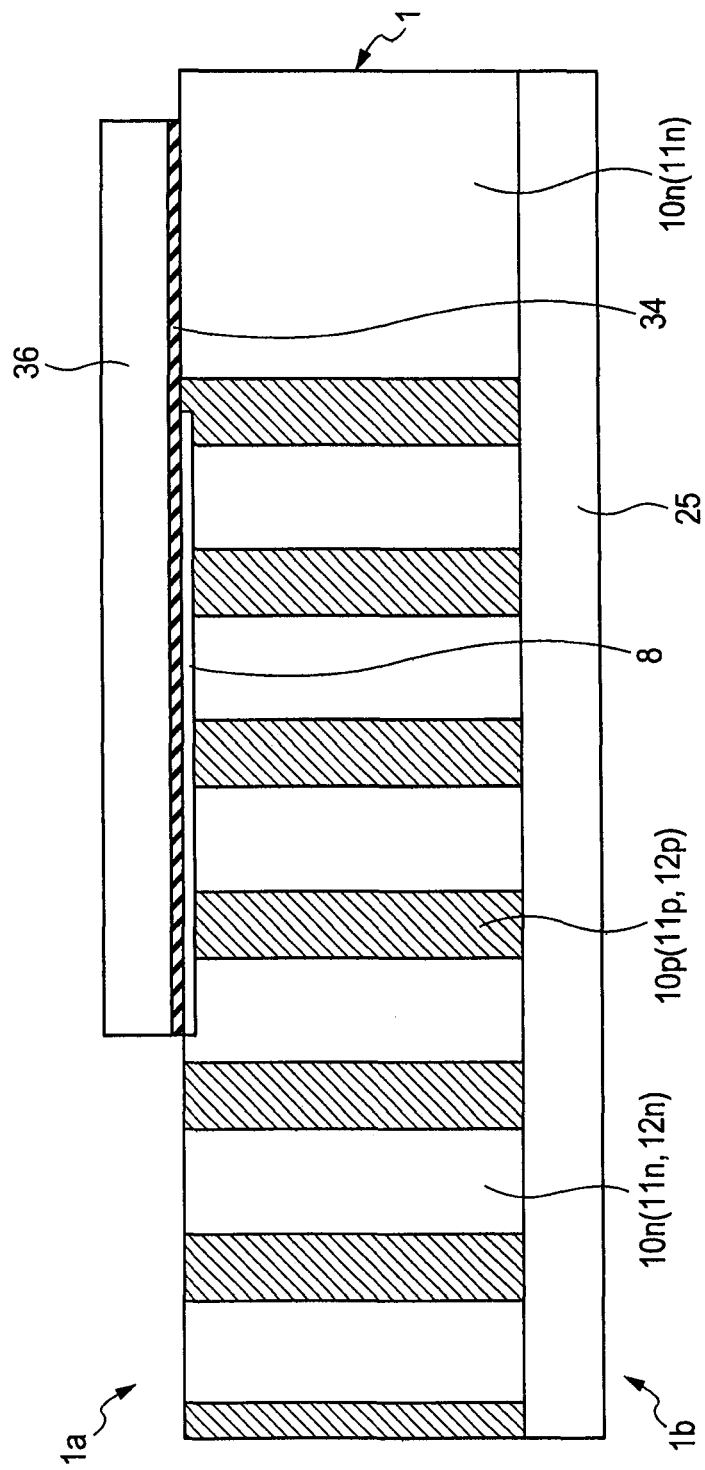
FIG. 13 is a schematic chip cross-sectional view during a manufacturing step (field insulation film patterning step) corresponding to FIG. 4 for illustrating a manufacturing process on the power MOSFET (power type semiconductor active element) of the one embodiment of the present application.
Figure 14:
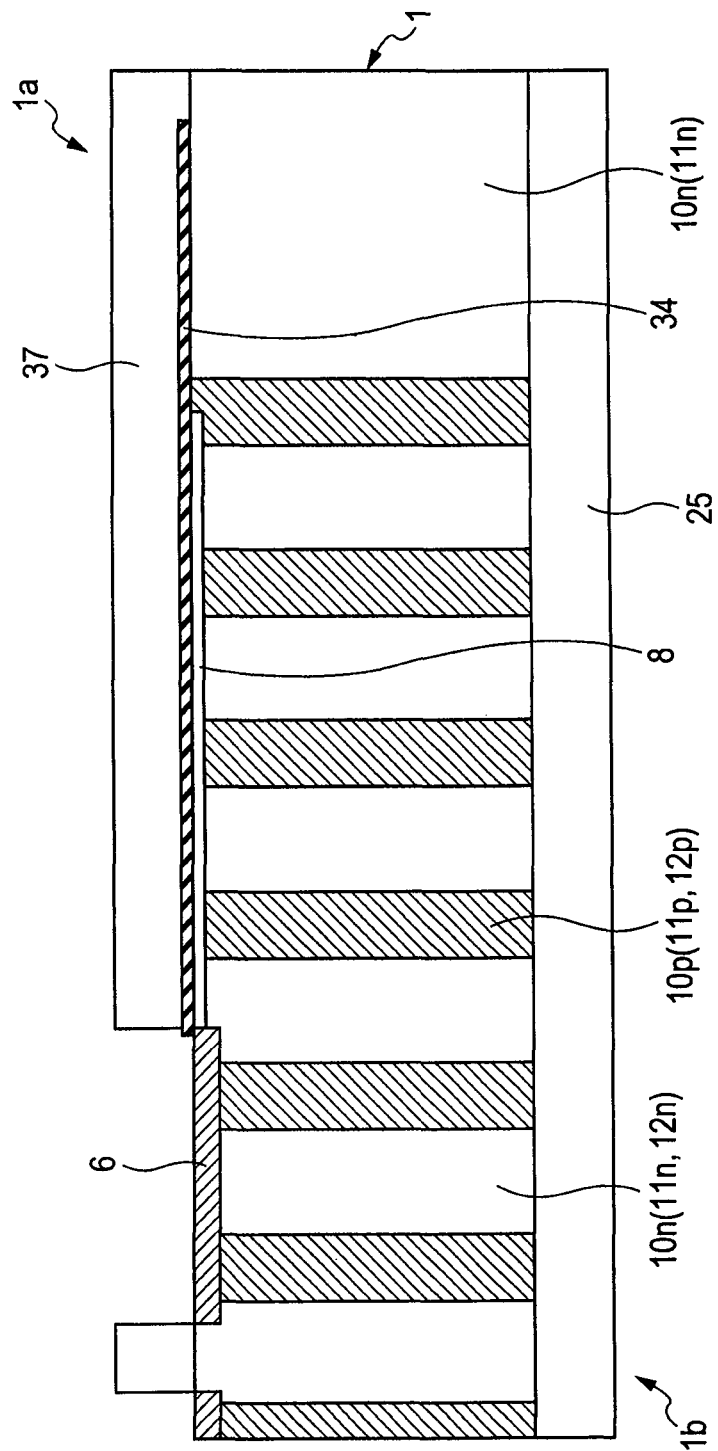
FIG. 14 is a schematic chip cross-sectional view during a manufacturing step (P body region introducing step) corresponding to FIG. 4 for illustrating a manufacturing process on the power MOSFET (power type semiconductor active element) of the one embodiment of the present application.
Figure 15:
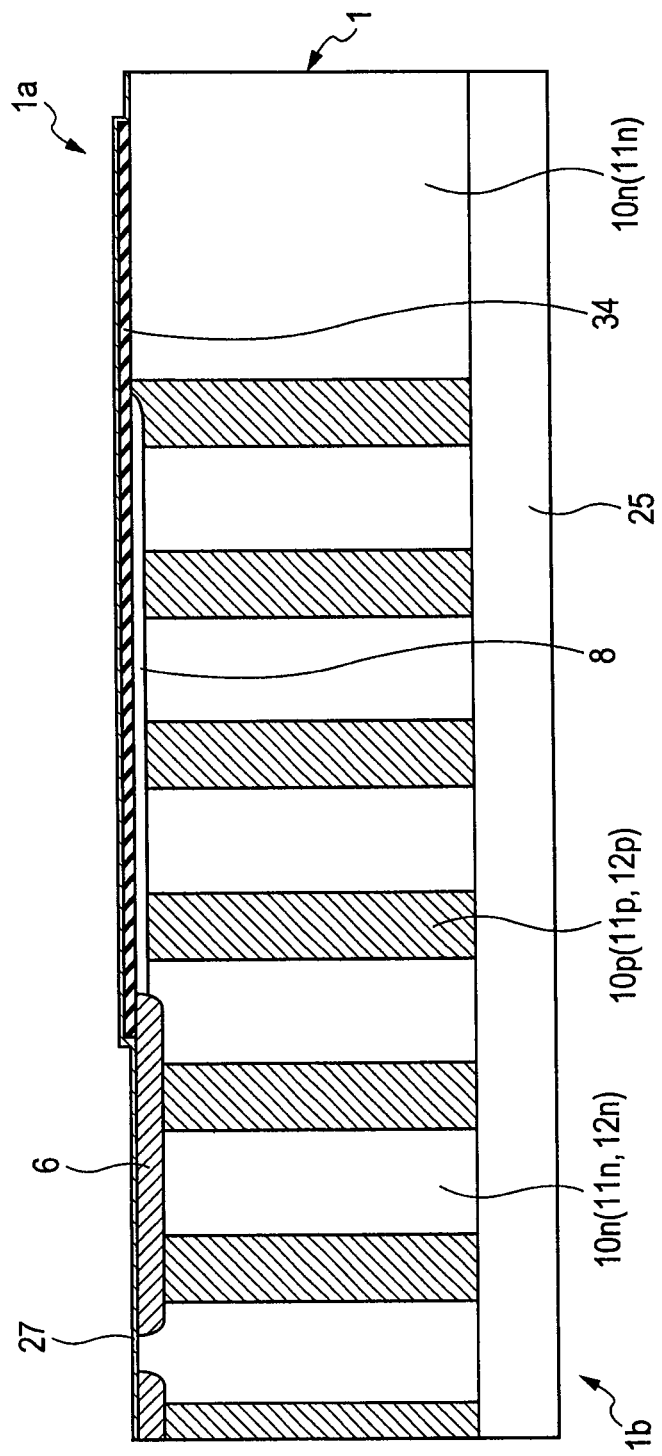
FIG. 15 is a schematic chip cross-sectional view during a manufacturing step (gate oxide film forming step) corresponding to FIG. 4 for illustrating a manufacturing process on the power MOSFET (power type semiconductor active element) of the one embodiment of the present application.
Figure 16:
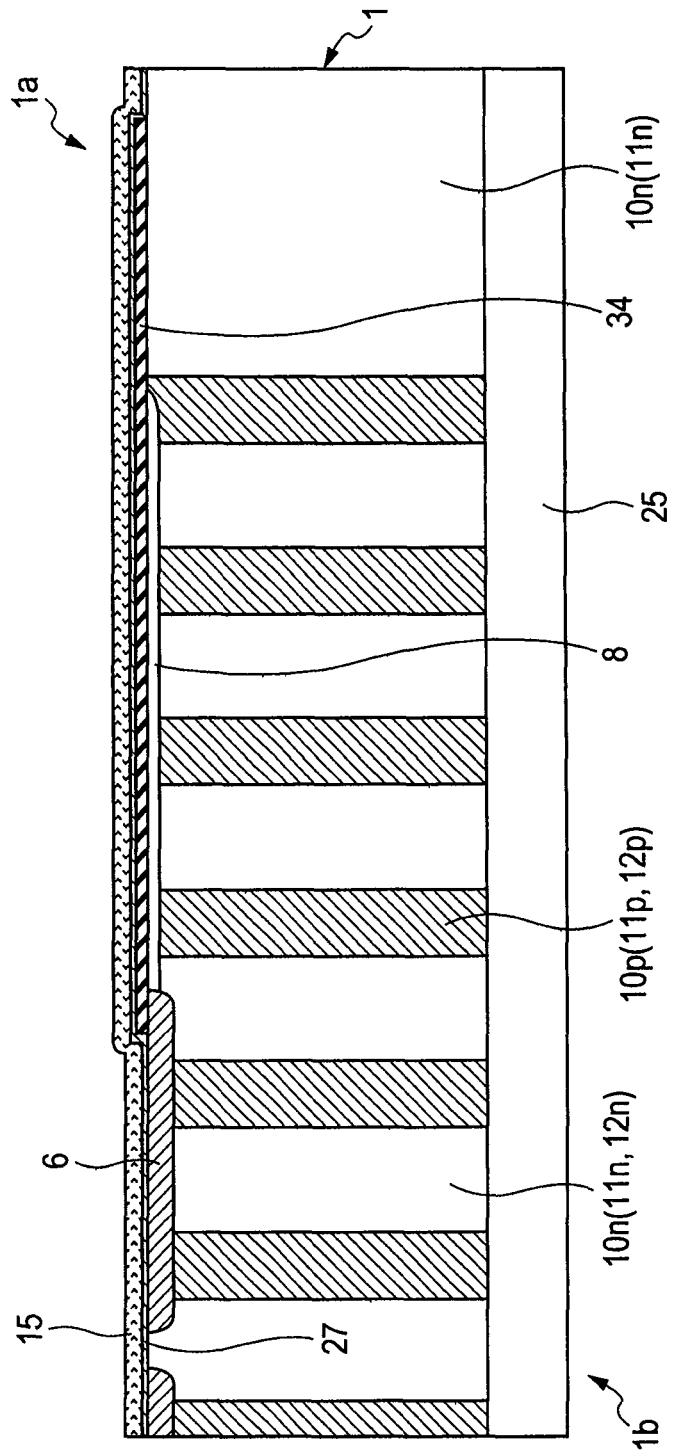
FIG. 16 is a schematic chip cross-sectional view during a manufacturing step (gate polysilicon film forming step) corresponding to FIG. 4 for illustrating a manufacturing process on the power MOSFET (power type semiconductor active element) of the one embodiment of the present application.
Figure 17:
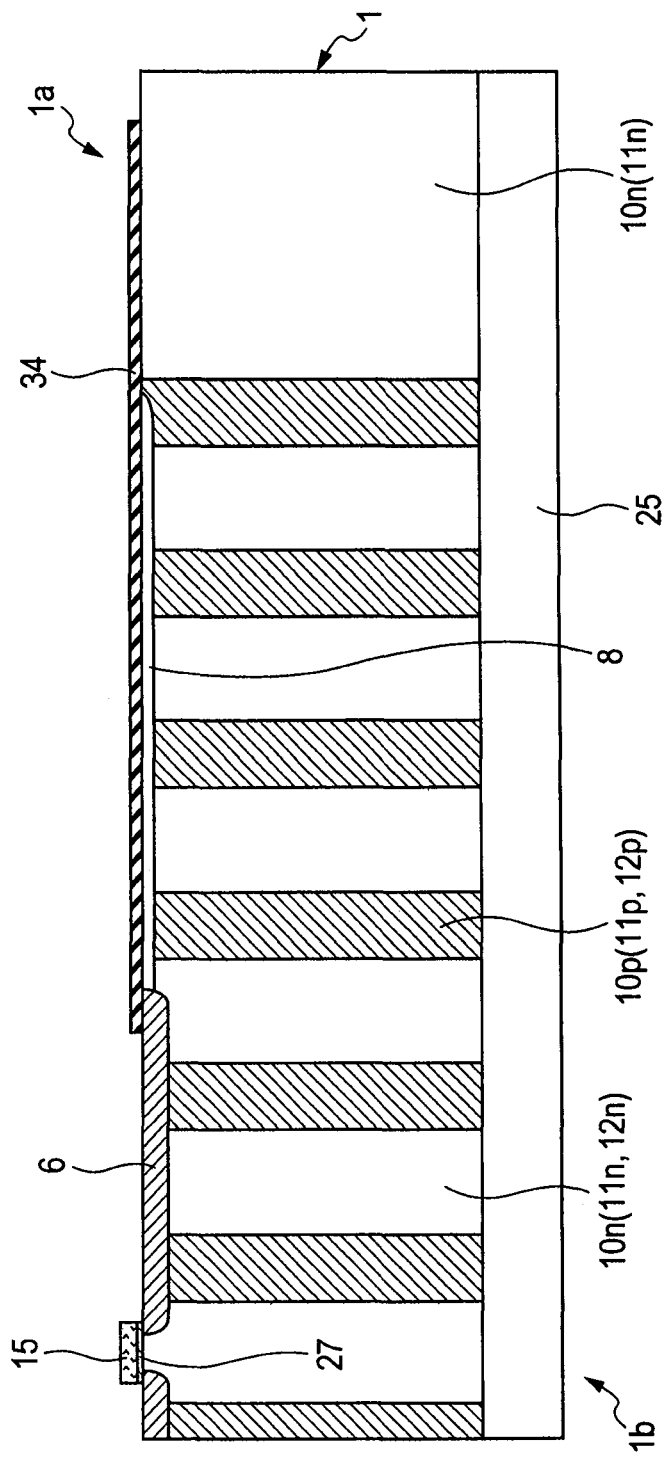
FIG. 17 is a schematic chip cross-sectional view during a manufacturing step (gate processing step) corresponding to FIG. 4 for illustrating a manufacturing process on the power MOSFET (power type semiconductor active element) of the one embodiment of the present application.
Figure 18:
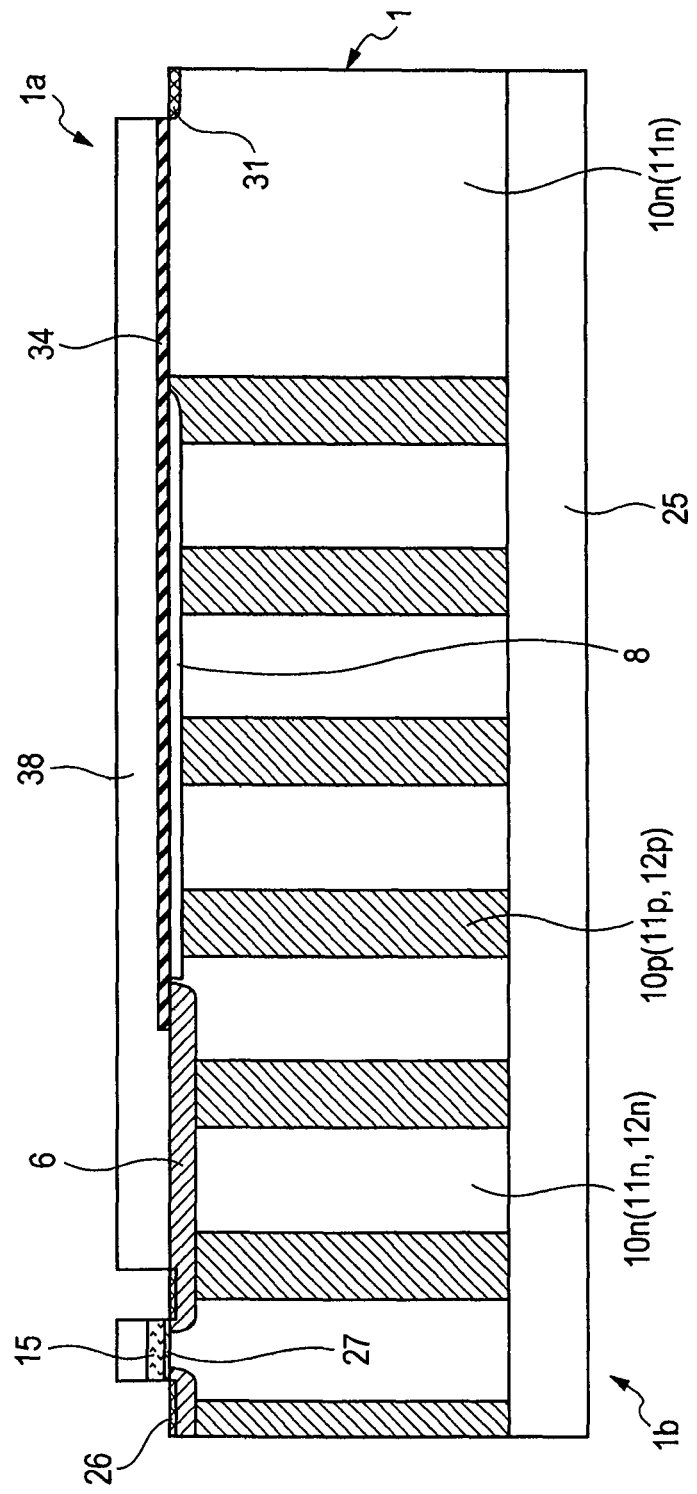
FIG. 18 is a schematic chip cross-sectional view during a manufacturing step (N+ source region introducing step) corresponding to FIG. 4 for illustrating a manufacturing process on the power MOSFET (power type semiconductor active element) of the one embodiment of the present application.
Figure 19:
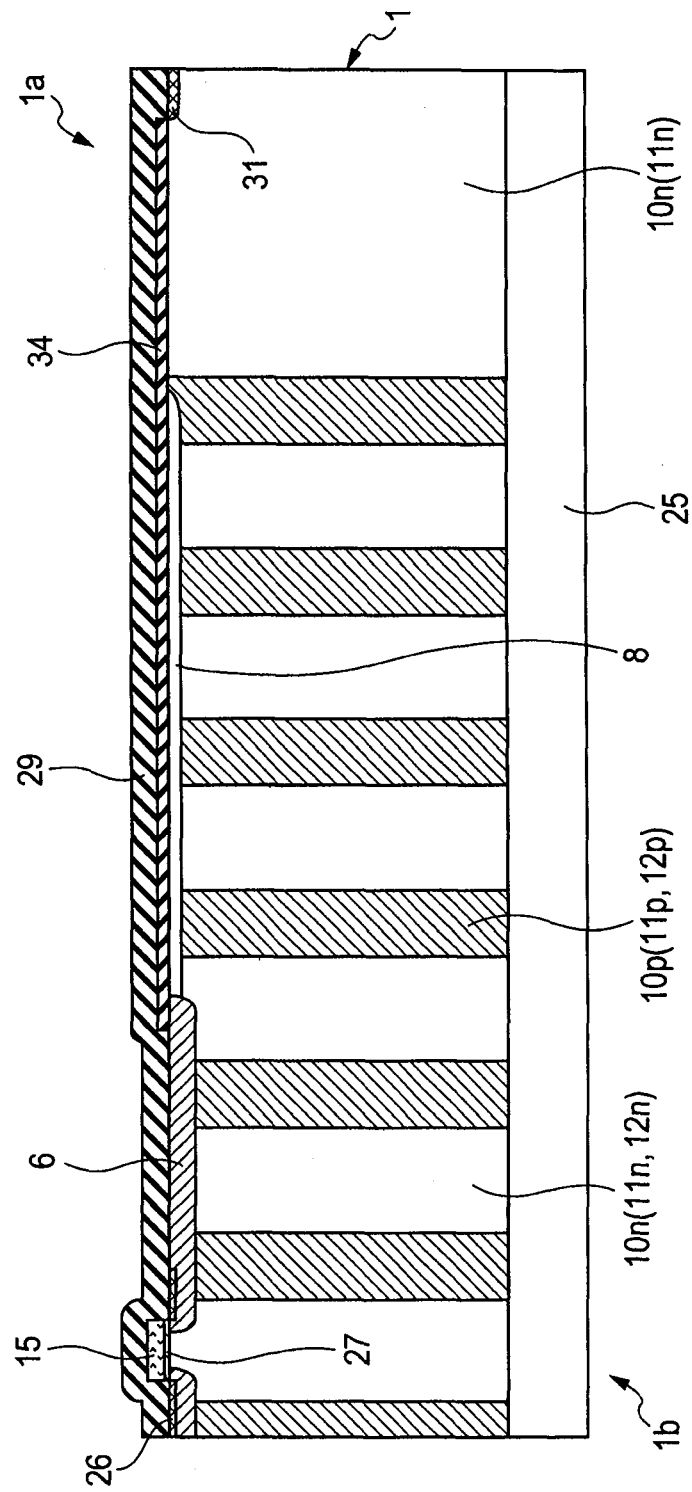
FIG. 19 is a schematic chip cross-sectional view during a manufacturing step (interlayer insulation film forming step) corresponding to FIG. 4 for illustrating a manufacturing process on the power MOSFET (power type semiconductor active element) of the one embodiment of the present application.
Figure 20:
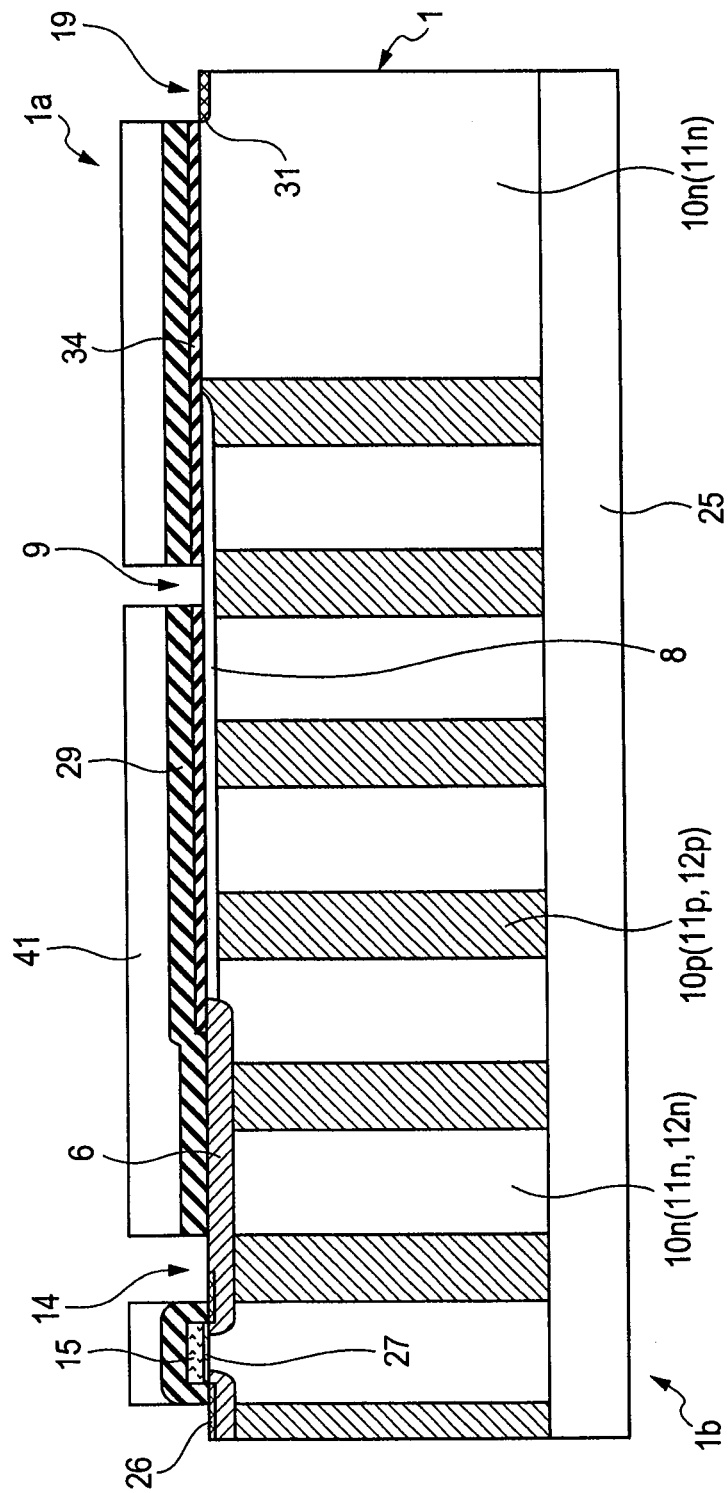
FIG. 20 is a schematic chip cross-sectional view during a manufacturing step (contact groove, etc., forming step) corresponding to FIG. 4 for illustrating a manufacturing process on the power MOSFET (power type semiconductor active element) of the one embodiment of the present application.
Figure 21:
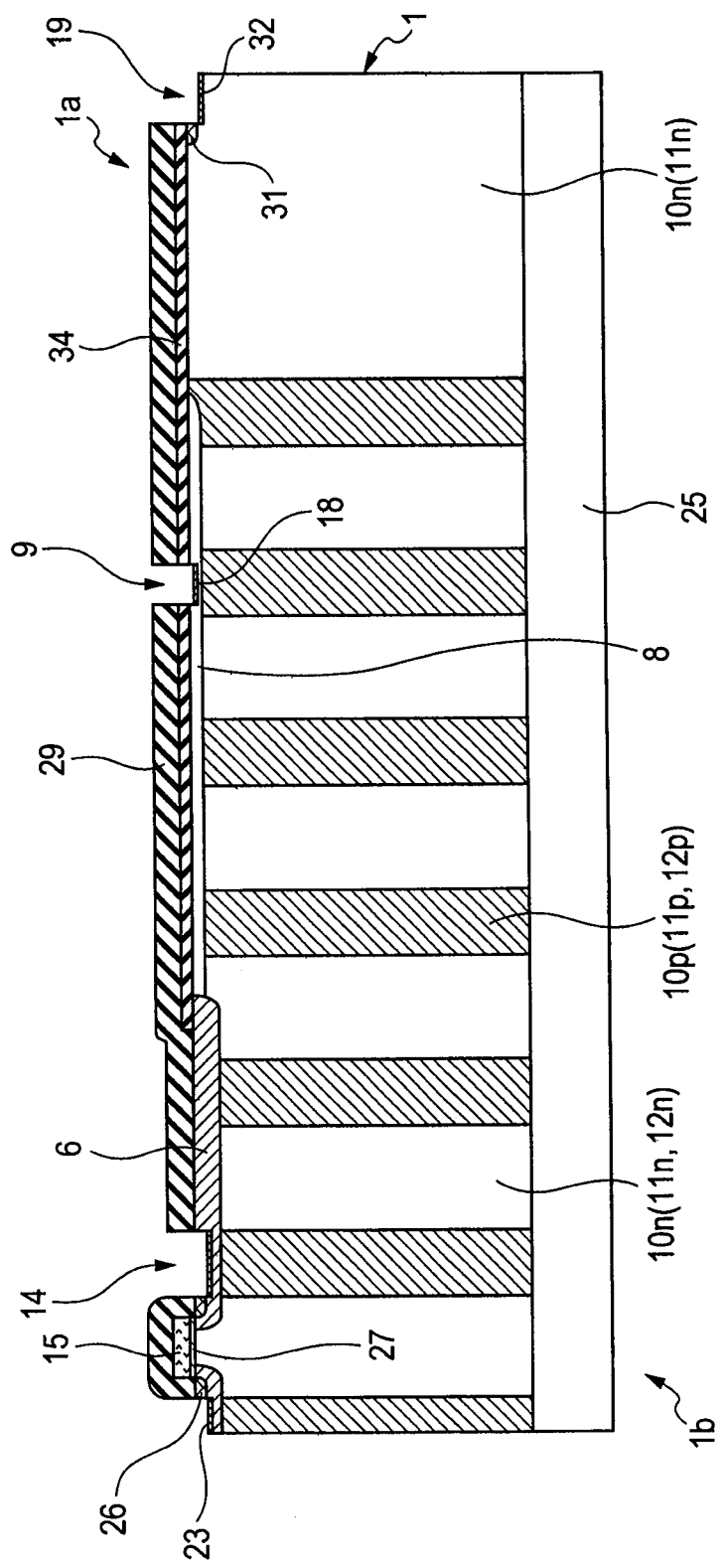
FIG. 21 is a schematic chip cross-sectional view during a manufacturing step (semiconductor substrate etching & P+ body contact region introducing step) corresponding to FIG. 4 for illustrating a manufacturing process on the power MOSFET (power type semiconductor active element) of the one embodiment of the present application.
Figure 22:
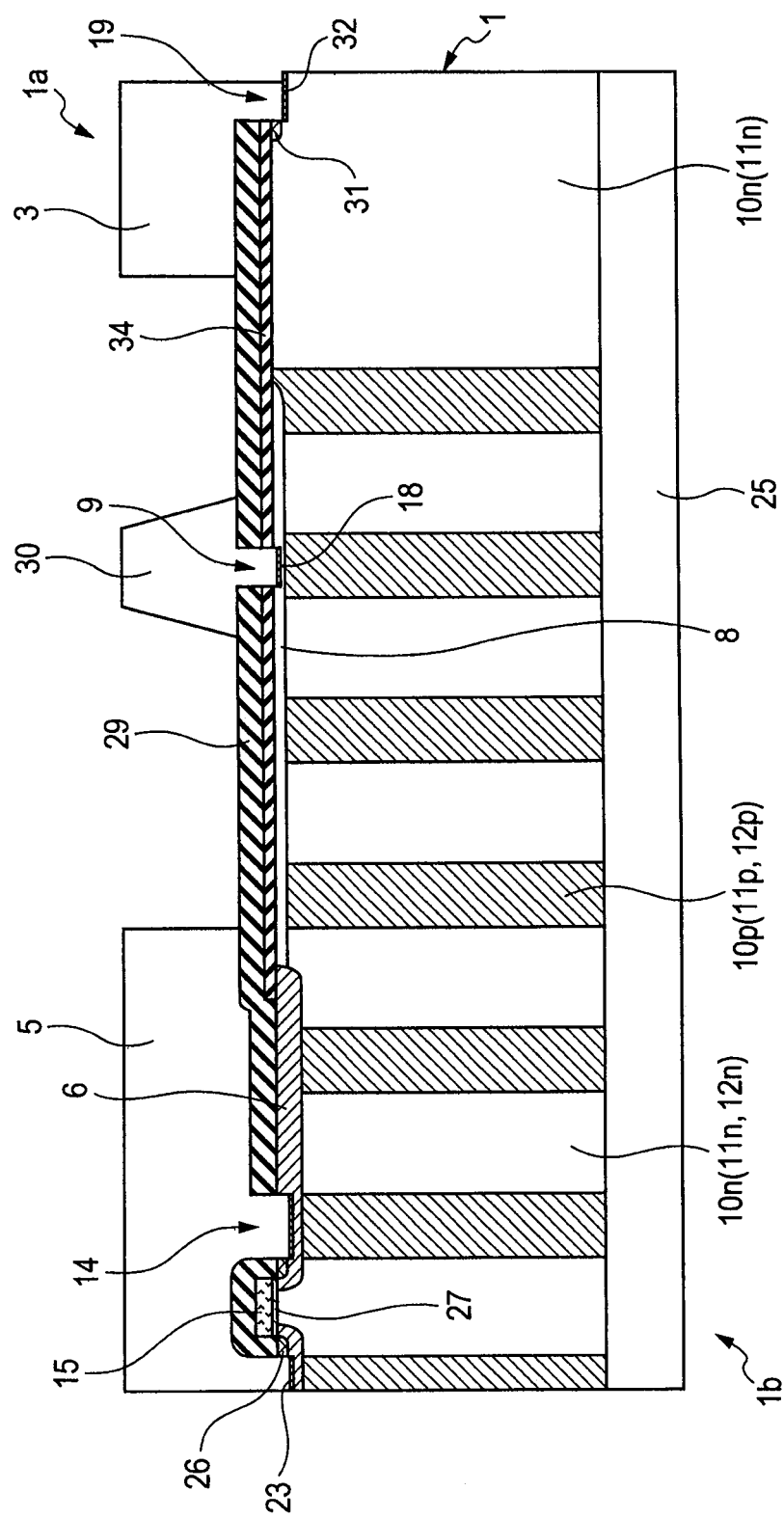
FIG. 22 is a schematic chip cross-sectional view during a manufacturing step (aluminum type metal electrode film forming step) corresponding to FIG. 4 for illustrating a manufacturing process on the power MOSFET (power type semiconductor active element) of the one embodiment of the present application.

FIG. 8 is a schematic chip cross-sectional view during a manufacturing step (trench forming step) corresponding to FIG. 4 for illustrating a manufacturing process on the power MOSFET (power type semiconductor active element) of the one embodiment of the present application. FIG. 9 is a schematic chip cross-sectional view during a manufacturing step (trench forming hard mask removing step) corresponding to FIG. 4 for illustrating a manufacturing process on the power MOSFET (power type semiconductor active element) of the one embodiment of the present application. FIG. 10 is a schematic chip cross-sectional view during a manufacturing step (trench filling step) corresponding to FIG. 4 for illustrating a manufacturing process on the power MOSFET (power type semiconductor active element) of the one embodiment of the present application. FIG. 11 is a schematic chip cross-sectional view during a manufacturing step (planarizing step) corresponding to FIG. 4 for illustrating a manufacturing process on the power MOSFET (power type semiconductor active element) of the one embodiment of the present application. FIG. 12 is a schematic chip cross-sectional view during a manufacturing step (P− type surface resurf region introducing step) corresponding to FIG. 4 for illustrating a manufacturing process on the power MOSFET (power type semiconductor active element) of the one embodiment of the present application. FIG. 13 is a schematic chip cross-sectional view during a manufacturing step (field insulation film patterning step) corresponding to FIG. 4 for illustrating a manufacturing process on the power MOSFET (power type semiconductor active element) of the one embodiment of the present application. FIG. 14 is a schematic chip cross-sectional view during a manufacturing step (P body region introducing step) corresponding to FIG. 4 for illustrating a manufacturing process on the power MOSFET (power type semiconductor active element) of the one embodiment of the present application. FIG. 15 is a schematic chip cross-sectional view during a manufacturing step (gate oxide film forming step) corresponding to FIG. 4 for illustrating a manufacturing process on the power MOSFET (power type semiconductor active element) of the one embodiment of the present application. FIG. 16 is a schematic chip cross-sectional view during a manufacturing step (gate polysilicon film forming step) corresponding to FIG. 4 for illustrating a manufacturing process on the power MOSFET (power type semiconductor active element) of the one embodiment of the present application. FIG. 17 is a schematic chip cross-sectional view during a manufacturing step (gate processing step) corresponding to FIG. 4 for illustrating a manufacturing process on the power MOSFET (power type semiconductor active element) of the one embodiment of the present application. FIG. 18 is a schematic chip cross-sectional view during a manufacturing step (N+ source region introducing step) corresponding to FIG. 4 for illustrating a manufacturing process on the power MOSFET (power type semiconductor active element) of the one embodiment of the present application. FIG. 19 is a schematic chip cross-sectional view during a manufacturing step (interlayer insulation film forming step) corresponding to FIG. 4 for illustrating a manufacturing process on the power MOSFET (power type semiconductor active element) of the one embodiment of the present application. FIG. 20 is a schematic chip cross-sectional view during a manufacturing step (contact groove, etc., forming step) corresponding to FIG. 4 for illustrating a manufacturing process on the power MOSFET (power type semiconductor active element) of the one embodiment of the present application. FIG. 21 is a schematic chip cross-sectional view during a manufacturing step (semiconductor substrate etching & P+ body contact region introducing step) corresponding to FIG. 4 for illustrating a manufacturing process on the power MOSFET (power type semiconductor active element) of the one embodiment of the present application. FIG. 22 is a schematic chip cross-sectional view during a manufacturing step (aluminum type metal electrode film forming step) corresponding to FIG. 4 for illustrating a manufacturing process on the power MOSFET (power type semiconductor active element) of the one embodiment of the present application. Based on these, a description will be given to one example of the manufacturing process on the power MOSFET (power type semiconductor active element) of the one embodiment of the present application.

First, as shown in FIG. 8, there is prepared a semiconductor wafer 1 in which over an N type silicon single crystal substrate 25 (which may be, herein, for example, a 200-dia wafer; incidentally, the wafer diameter may be 150, 300, or 450) doped with, for example, antimony (e.g., of an order of about $10^{18}$ to $10^{19}$/cm$^3$), there is formed a phosphorus-doped N epitaxial layer 10n with a thickness of, for example, about 45 micrometers (drift region, with a concentration of, for example, an order of about $10^{15}$/cm$^3$, this region is a portion to be the N type drift regions 11n, a part of which is also an N column 12n). Over a device side 1a (a main surface opposite to the back surface 1b) of the semiconductor wafer 1, there is formed a P type column trench forming hard mask film 33 formed of, for example, P-TEOS (Plasma-Tetraethylorthosilicate) or the like. Then, as shown in FIG. 8, with the P type column trench forming hard mask film 33 as a mask, the N epitaxial layer 10n and the like are dry etched. As a result, a P type column trench 20 is formed. As the dry etching atmospheres, mention may be made of atmospheres containing Ar, SF$_6$, O$_2$, and the like as main gas components. As the range of the dry etching depth, mention may be made of, for example, about 40 to 55 micrometers. Incidentally, the P type column trenches 20 desirably reach the N type silicon single crystal substrate 25. However, even if they do not reach the substrate 25, they may be desirably in the vicinity of the substrate 25.

Then, as shown in FIG. 9, the hard mask film 33 which has become unnecessary is removed.

Then, as shown in FIG. 10, P type column trenches 20 are subjected to filling epitaxial growth (trench inside epitaxial filling system), thereby to form a P type filling epitaxial layer 10p (the dopant is boron, and the concentration is, for example, of an order of about $10^{15}$/cm$^3$). The P type epitaxial region 10p is a portion to be the P type drift region 11p, and is also the P column 12p. The conditions for the filling epitaxial growth can be exemplified by, for example, processing pressure: for example, about $1.3\times10^4$ to $1.0\times10^5$ pascals, and raw material gases:silicon tetrachloride, trichlorosilane, dichlorosilane, or monosilane.

Then, as shown in FIG. 11, by a planarizing step such as CMP (Chemical Mechanical Polishing), portions of the P type filling epitaxial layer 10p outside the P type column trenches 20 are removed, and the surface 1a of the semiconductor wafer 1 is planarized. Incidentally, herein, the super-junction structure may be formed with, other than the trench fill system, a multi-epitaxial system.

Then, as shown in FIG. 12, almost entirely over the surface 1a of the semiconductor wafer 1, a silicon oxide film 34 (field insulation film) is formed by thermal oxidation. Thereover, a P– type resurf region-introducing resist film 35 is formed by lithography. The thickness of the field insulation film 34 can be exemplified by, for example, about 350 nm.

Subsequently, with P– type resurf region-introducing resist film 35 as a mask, the P– type surface resurf region 8 is introduced by the ion implantation (e.g., boron). The ion implantation conditions can be exemplified by ion species: boron, implantation energy: for example, about 200 keV, dose: for example, about $1\times10^{11}$/cm$^2$ to $1\times10^{12}$/cm$^2$ as preferable ranges. Then, the resist film 35 which has become unnecessary is entirely removed.

Then, as shown in FIG. 13, over the surface 1a of the semiconductor wafer 1, a silicon oxide film-etching resist film 36 is formed by lithography. Subsequently, with this as a mask, the field insulation film 34 is patterned by dry etching using, for example, a fluorocarbon type etching gas. Then, the resist film 36 which has become unnecessary is entirely removed.

Then, as shown in FIG. 14, over the surface 1a of the semiconductor wafer 1, a P body region-introducing resist film 37 is formed by lithography (generally, previously, over the surface 1a of the semiconductor wafer 1, there has been formed an ion implantation protective film such as a thermal oxide film with a thickness of, for example, about 10 nm, which is omitted because of complication of showing. The same also applies to other portions). Subsequently, with the P body region-introducing resist film 37 as a mask, the P type body region 6 is introduced by ion implantation. The ion implantation conditions can be exemplified by (1) first step: ion species: boron, implantation energy: for example, about 200 keV, dose: an order of, for example, about $10^{13}$/cm$^2$, (2) first step: ion species: boron, implantation energy: for example, about 75 keV, dose: the order of, for example, about $10^{12}$/cm$^2$ as preferable ranges (of an order of, for example, about $10^{17}$/cm$^3$ in terms of concentration). Then, the resist film 37 which has become unnecessary is entirely removed.

Then, as shown in FIG. 15, over the surface 1a of the semiconductor wafer 1, there is formed the gate oxide film 27 (gate insulation film). The thickness of the gate insulation film 27 can be exemplified by, for example, about 50 nm to 200 nm according to the breakdown voltage. The deposition methods can be exemplified by, for example, CVD (Chemical Vapor Deposition) and thermal oxidation. Incidentally, as wafer cleaning before gate oxidation, wet cleaning is applicable using, for example, a first cleaning solution, namely, ammonia:hydrogen peroxide:pure water=1:1:5 (volume ratio), and a second cleaning solution, namely, hydrochloric acid:hydrogen peroxide:pure water=1:1:6 (volume ratio).

Then, as shown in FIG. 16, over the gate oxide film 27, the gate electrode polysilicon film 15 (for example, about 200 nm to 800 nm in thickness) is formed by, for example, low-pressure CVD (Chemical Vapor Deposition).

Then, as shown in FIG. 17, the gate electrode 15 is patterned by dry etching.

Then, as shown in FIG. 18, by lithography, an N+ source region-introducing resist film 38 is formed. Using this as a mask, the N+ source region 26, an N+ channel stopper region 31 at the chip edge part are introduced by ion implantation. The ion implantation conditions can be exemplified by ion species: arsenic, implantation energy: for example, about 40 keV, dose: for example, about an order of $10^{15}/cm^2$ as the preferable ranges (for example, an order of, for example, about $10^{20}/cm^3$ in concentration). Then, the resist film 38 which has become unnecessary is entirely removed.

Then, as shown in FIG. 19, almost entirely over the surface 1a of the semiconductor wafer 1, a PSG (Phospho-Silicate-Glass) film 29 (interlayer insulation film) is deposited by CVD or the like. Incidentally, the interlayer insulation film 29 may be, other than the PSG film, a BPSG film, a TEOS film, a SOG film, a HDP (High Density Plasma) silicon oxide film, or a lamination film of a PSG film, and a plurality of the films of these films. As the total thickness of the interlayer insulation film 29, for example, about 900 nm may be shown as a preferable example.

Then, as shown in FIG. 20, over the surface 1a of the semiconductor wafer 1, a source contact hole-opening resist film 41 is formed. Using this as a mask, a source contact hole 14, a field plate contact part 9 (contact groove or contact hole), a chip peripheral contact part 19 (peripheral recess part), and the like are opened by dry etching. Subsequently, the resist film 41 which has become unnecessary is entirely removed.

Then, as shown in FIG. 21, after etching the silicon substrate, by ion implantation, there are introduced the P+ body contact region 23 at the source part, the contact region 18 of the field plate in the chip peripheral region 21, and the P+ chip peripheral contact region 32. The ion implantation conditions can be exemplified by ion species: $BF_2$, implantation energy: for example, about 30 keV, dose: of an order of, for example, about $10^{15}/cm^2$ as preferable ranges (of an order of, for example, about $10^{19}/cm^3$ in concentration).

Then, as shown in FIG. 22, via a barrier metal film of, for example, TiW, an aluminum type metal layer is deposited by sputtering or the like, and is patterned. As a result, there are formed the metal source electrode 5, the metal field plate 30, the guard ring electrode 3, and the like.

Then, if required, for example, a final passivation film such as an inorganic type final passivation film or an organic inorganic type final passivation film is formed as an overlying layer. Thus, pad openings and gate openings are opened. The final passivation film may be a monolayer film of an inorganic type final passivation film, and organic type inorganic type final passivation film, or the like. Other than this, over the inorganic type final passivation film of the lower layer, an organic inorganic type final passivation film or the like may be stacked.

Then, a back grinding processing is performed to reduce the original wafer thickness (e.g., about 750 micrometers) to, for example, about 80 to 280 micrometers (i.e., less than 300 micrometers).

Further, over the back surface 1b of the wafer 1, a metal back surface drain electrode 24 (see FIGS. 4 and 6) is deposited by sputtering deposition. The back surface metal electrode film 24 includes, from the side closer to the wafer 1, for example, a back surface titanium film (gold and nickel diffusion preventive layer), a back surface nickel film (adhesive layer with a chip bonding material), aback surface gold film (nickel oxidation preventive layer), and the like. Then, the wafer 1 is divided into individual chips. Each resulting chip is subjected to transfer molding or the like with a sealing resin, resulting in a packaged device.

3. Explanation of Modified Example (Single Conductivity Type Drift Region) Regarding Structure of Drift Region of the Power MOSFET (Power Type Semiconductor Active Element) of the One Embodiment of the Present Application (Mainly FIG. 23)

In Section 1 and Section 2, for the power type semiconductor active element having a super-junction structure, the application of the metal field plate, or the like in the chip peripheral region was specifically described. However, it is naturally understood that the same also applies to a general power type semiconductor active element having a single conductivity type drift region. In this section, one example thereof will be described in brief.

Figure 23:
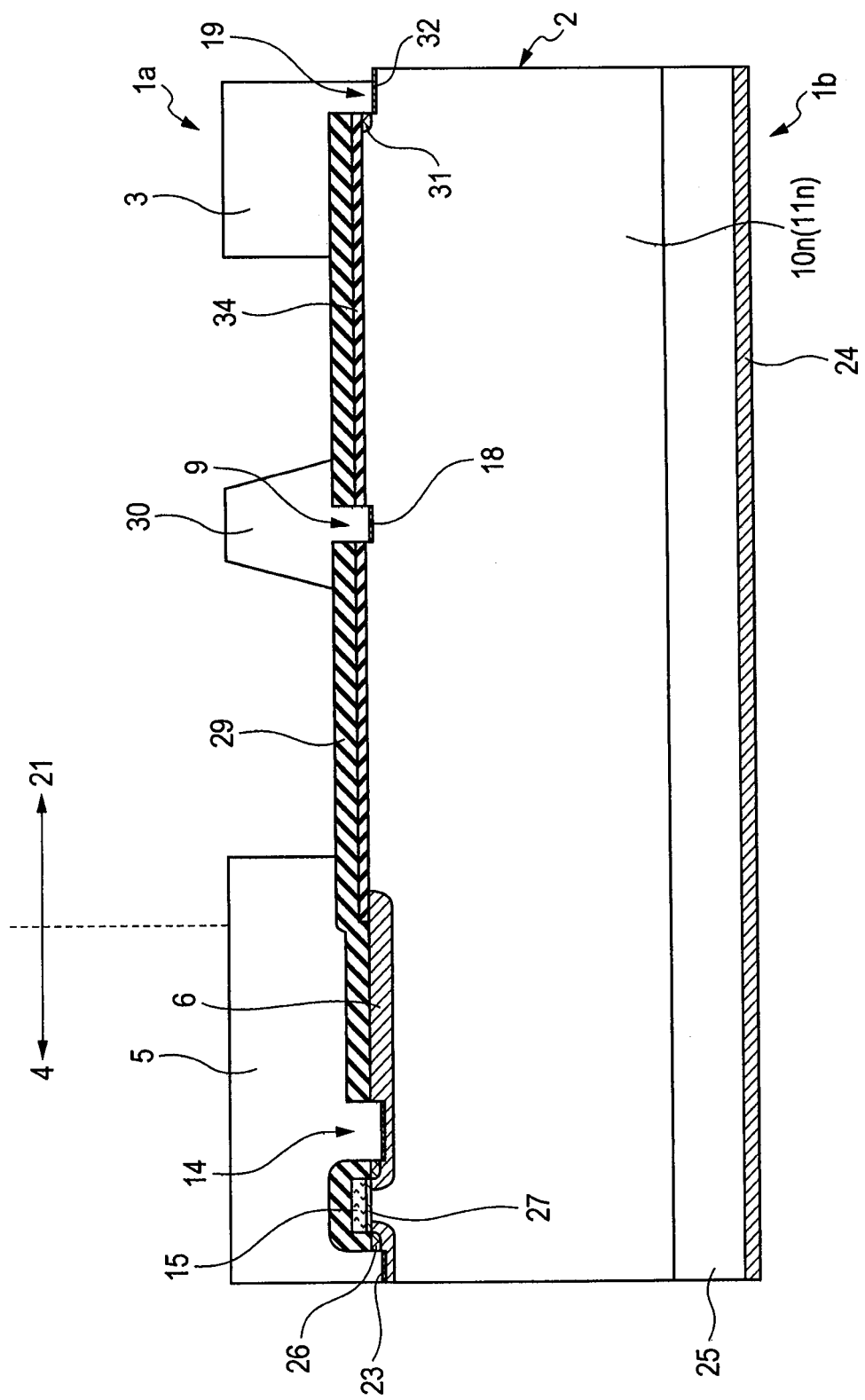
FIG. 23 is a schematic chip cross-sectional view corresponding to FIG. 4 for illustrating a modified example (single conductivity type drift region) regarding the structure of a drift region of the power MOSFET (power type semiconductor active element) of the one embodiment of the present application.

FIG. 23 is a schematic chip cross-sectional view corresponding to FIG. 4 for illustrating a modified example (single conductivity type drift region) regarding the structure of a drift region of the power MOSFET (power type semiconductor active element) of the one embodiment of the present application. Based on this, a description will be given to the modified example (single conductivity type drift region) regarding the drift region of the power MOSFET (power type semiconductor active element) of the one embodiment of the present application.

As shown in FIG. 23, this example is basically the same as the example of FIG. 4, but is different in not including a super-junction structure or a P− type surface resurf region 8 for reinforcing the super-junction structure (which may be present as a junction extension for the general P type main junction 6). Namely, the previously described configuration in which the metal field plate 30 in the chip peripheral region 21, and the contact part 9 thereof are restricted to a portion along the side of the active cell region 4 is also effective for a device having a super-junction structure in the active cell region 4 and the chip peripheral region 21. However, simultaneously, the configuration is also effective for a device not having a super-junction structure in the active cell region 4 and the chip peripheral region 21 (a device based on a single conductivity type drift region). Incidentally, it is naturally understood that the configuration is also effective for a device having a super-junction structure in any one region of the active cell region 4 and the chip peripheral region 21.

Incidentally, this also similarly holds true for the following modified examples in respective sections, and also holds true as it is for other power type devices (such as IGBT and power diode).

4. Explanation of Modified Example and the Like Regarding the Field Plate in the Peripheral Region (Edge Termination Area) of the Power MOSFET (Power Type Semiconductor Active Element) of the One Embodiment of the Present Application (Mainly FIGS. 24 to 27)

In the Sections 1 to 3, a specific description was mainly given to the example in which the number of the metal field plates in the chip peripheral region was 1 or 2. However, this number is not limited to 1 or 2, and can be set at a given number. In this section, an example in which the number is 4 will be specifically described.

In the drawings in this section, the super-junction structure is not shown in principle. This is, as previously described in Section 3, due to the following facts: the configuration in which the metal field plate 30 and the contact part 9 thereof are restricted to a portion along the side of the active cell region 4 is also applicable to a device not having a super-junction structure; and other than this, the drawing becomes complicated.

Figure 24:
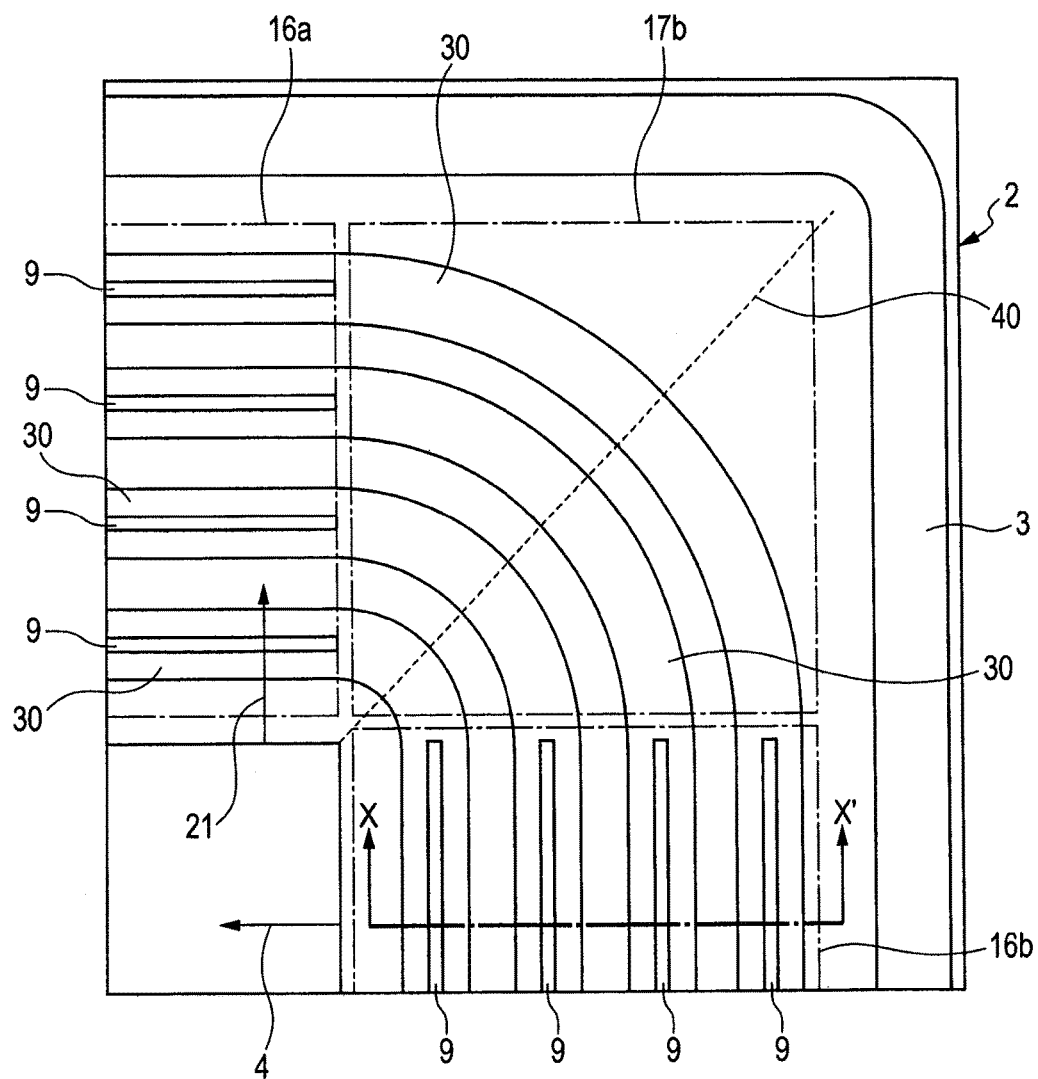
FIG. 24 is a chip top surface partial schematic enlarged view corresponding to FIG. 3 for illustrating a modified example (multiple field plates) and the like regarding a field plate in the peripheral region (edge termination area) of the power MOSFET (power type semiconductor active element) of the one embodiment of the present application.
Figure 25:
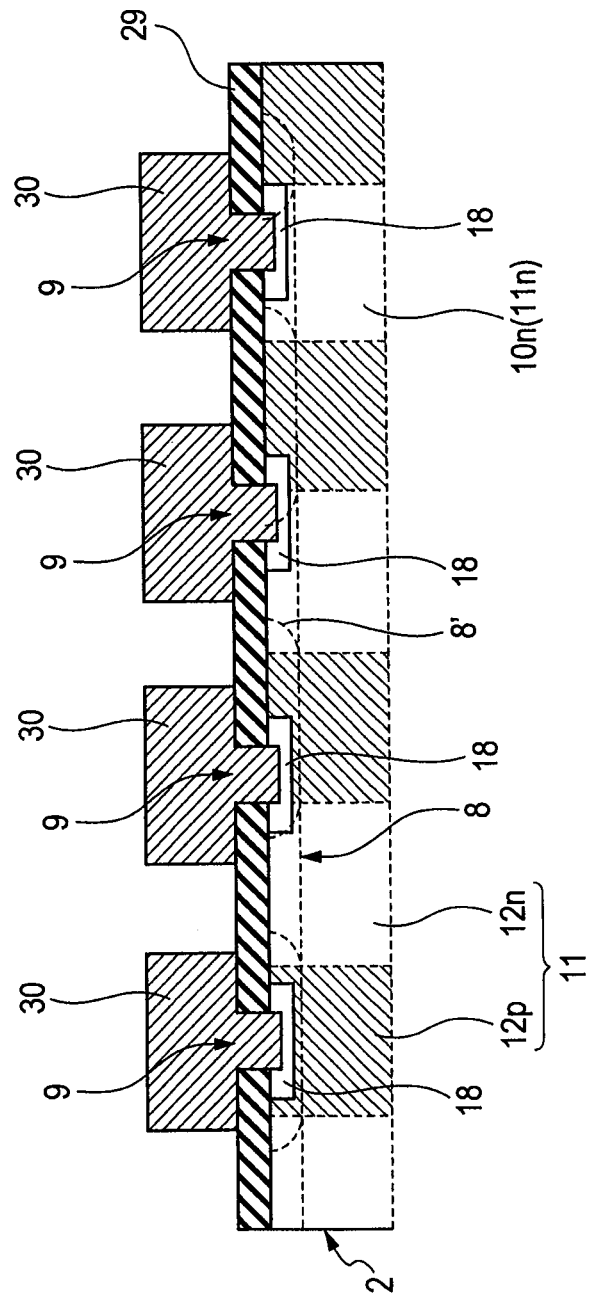
FIG. 25 is a chip top schematic partial cross-sectional view corresponding to the X-X' cross section of FIG. 24.

(1) Detailed Explanation of Field Plate Basic Structure (Mainly FIGS. 24 and 25)

This sub-section is the detailed explanation of FIG. 3, and in addition, can also be regarded as a modified example with respect to FIG. 3.

FIG. 24 is a chip top surface partial schematic enlarged view corresponding to FIG. 3 for illustrating a modified example (multiple field plates) and the like regarding a field plate in the peripheral region (edge termination area) of the power MOSFET (power type semiconductor active element) of the one embodiment of the present application. FIG. 25 is a chip top schematic partial cross-sectional view corresponding to the X-X' cross section of FIG. 24. Based on these, a description will be given to the modified example and the like (details of the field plate basic structure) regarding the field plate in the peripheral region (edge termination area) of the power MOSFET (power type semiconductor active element) of the one embodiment of the present application.

As shown in FIG. 24, this example is roughly the same as FIG. 3, but is different in that the number of the metal field plates 30 in the chip peripheral region 21 is 4 (plural). Further, the planar configuration of the metal field plate 30 in the peripheral corner region 17*b* (17*a*, 17*c*, or 17*d*) is advantageously line symmetrical with respect to the diagonal line 40 of the semiconductor chip or the peripheral corner region from the viewpoint of the breakdown voltage in terms of not locally generating a distortion in potential. Further, the planar configuration is advantageously an outwardly projecting round shape from the same viewpoint. However, the planar configuration is not limited thereto.

Incidentally, the term "line symmetrical" used for the planar configuration of the field plate represents the macro symmetry, and does not require a micro symmetry (symmetry in a region approximately equal to, or smaller than the line width).

Then, the X-X' cross section of FIG. 24 is shown in FIG. 25 in order to illustrate the peripheral structure of the contact region 18 of FIGS. 4, 7, 23, and the like. FIGS. 3, 4, 7, and the like are drawn as if the contact regions 18 are over the P column regions 12*p*. However, as shown in FIG. 25, the contact regions 18 are not necessarily required to be over the P column regions 12*p*. The contact regions 18 belonging to the same metal field plate 30 are desirably at roughly an equal distance ("equal distance condition") from the side of the adjacent active cell region 4. Therefore, so long as the equal distance condition is substantially satisfied, the contact regions 18 may be, other than over the P column regions 12*p*, over the N columns regions 12*n*, or may be formed in such a manner as to extend over the adjacent P column regions 12*p* and N column regions 12*n*.

Whereas, as for a plurality of contact regions 18 belonging to the same metal field plate 30, so long as the equal distance condition is substantially satisfied, both the contact regions 18 may be placed over the P column regions 12*p*, or may be placed over the N column regions 12*n*. Further, so long as the equal distance condition is substantially satisfied, one contact region 18 may be placed over the P column region 12*p*, and another contact region 18 may be placed over the N column region 12*n*.

Further, as for respective peripheral side regions 16*a*, 16*b*, 16*c*, and 16*d*, the contact parts 9 are not necessarily required to be placed in all the peripheral side regions 16*a*, 16*b*, 16*c*, and 16*d*, and may desirably be present in at least one peripheral side region 16*a*, 16*b*, 16*c*, or 16*d*. However, the response of the potential is more improved when the contact parts 9 are present in both of the peripheral side regions 16*a* and 16*c* than when over only, for example, the peripheral side region 16*a*. Still further, the response of the potential is further more improved when the contact parts 9 are present in all the peripheral side regions 16*a*, 16*b*, 16*c*, and 16*d* than when present in only both of the peripheral side regions 16*a* and 16*c*.

Furthermore, as for one peripheral side region 16*a* (16*b*, 16*c*, or 16*d*), the contact part 9 is not necessarily required to extend over the entire length thereof, and may desirably be over a partial length thereof. However, the possible largest length more improves the response of the potential.

Then, the P− type surface resurf region 8 will be described. As shown in FIG. 25, the P− type surface resurf region 8 has an effect of preventing the reduction of the breakdown voltage in the surface region of the semiconductor substrate 2, but is naturally not an essential element. Further, in FIGS. 3, 4, 7, and the like, the region is shown as an impurity-doped region with an even depth for convenience of drawing. However, the P− type surface resurf region 8 is not necessarily required to assume such a shape. For example, the region may be N-inverted over the N column region 12*n* as with the P− type surface resurf region 8. Namely, boron in the surface 1*a* of the semiconductor substrate 2 tends to be partly consumed (absorbed) by thermal oxidation, a surface heat treatment, and the like by the silicon oxide film or the like. As a result, the width of the upper end of the P column region 12*p* is reduced, resulting in a reduction of the breakdown voltage. In contrast, in such a case as the P− type surface resurf region 8', the width of the upper end of the P column region 12*p* is large. For this reason, the breakdown voltage is not reduced at the upper end of the P column region 12*p*. Namely, as the P− type surface resurf region 8, additional impurities are uniformly introduced into a prescribed region. Then, even when boron is partially consumed by a heat treatment process, the region becomes like the P− type surface resurf region 8'. This can prevent the width of the upper end of the P column regions 12*p* from being reduced.

Figure 26:
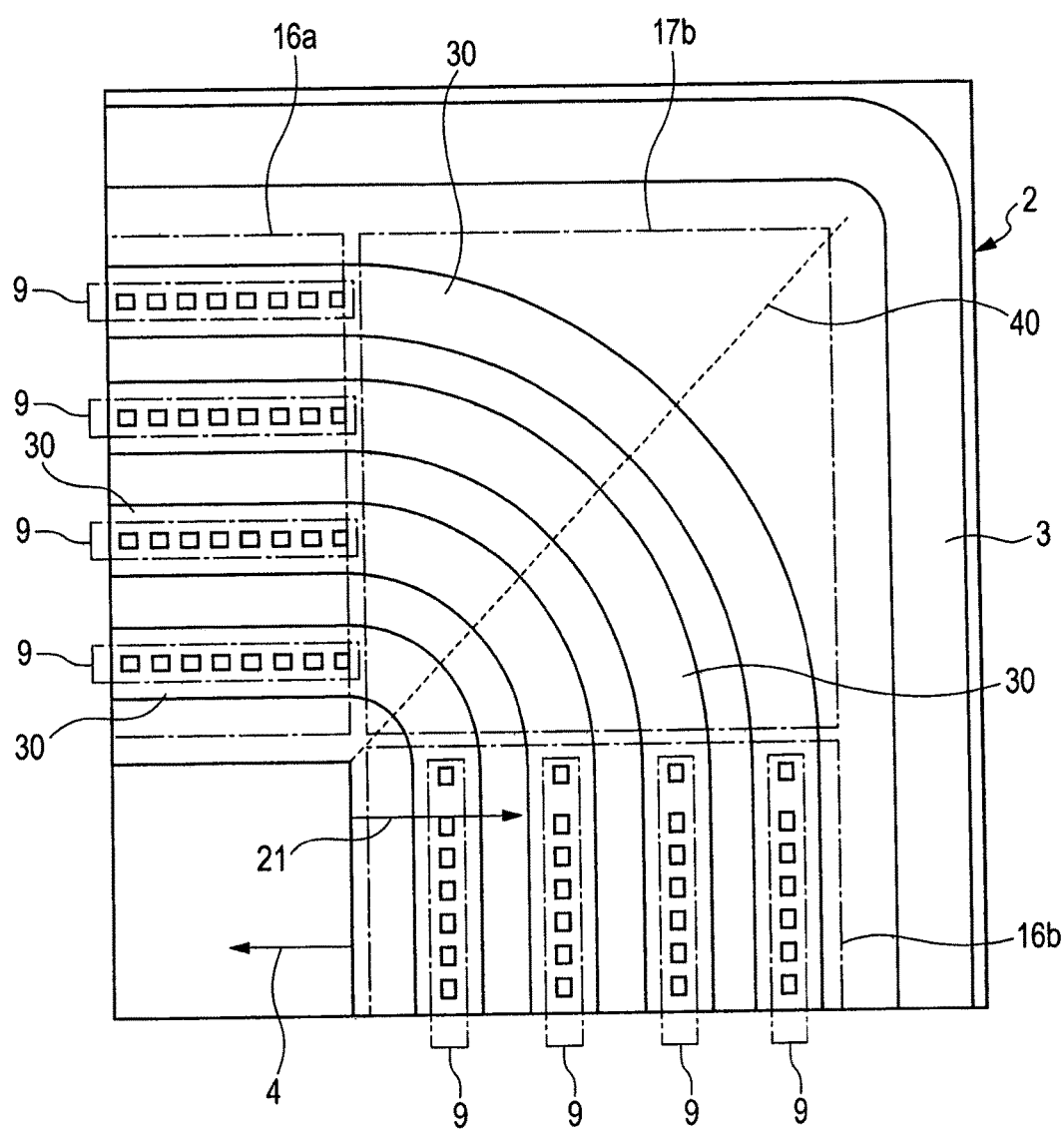
FIG. 26 is a chip top surface partial schematic enlarged view corresponding to FIG. 3 for illustrating a modified example (dot-like contact) and the like regarding the field plate in the peripheral region (edge termination area) of the power MOSFET (power type semiconductor active element) of the one embodiment of the present application.

(2) Dot-Like Contact System (Mainly FIG. 26)

This example is a modified example with respect to the contact parts 9 and the like of FIG. 24 (FIG. 3 or 5).

FIG. 26 is a chip top surface partial schematic enlarged view corresponding to FIG. 3 for illustrating a modified example (dot-like contact) and the like regarding the field plate in the peripheral region (edge termination area) of the power MOSFET (power type semiconductor active element) of the one embodiment of the present application. Based on this, a description will be given to the modified example (dot-like contact) and the like regarding the field plate in the peripheral region (edge termination area) of the power MOSFET (power type semiconductor active element) of the one embodiment of the present application.

The contact part 9 shown in FIG. 24 (FIG. 3 or 5) 9 is an integral long slit-shaped part in a single peripheral side region 16*a* (16*b*, 16*c*, or 16*d*). However, these may be, as shown in FIG. 26, divided into the dot-like contact group 9, or a short slit group.

Figure 27:
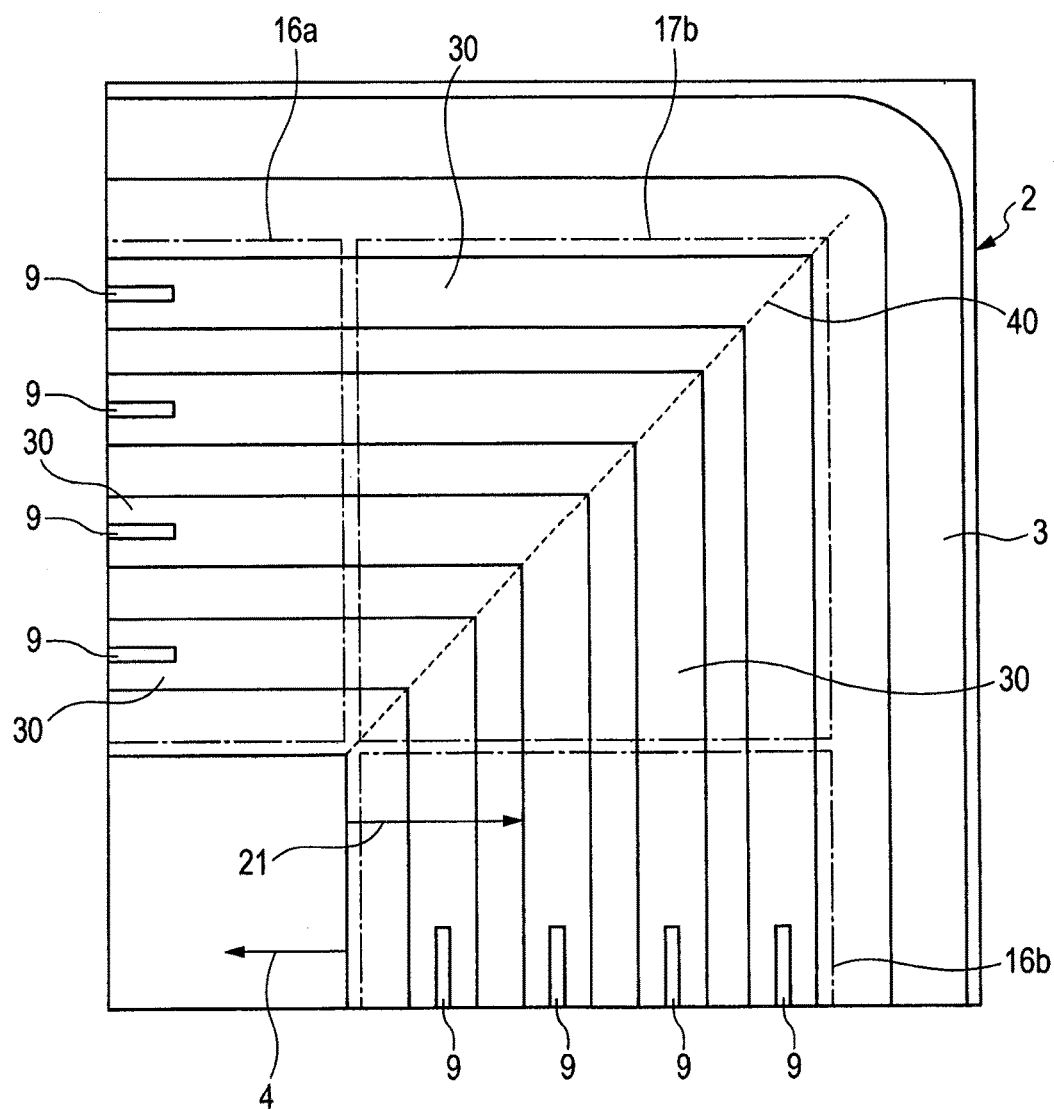
FIG. 27 is a chip top surface partial schematic enlarged view corresponding to FIG. 3 for illustrating a modified example (right-angle bent field plate) and the like regarding the field plate in the peripheral region (edge termination area) of the power MOSFET (power type semiconductor active element) of the one embodiment of the present application.

(3) Right-Angle Bent Field Plate (Mainly FIG. 27)

This example is a modified example on the planar configuration of the metal field plate 30 with respect to the example of FIG. 3, 5, 24, or 26.

FIG. 27 is a chip top surface partial schematic enlarged view corresponding to FIG. 3 for illustrating a modified example (right-angle bent field plate) and the like regarding the field plate in the peripheral region (edge termination area) of the power MOSFET (power type semiconductor active element) of the one embodiment of the present application. Based on this, a description will be given to the modified example (right-angle bent field plate) and the like regarding the field plate in the peripheral region (edge termination area) of the power MOSFET (power type semiconductor active element) of the one embodiment of the present application.

As shown in FIG. 27, the planar configuration of the metal field plate 30 is preferably line symmetric with respect to the diagonal line 40 of the semiconductor chip or the peripheral corner region 17*b* (17*a*, 17*c*, or 17*d*). However, the bending form at the corner part is not limited to round bending (FIG. 3, 5, 24, or 26), and may be right-angle bending. However, generally, round bending has a merit of making it difficult for undesirable distortion of the equipotential planes to occur.

5. Explanation of Modified Example and the Like Regarding the Super-Junction Layout and the Like in the Peripheral Region (Edge Termination Area) of the Power MOSFET (Power Type Semiconductor Active Element) of the One Embodiment of the Present Application (Mainly FIGS. 28 to 34)

Various selections are possible for the super-junction layout in the chip corner part, namely, the layout of the P column regions. In this section, a description will be given to the combination of the basic P column layout and other elements, and various variations of the P column layout.

Figure 28:
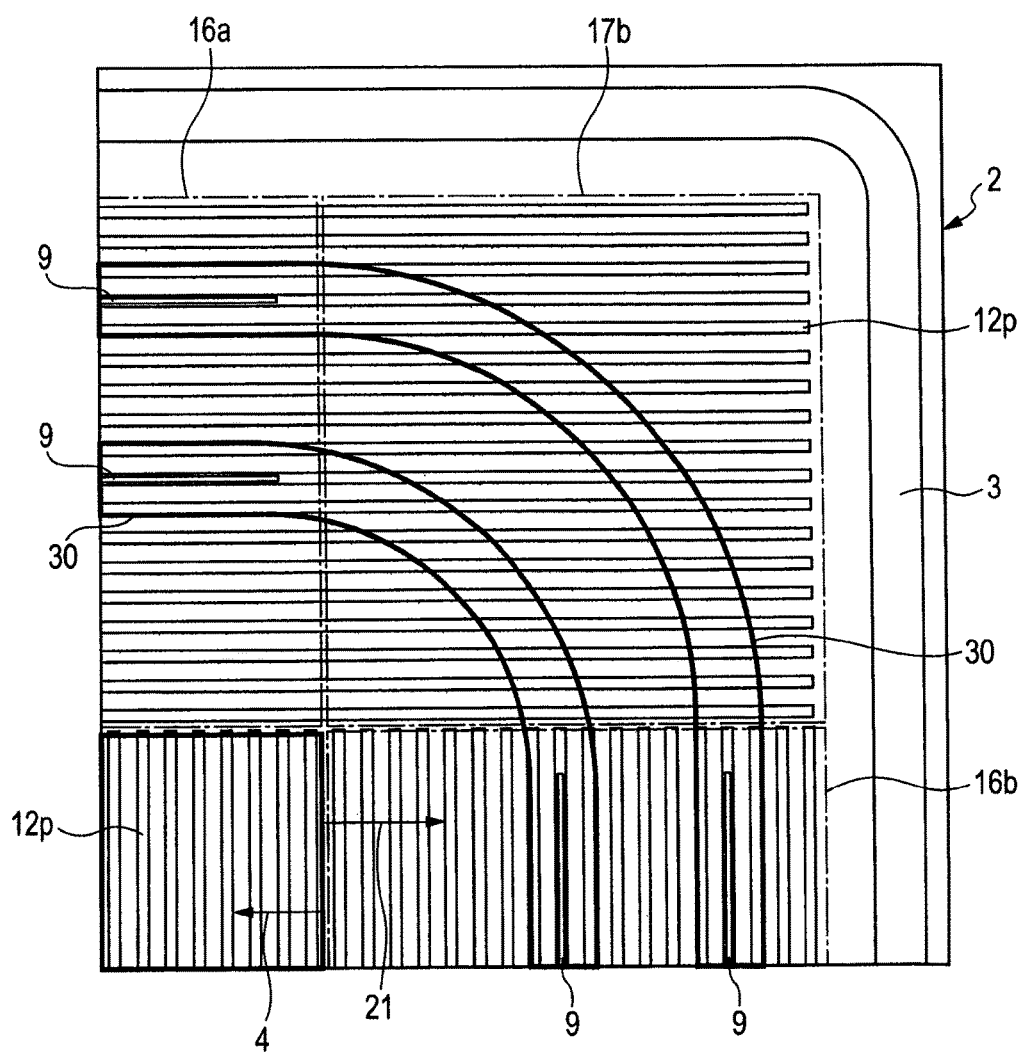
FIG. 28 is a chip top surface partially enlarged view corresponding to FIG. 5 for illustrating a modified example (two-dimensional resurf structure basic layout) and the like regarding the super-junction layout and the like in the peripheral region (edge termination area) of the power MOSFET (power type semiconductor active element) of the one embodiment of the present application.

(1) Detailed Description of Corner-Part Super-Junction Layout of Basic Structure (Mainly FIG. 28)

The explanation of this sub-section further describes the corner-part super-junction layout of the basic structure described in conjunction with FIG. 5 and the like as the basis for describing the variations of the super-junction layout in the peripheral corner region 17*b* (17*a*, 17*c*, or 17*d*).

FIG. 28 is a chip top surface partially enlarged view corresponding to FIG. 5 for illustrating a modified example (two-dimensional resurf structure basic layout) and the like regarding the super-junction layout and the like in the peripheral region (edge termination area) of the power MOSFET (power type semiconductor active element) of the one embodiment of the present application. Based on this, a description will be given to the modified example and the like (details of the corner-part super-junction layout of the basic structure) in the peripheral region (edge termination area) of the power MOSFET (power type semiconductor active element) of the one embodiment of the present application.

As shown in FIG. 28, in the corner-part super-junction layout of the basic structure, the P column regions 12*p* in the peripheral corner region 17*b* are integral with their corresponding P column regions 12*p* in the peripheral side region 16*a*, respectively. The P column regions 12*p* are spread almost entirely in the peripheral corner regions 17*b* (17*a*, 17*c*, and 17*d*) so as to form the super-junction.

Figure 29:
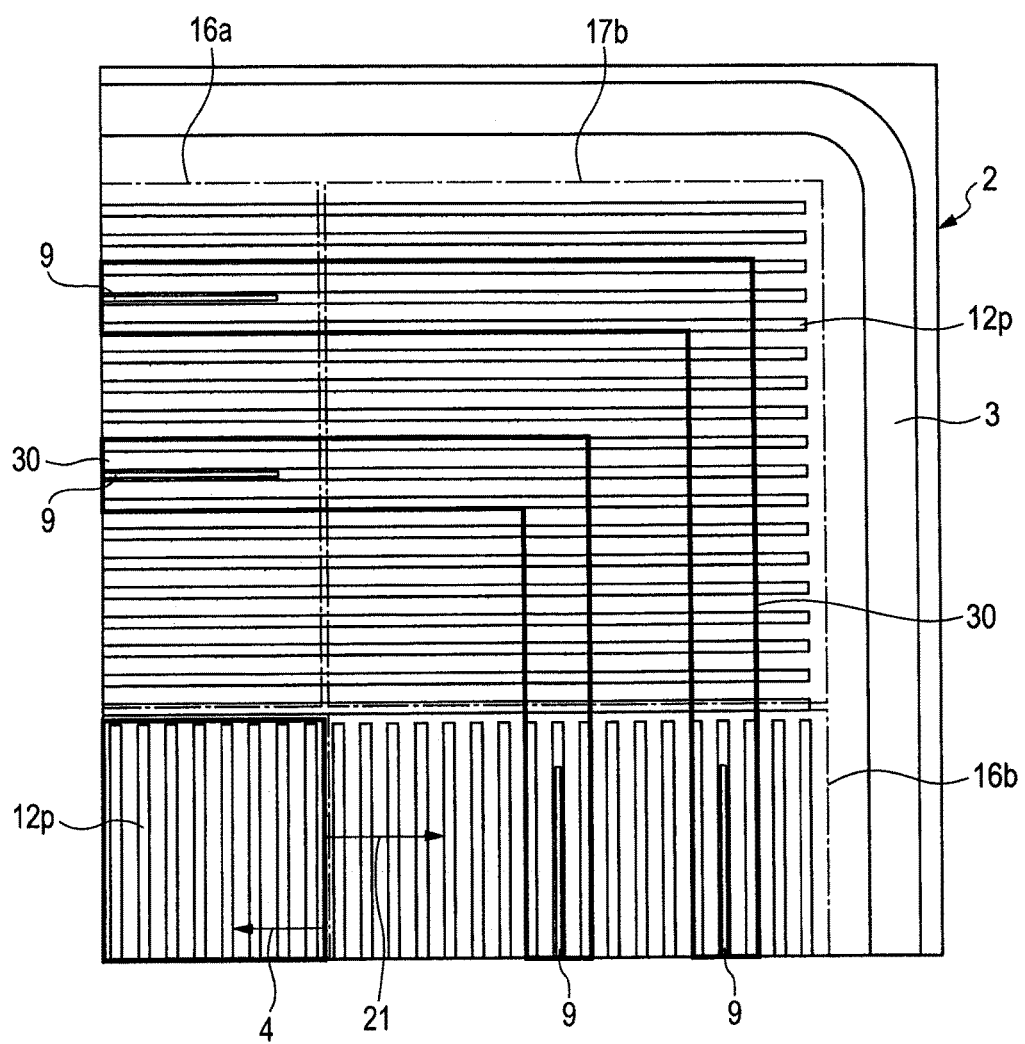
FIG. 29 is a chip top surface partially enlarged view corresponding to FIG. 5 for illustrating a modified example (combination of the structure basic layout and the right-angle bent field plate) and the like regarding the super-junction layout and the like in the peripheral region (edge termination area), and the like of the power MOSFET (power type semiconductor active element) of the one embodiment of the present application.

(2) Combination of Basic Structure and Right-Angle Bent Field Plate (Mainly FIG. 29)

The example of this sub-section is a modified example regarding the planar configuration of the metal field plate 30 with respect to the example of FIG. 28.

FIG. 29 is a chip top surface partially enlarged view corresponding to FIG. 5 for illustrating a modified example and the like regarding the super-junction layout (combination of the structure basic layout and the right-angle bent field plate) in the peripheral region (termination region), and the like of the power MOSFET (power type semiconductor active element) of the one embodiment of the present application. Based on this, a description will be given to the modified example (combination of the structure basic layout and the right-angle bent field plate) and the like regarding the super-junction layout and the like in the peripheral region (edge termination area), and the like of the power MOSFET (power type semiconductor active element) of the one embodiment of the present application.

As shown in FIG. 29, this example is configured by replacing the round bent field plate 30 of the example of FIG. 28 with the right-angle bent field plate 30.

Figure 30:
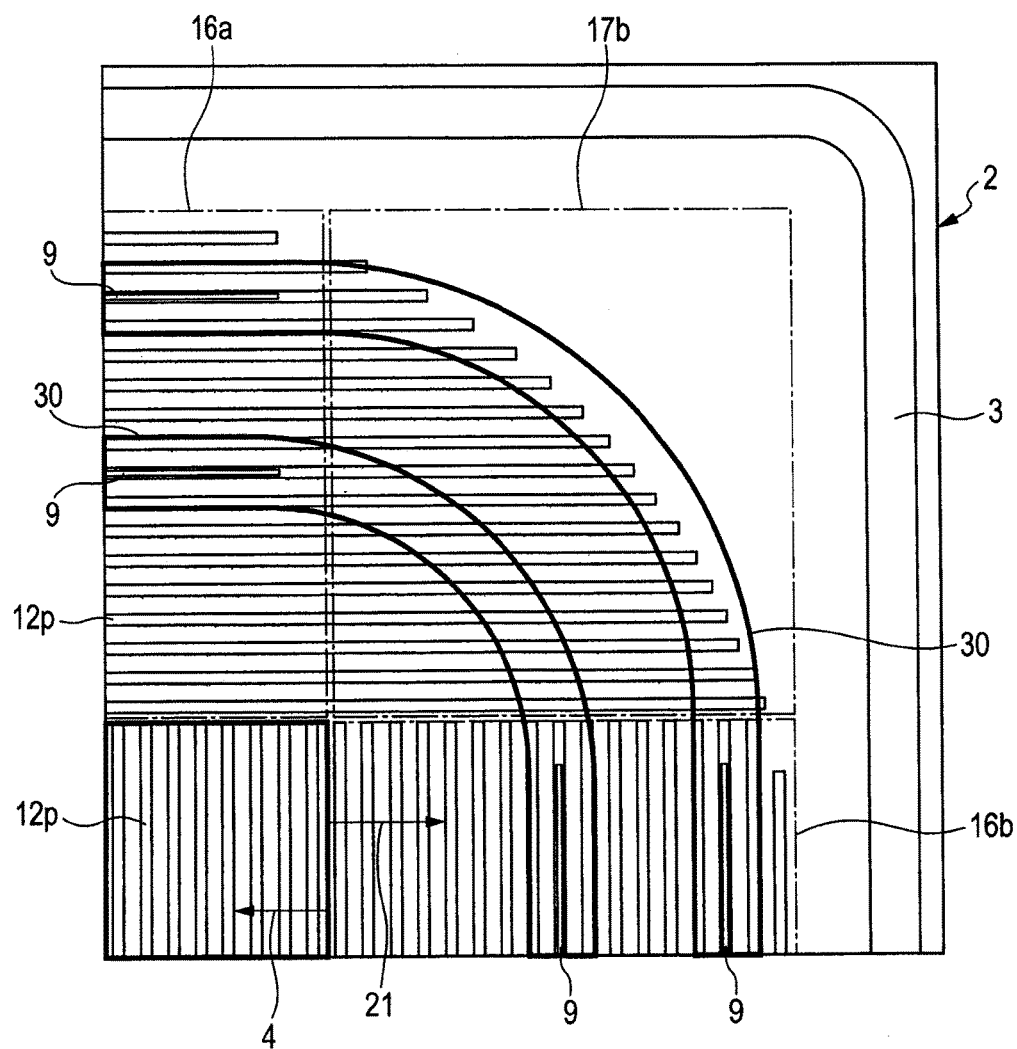
FIG. 30 is a chip top surface partially enlarged view corresponding to FIG. 5 for illustrating a modified example and the like regarding the super-junction layout (round corner layout) and the like in the peripheral region (edge termination area) of the power MOSFET (power type semiconductor active element) of the one embodiment of the present application.

(3) Corner P Column Region Round Layout or Corner P Column Region Trim System (Mainly FIG. 30)

The example of this sub-section is a modified example regarding the corner-part super-junction layout with respect to the example of FIG. 28 (FIG. 1, 3, 5, or 29).

FIG. 30 is a chip top surface partially enlarged view corresponding to FIG. 5 for illustrating a modified example and the like regarding the super-junction layout (round corner layout) and the like in the peripheral region (edge termination area) of the power MOSFET (power type semiconductor active element) of the one embodiment of the present application. Based on this, a description will be given to the modified example and the like (corner P column region round layout) regarding the super-junction layout and the like in the peripheral region (edge termination area) of the power MOSFET (power type semiconductor active element) of the one embodiment of the present application.

As shown in FIG. 30, in the corner-part super-junction layout of the basic structure, the P column regions 12*p* in the peripheral corner region 17*b* are integral with their corresponding P column regions 12*p* in the peripheral side region 16*a*, respectively. However, as distinct from the examples of FIG. 28 and the like, in this example, the P column regions 12*p* are spread in a part of the peripheral corner region 17*b* (17*a*, 17*c*, or 17*d*) in such a manner as to form a super-junction, but is trimmed at the outer portion thereof in such a manner as to be along the outermost-side field plate 30. The combination of the trim shape and the round bent field plate 30 can effectively prevent the occurrence of undesirable distortion of the equipotential planes in the corner part. However, the round bent field plate 30 is not necessarily essential, and can also be combined with field plates 30 having other planar configurations.

Figure 31:
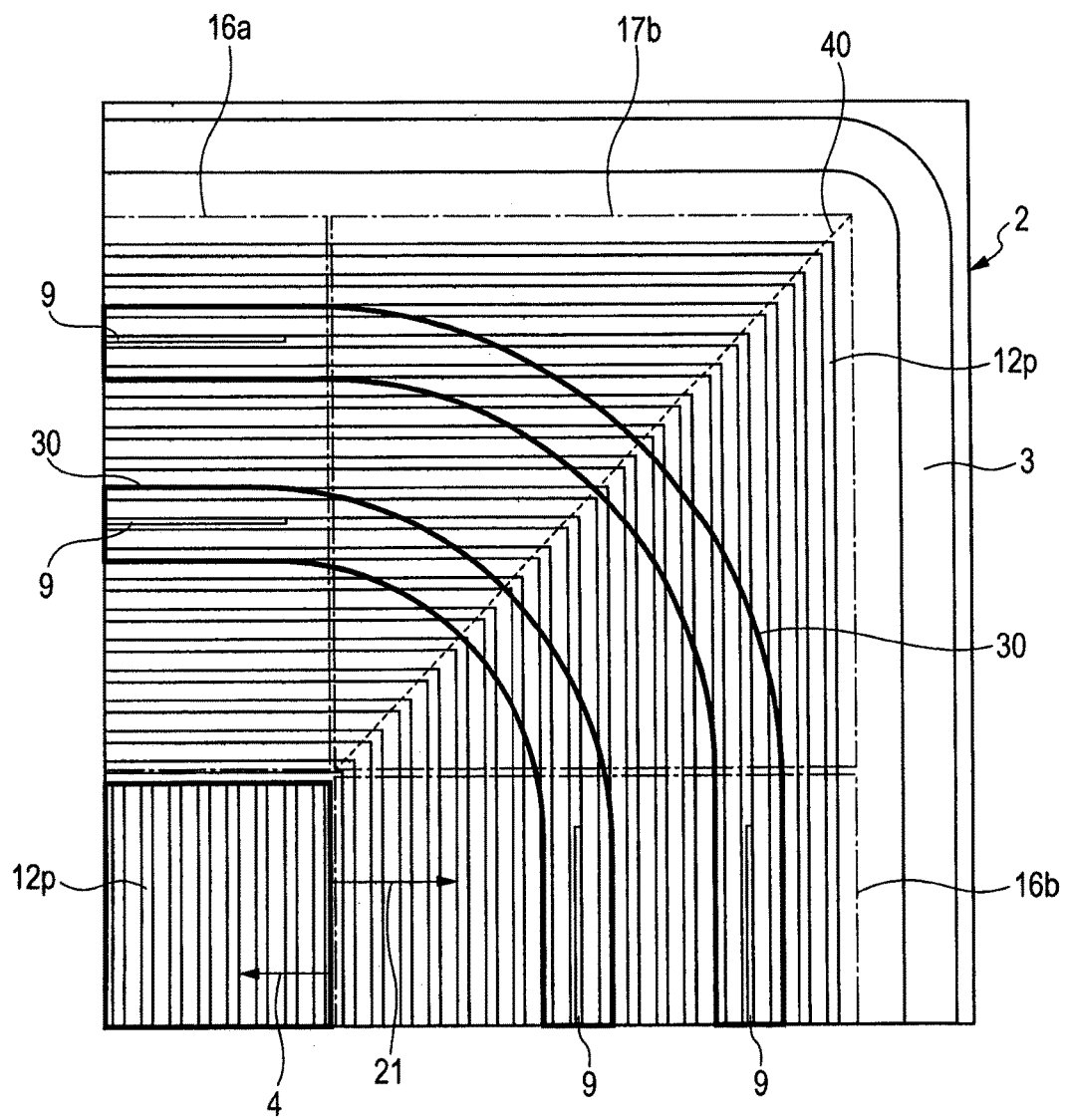
FIG. 31 is a chip top surface partially enlarged view corresponding to FIG. 5 for illustrating a modified example and the like regarding the super-junction layout (continuous corner layout) and the like in the peripheral region (edge termination area) of the power MOSFET (power type semiconductor active element) of the one embodiment of the present application.

(4) Corner Part Continuous Super-Junction Layout (Mainly FIG. 31)

The example of this sub-section is a modified example regarding the corner-part super-junction layout with respect to the example of FIG. 28 (FIG. 1, 3, 5, 29, or 30).

FIG. 31 is a chip top surface partially enlarged view corresponding to FIG. 5 for illustrating a modified example and the like regarding the super-junction layout (continuous corner layout) and the like in the peripheral region (edge termination area) of the power MOSFET (power type semiconductor active element) of the one embodiment of the present application. Based on this, a description will be given to the modified example and the like regarding the super-junction layout (corner part continuous super-junction layout) in the peripheral region (edge termination area) of the power MOSFET (power type semiconductor active element) of the one embodiment of the present application.

As shown in FIG. 31, in the corner part continuous super-junction layout, the P column regions 12p in the peripheral corner region 17b are integral with their corresponding P column regions 12p in both the peripheral side regions 16a and 16b, respectively. The P column regions 12p are spread almost entirely in the peripheral corner regions 17b (17a, 17c, and 17d) so as to form the super-junction. Further, the corner part continuous super-junction layout is roughly line symmetrical with respect to with respect to the diagonal line 40 of the semiconductor chip or the peripheral corner region as with the round bent field plate 30. The combination of the line symmetrical field plates 30 (which may be the right-angle bent field plates) and the corner part continuous super-junction layout can effectively prevent the occurrence of undesirable distortion of the equipotential planes in the corner part. However, the combination of the line symmetrical ones is effective, but is not essential.

Incidentally, the corner part continuous super-junction layout is line symmetrical with respect to the diagonal line 40 both in a macro sense and in a micro sense, but, is a non-charge balance type layout as distinct from other examples (FIGS. 28, 30, and the like) in terms of charge balance.

Further, the corner part continuous super-junction layout has disadvantages as previously described in the case where the trench fill process is carried out under the conditions sensitive to orientation.

Figure 32:
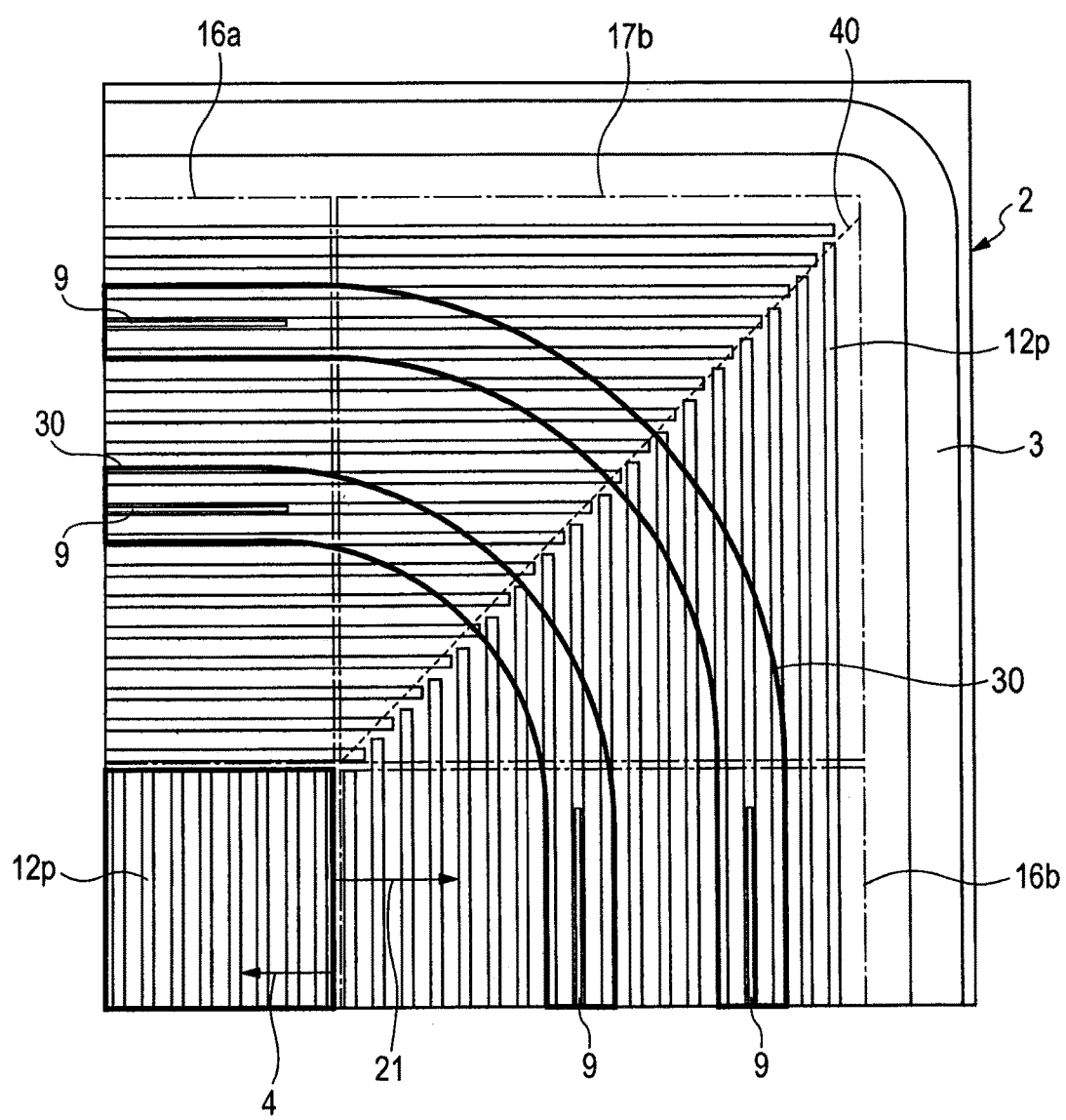
FIG. 32 is a chip top surface partially enlarged view corresponding to FIG. 5 for illustrating a modified example and the like regarding the super-junction layout (charge balance type corner layout) and the like in the peripheral region (edge termination area) of the power MOSFET (power type semiconductor active element) of the one embodiment of the present application.
Figure 33:
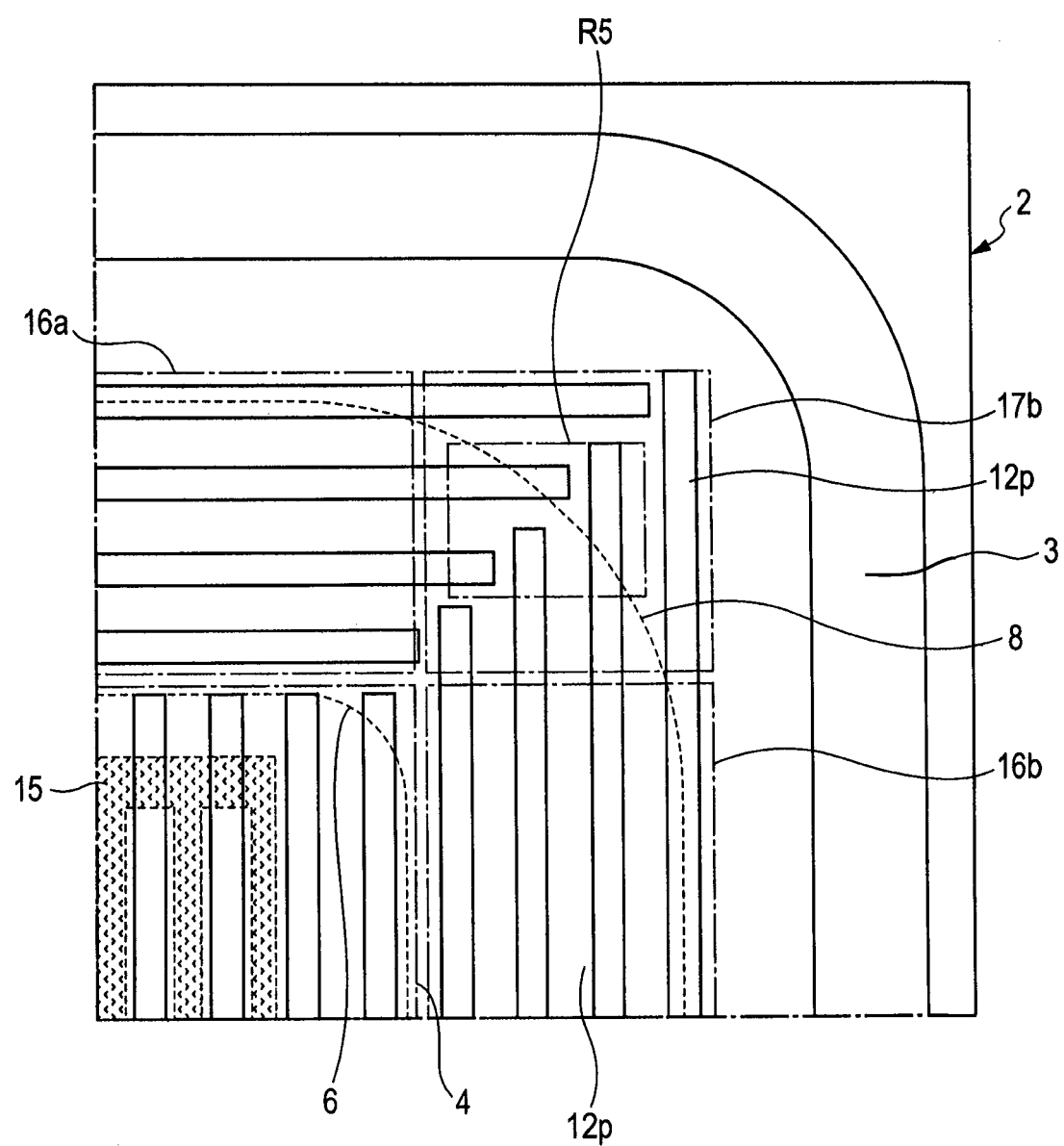
FIG. 33 is a chip top surface schematic partially enlarged view for illustrating the super-junction layout and the like of the same portion as FIG. 32.
Figure 34:
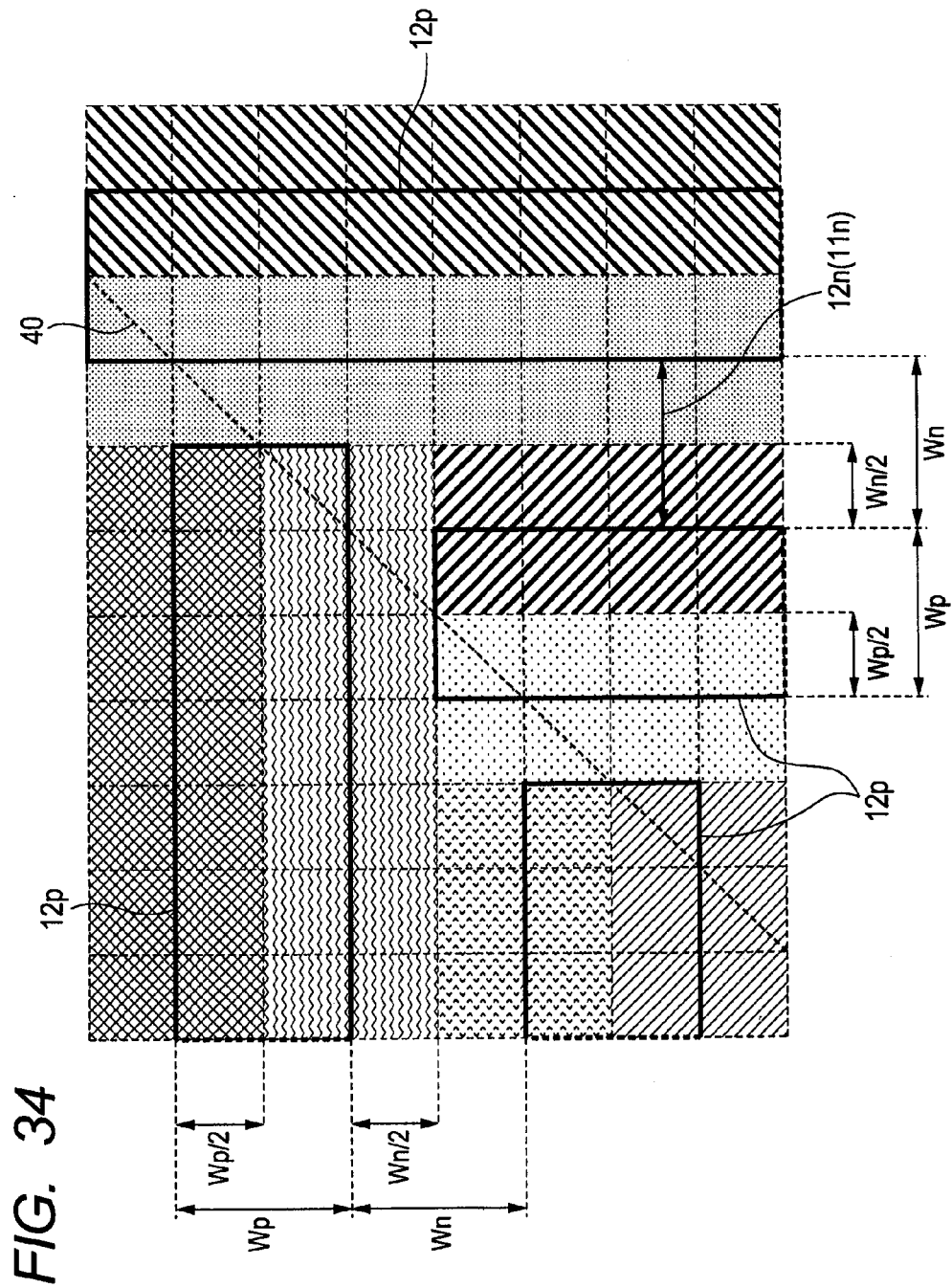
FIG. 34 is a super-junction layout illustrative view of a corner part charge balance processing part partially cut-out region R5 of FIG. 33.

(5) Charge Balance Type Corner-Part Super-Junction Layout (Mainly FIGS. 32 to 34)

The example of this sub-section is a modified example regarding the corner-part super-junction layout with respect to FIG. 28 (FIG. 1, 3, 5, 29, 30, or 31).

FIG. 32 is a chip top surface partially enlarged view corresponding to FIG. 5 for illustrating a modified example and the like regarding the super-junction layout (charge balance type corner layout) and the like in the peripheral region (edge termination area) of the power MOSFET (power type semiconductor active element) of the one embodiment of the present application. FIG. 33 is a chip top surface schematic partially enlarged view for illustrating the super-junction layout and the like of the same portion as FIG. 32. FIG. 34 is a super-junction layout illustrative view of a corner part charge balance processing part partially cut-out region R5 of FIG. 33. Based on these, a description will be given to the modified example and the like (charge balance type corner-part super-junction layout) regarding the super-junction layout and the like in the peripheral region (edge termination area) of the power MOSFET (power type semiconductor active element) of the one embodiment of the present application.

As shown in FIG. 32, in the active cell part super-junction structure, and in the peripheral side regions 16a and 16b (16c and 16d), although the same as the non-charge balance type column layout, in the peripheral corner region 17b (17a, 17c, or 17d), the P column regions 12p are separated at a portion along the diagonal line 40 as compared with the non-charge balance type bending layout (FIG. 31). Further, the ends of respective P column regions 12p are in positional relation mutually interpenetrating from opposite sides thereof.

FIG. 33 schematically shows the structure with the P column regions 12p reduced in number for ease of understanding of this point. FIG. 34 shows the corner part charge balance processing part partially cut-out region R5 on an enlarged and deformed scale for illustrating the correlation between the P column regions 12p running in the X and Y directions. In FIG. 34, the thickness Wn of the N column is shown on a reduced scale ("N column reduced-scale presentation") so that the thickness Wn of the N column and the thickness Wp of the P column are roughly equal in the drawing (only in this figure, it is apparently shown in the figure that Wn=Wp). Therefore, the charge amounts included in the same area are equal. As shown in FIG. 34, in the charge balance type corner column layout, the charge amounts of the half-width regions (band-like regions with widths of Wn/2 and Wp/2 each of which is half the thickness of the column) given the same hatching on the opposite sides of the side in the longitudinal direction of the P column region 12p are equal in absolute value, and are opposite in sign to each other. As a result, with a layout such that the hatched parts completely cover the whole region (e.g., the peripheral corner region 17b), the local charge balance is held. This indicates that the following configuration is desirable to this end: for example, the center of the side in the lateral direction of the P column region 12p lies on the diagonal line 40 of the semiconductor chip or the peripheral corner region; and the closest distance between the adjacent P column regions 12p is set at about Wn/2, half the thickness of the N column.

Incidentally, as shown in FIG. 33 and the like, the corner part super-junction structure desirably does not include fine columns, namely, fine P column regions 12p. This is for the following reason: when the fine columns are present, they are different in filling characteristics as compared with other macro P column regions 12p when filled by a trench epitaxial filling system; accordingly, the process window capable of favorably holding the filling characteristics becomes small. The term "fine column" herein used represents the one in which the length of the P column region 12p is less than twice the width or thickness Wp. Whereas, the term "macro column" represents the one in which the length of the P column region 12p is twice or longer the width or thickness Wp.

Such a charge balance type corner column layout is, in a macro sense, line symmetrical with respect to the diagonal line 40 of the semiconductor chip or the peripheral corner region. It is naturally understood that the layout is not line symmetrical in a micro sense. Therefore, in the example of FIG. 32, both of the corner-part super-junction layout and the planar configuration of the metal field plate at the corner part are line symmetrical in a macro sense. The combination thereof can effectively prevent the occurrence of distortion of the equipotential planes at the corner part. The line symmetrical metal field plate may be round bent or right-angle bent. Further, the combination of the line symmetrical structures is not essential.

The example described in this sub-section is of the charge balance type attained by improving the point of non-charge balanced type which is the weak point of FIG. 31. Therefore, the corner-part super-junction layout is line symmetrical in a macro sense, but is not line symmetrical in a micro sense with respect to the diagonal line 40. However, the lack of the micro symmetry adversely affects the breakdown voltage mainly through the lack of the charge balance. Therefore, the lack itself of the micro symmetry does not remarkably and adversely affect the breakdown voltage.

Incidentally, herein, for the symmetry (about top across corner) of the corner-part super-junction layout, the classification is shown in summary. Namely, those which are asymmetrical in a micro sense are FIGS. 2, 3, 5, 28, 29, 30, 32, 33, 35, 36, 37, 38, 39, and the like. Out of these, FIGS. 32, 33, 38, and 39 are symmetrical in a macro sense. On the other hand, the one which is symmetrical in a micro sense is FIG. 31. Further, the example of FIG. 31 is of the non-charge balance type. Those except for this are of the charge balance type.

6. Explanation of Application of the Field Plate in the Peripheral Region (Edge Termination Area) of the Power MOSFET (Power Type Semiconductor Active Element) of the One Embodiment of the Present Application to Three-Dimensional Resurf Structure (See, Mainly FIGS. 35 and 36, and 1)

Up to this point, a description was mainly given to the two-dimensional resurf structure. However, the metal field plate in the chip peripheral region and the previously described various modifications and the like are also applicable to a three-dimensional resurf structure almost as they are. With the three-dimensional resurf structure, there is a possibility of ensuring a higher breakdown voltage with a smaller chip area. This is because the structure has a high dimension.

Figure 35:
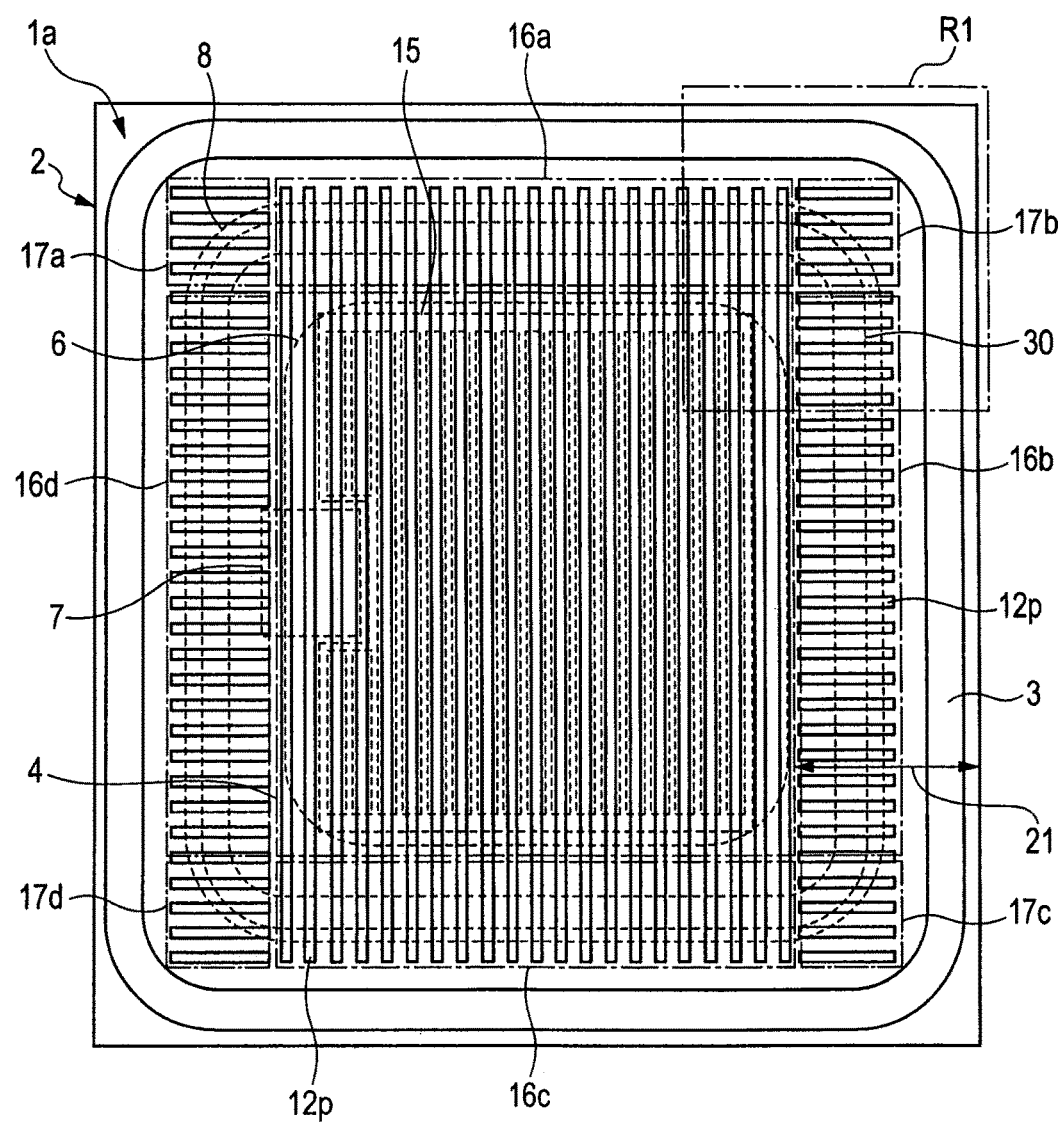
FIG. 35 is an entire top view (mainly an impurity region structure) of the semiconductor chip corresponding to FIG. 2 for illustrating the application of the field plate in the peripheral region (edge termination area) of the power MOSFET (power type semiconductor active element) of the one embodiment of the present application to a three-dimensional resurf structure.
Figure 36:
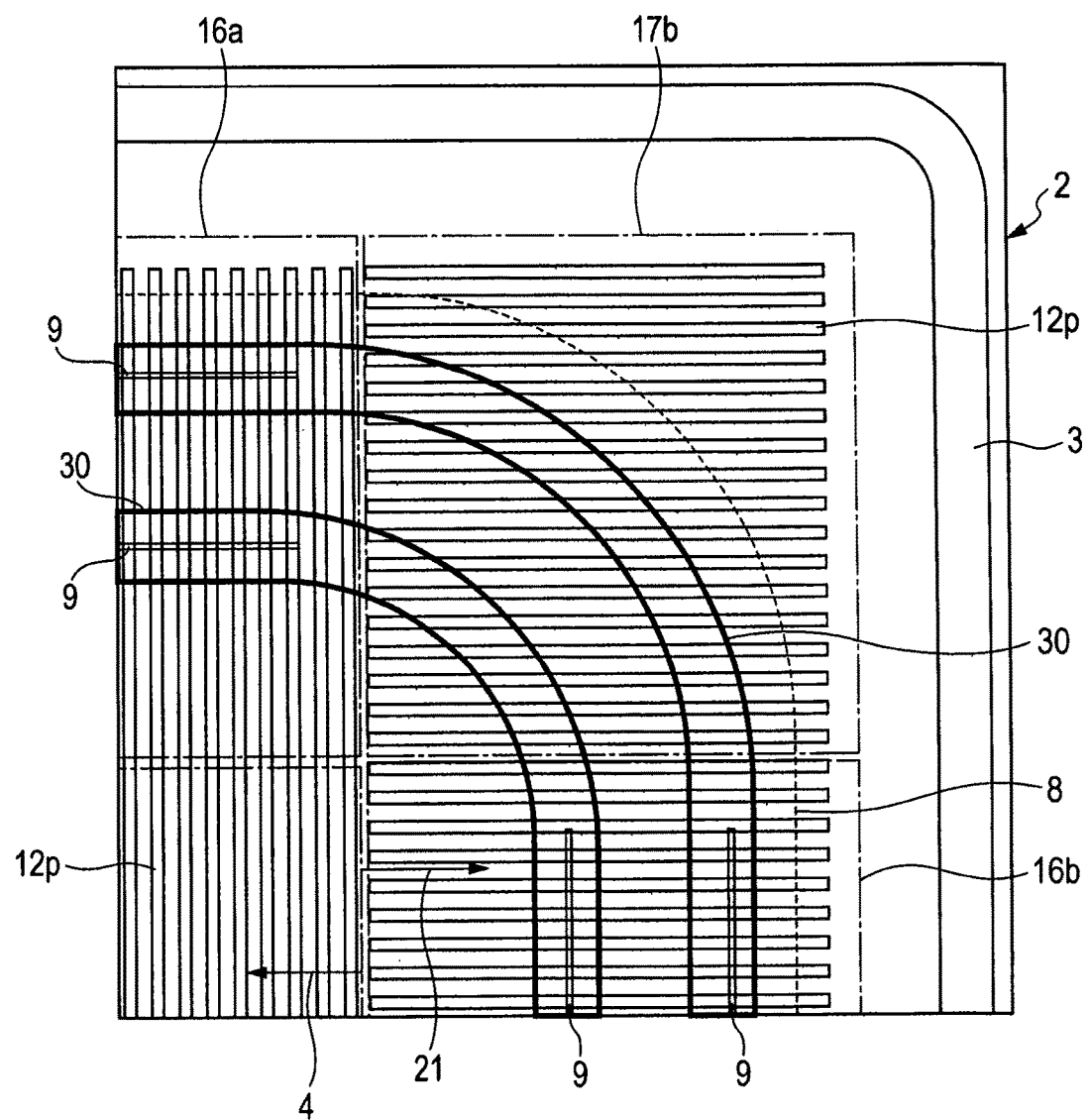
FIG. 36 is a chip top surface partially enlarged view (the basic layout of the three-dimensional resurf structure) of the chip corner part cut-out region R1 of FIG. 35.

FIG. 35 is an entire top view (mainly an impurity region structure) of the semiconductor chip corresponding to FIG. 2 for illustrating the application of the field plate in the peripheral region (edge termination area) of the power MOSFET (power type semiconductor active element) of the one embodiment of the present application to a three-dimensional resurf structure. FIG. 36 is a chip top surface partially enlarged view (the basic layout of the three-dimensional resurf structure) of the chip corner part cut-out region R1 of FIG. 35. Based on these, a description will be given to the application of the field plate in the peripheral region (edge termination area) of the power MOSFET (power type semiconductor active element) of the one embodiment of the present application to a three-dimensional resurf structure.

First, a description will be given to the schematic layout of the top surface of the chip (generally, several millimeters square). As shown in FIGS. 1 and 35, in a power MOSFET element chip 2 in which an element is formed over a square or rectangular (i.e., tetragonal) plate-shaped silicon type semiconductor substrate (which is a wafer 1 before division into individual chips 2), a metal source electrode 5 (aluminum type electrode) present at the central part over the device main surface 1*a* (first main surface) accounts for the major area. Under the metal source electrode 5, there is disposed an active cell region 4. The outer end thereof becomes a P type main junction 6 (the outer edge of the P body region). Incidentally, the periphery of the chip which is the outside of the active cell region 4 is referred to as a chip peripheral region 21.

The inside of the P type main junction 6 is a repeating structural part 4*r* of the active cell region 4. On the outside of the ring-shaped P type main junction 6, there are disposed a similarly ring-shaped P− type surface resurf region 8 and a peripheral super-junction region (a region in which linear P columns 12*p* and N type drift regions 11*n* therebetween are periodically arranged roughly equidistantly in a peripheral drift region 11, or a collective region thereof). Herein, the outer end of the P− type surface resurf region 8 is, for example, in the vicinity of the outer end of the peripheral super-junction region. Incidentally, in this example, the peripheral super-junction region includes four peripheral side regions 16*a*, 16*b*, 16*c*, and 16*d* and four peripheral corner regions 17*a*, 17*b*, 17*c*, and 17*d*.

Further, therearound, an aluminum type metal guard ring 3 is disposed. Between the aluminum type metal guard ring 3 and the metal source electrode 5, there are disposed a metal gate electrode 7 (including a metal gate wire 7*w*) for extracting the polysilicon gate electrode to the outside, and a metal source electrode peripheral part 5*p* (the field plate part at the source electrode end). Incidentally, in FIG. 1 (the same for FIG. 35), the peripheral edge termination area is drawn in an exaggerated manner with an increased width for ease of understanding of the structure thereof.

Then, a description will be given to the planar diffusion structure (impurity doped structure) and device layout of the chip 2. As shown in FIG. 35, at the central part of the chip 2, there is disposed the active cell region 4 (an active cell part super-junction structure is present at the underlying part). In the inside thereof, there are disposed a large number of linear polysilicon gate electrodes 15. Further, in the outside of the ring-shaped P type main junction 6 which is the outer edge of the active cell region 4, and surrounds the circumference thereof, there is disposed a ring-shaped P− type surface resurf region 8 coupled with the P type main junction 6, and surrounding the active cell region 4.

Then, a description will be given to the super-junction structure in the periphery of the active cell part super-junction structure, namely, the peripheral super-junction region. In the peripheral side regions 16*a* and 16*c*, there are disposed super-junction structures coupled with the active cell part super-junction structure, and each having the same orientation, respectively. On the other hand, in the peripheral side regions 16*b* and 16*d*, there are disposed super-junction structures not coupled with the active cell part super-junction structure, and each having an orientation orthogonal thereto, respectively. Incidentally, with the column layout, respective peripheral corner regions 17*a*, 17*b*, 17*c*, and 17*d* are the extended regions of the peripheral side regions 16*b* and 16*d* thereunder or thereover.

Then, FIG. 36 shows an expanded view of a portion corresponding to the portion of the chip corner part cut-out region R1 of FIG. 35. As shown in FIG. 36, the outer end of the P− type surface resurf region 8 is, entirely therearound, in the vicinity of the outer end of the peripheral super-junction region (incidentally, the P− type surface resurf region 8 is not an essential element, and the position of the outer end is also not necessarily required to be in the vicinity of the outer end of the peripheral super-junction region, and may be, for example, in the intermediate region). As shown in FIG. 1, in the repeating structural part 4*r* in the active cell region, there is disposed a periodic structure (one-dimensional periodic structure) in which the P+ body contact regions 23 (see FIG. 6) and the polysilicon gate electrodes 15 are alternately repeated. Further, in the peripheral super-junction region (FIG. 1), a ring-shaped field plate 30 (metal field plate in the chip peripheral regions) is disposed in such a manner as to surround the active cell region 4. Further, in the field plate 30, field plate contact parts 9 (contact grooves or contact holes) extending roughly in parallel are disposed along the sides of the active cell region 4 in a nearly rectangular shape. On the other hand, in each portion of the field plate 30 in the peripheral corner regions 17*b* (17*a*, 17*c*, and 17*d*), the field plate contact part 9 is not disposed. This is due to the following fact: the potential obtained through the contact part 9 in the peripheral side region 16*a* (16*b*, 16*c*, or 16*d*) in which the distribution of equipotential planes is relatively flat is supplied to the field plate 30 over the peripheral corner region 17*b* (17*a*, 17*c*, or 17*d*).

As previously described (FIG. 36), so long as the equal distance condition is substantially satisfied, the contact parts 9 may be formed to extend over a plurality of P column regions 12p and N column regions 12n.

7. Explanation of Modified Example and the Like Regarding Super-Junction Layout in Peripheral Region (Edge Termination Area) on the Application to Three-Dimensional Resurf Structure (Mainly FIGS. 37 to 40)

As with Section 5 regarding the two-dimensional resurf structure, in this section, for the three-dimensional resurf structure, various variations and the like on the super-junction layout and the like will be described.

Figure 37:
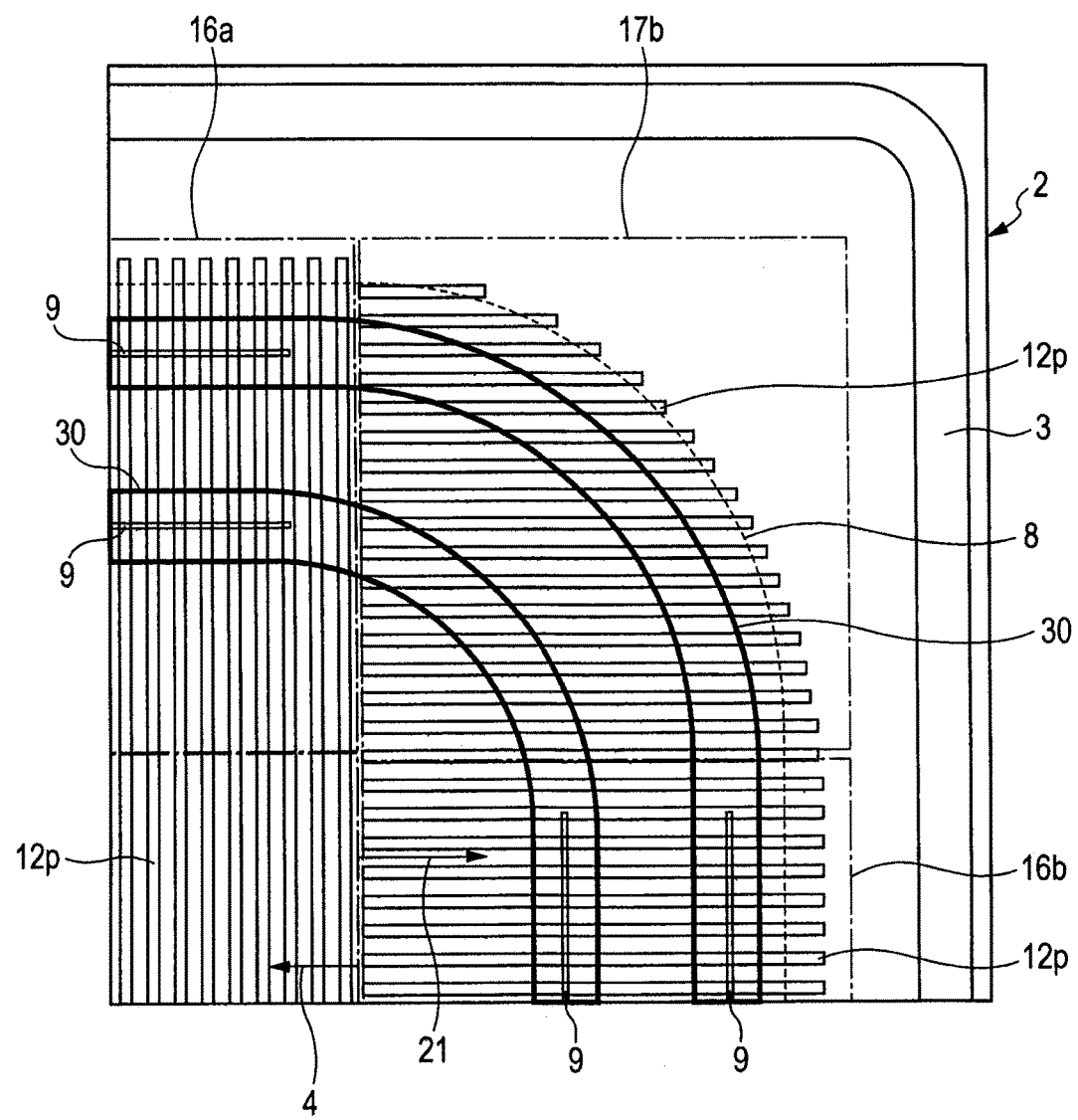
FIG. 37 is a chip top surface partially enlarged view (round corner layout) of the chip corner part cut-out region R1 of FIG. 35.

(1) Corner P Column Region Round Layout (Mainly FIG. 37)

The example of this sub-section is a modified example with respect to the basic form of the peripheral part super-junction structure in the three-dimensional resurf structure shown in FIGS. 35 and 36.

FIG. 37 is a chip top surface partially enlarged view (round corner layout) of the chip corner part cut-out region R1 of FIG. 35. Based on this, a description will be given to the modified example and the like (corner P column region round layout) regarding the super-junction layout in the peripheral region (edge termination area) on the application to the three-dimensional resurf structure.

As shown in FIG. 37, in the corner-part super-junction layout of the basic structure, the P column regions 12p in the peripheral corner region 17b have, as with FIGS. 35 and 36, almost the same periodicity as the periodicity of the layout of the P column regions 12p in the peripheral side region 16a. However, as distinct from the examples of FIGS. 35 and 36, in this example, the P column regions 12p are spread in a part of the peripheral corner region 17b (17a, 17c, or 17d) in such a manner as to form a super-junction, but is trimmed at the outer portion thereof in such a manner as to be along the outermost-side field plate 30. The combination of the trim shape and the round bent field plate 30 can effectively prevent the occurrence of undesirable distortion of the equipotential planes in the corner part. However, the round bent field plate 30 is not necessarily essential, and can also be combined with field plates 30 having other planar configurations.

Figure 38:
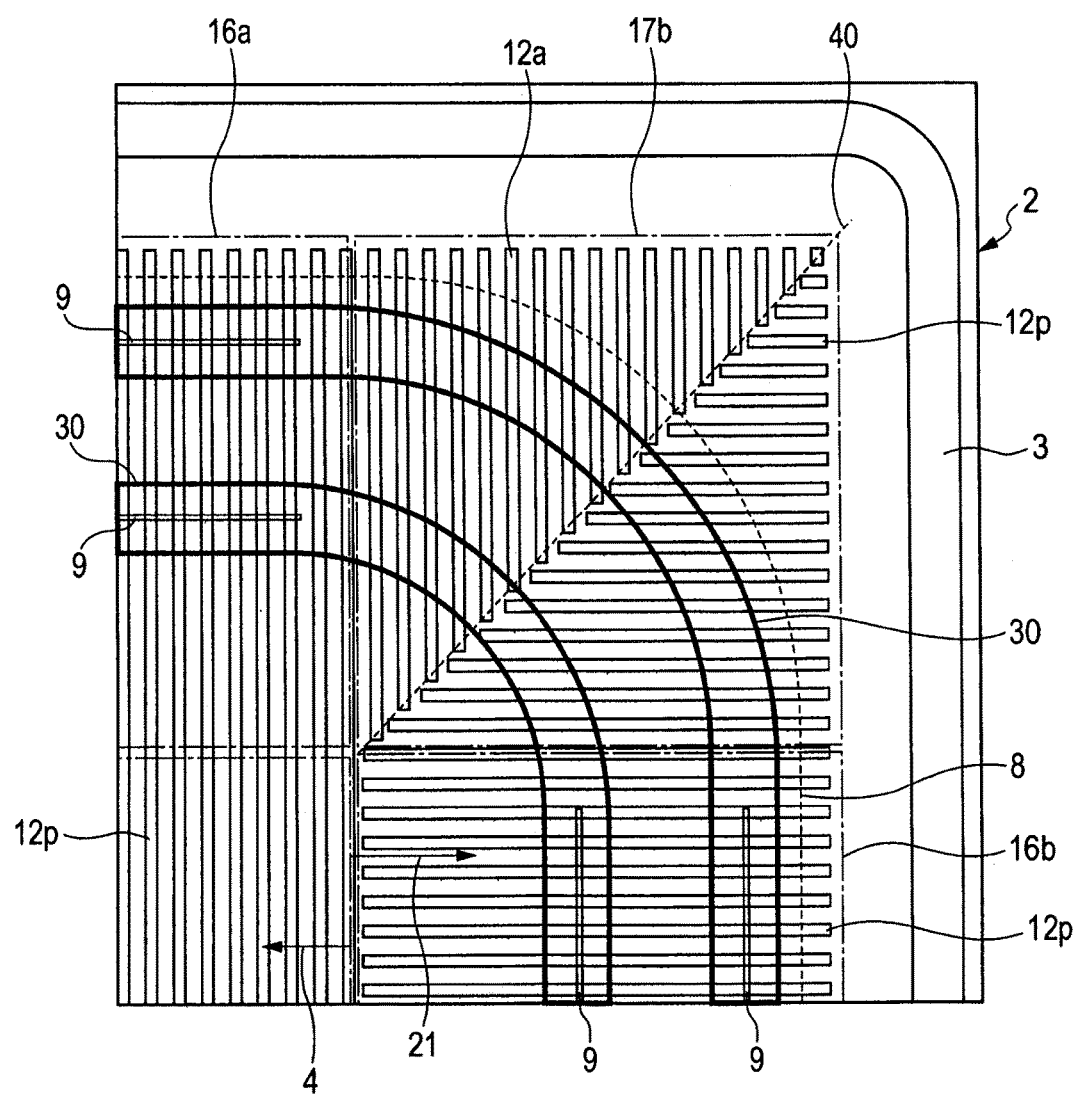
FIG. 38 is a chip top surface partially enlarged view (charge balance type corner layout) of the chip corner part cut-out region R1 of FIG. 35.
Figure 39:
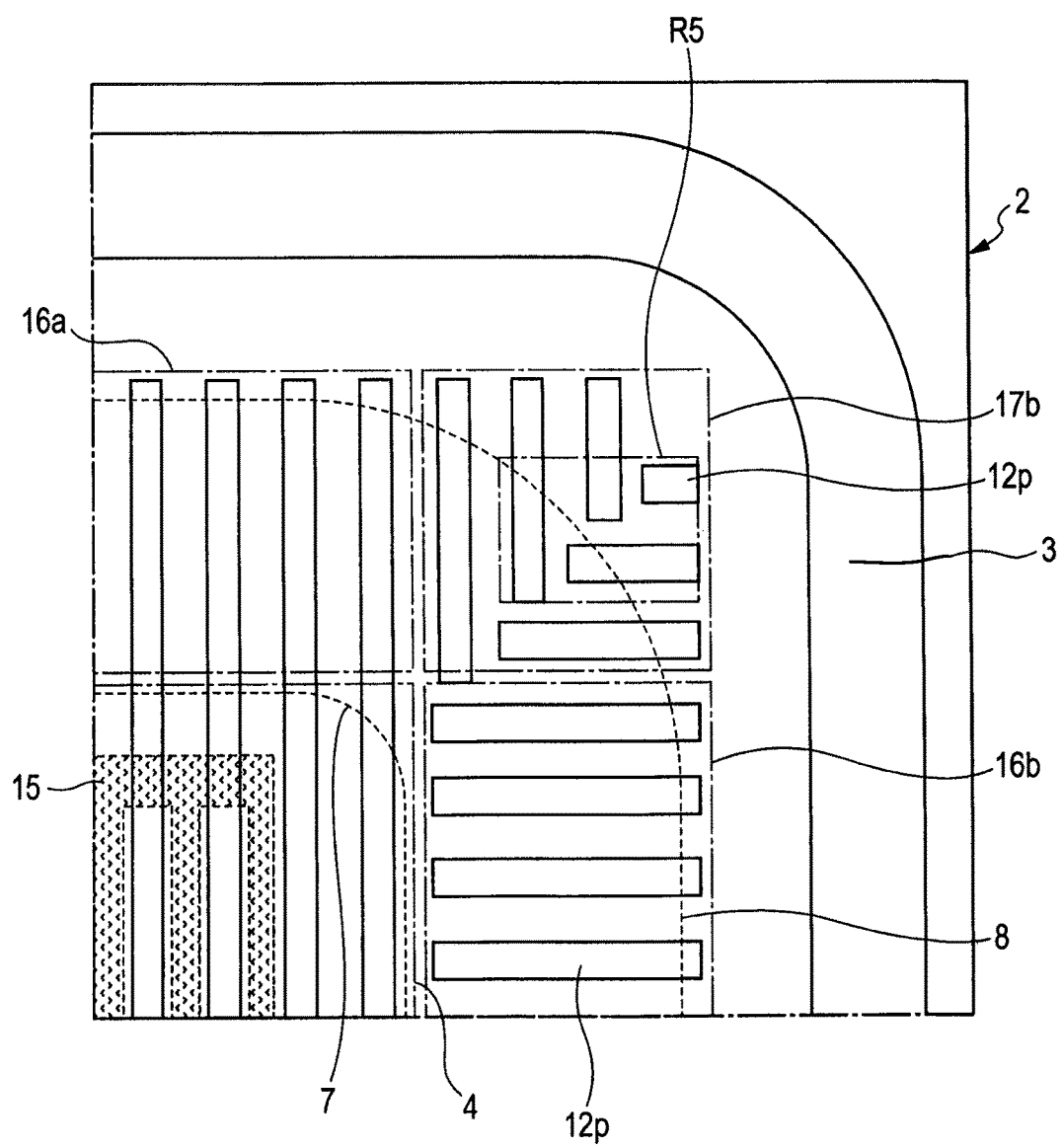
FIG. 39 is a chip top surface schematic partially enlarged view for illustrating the super-junction layout and the like of the same portion as FIG. 38.
Figure 40:
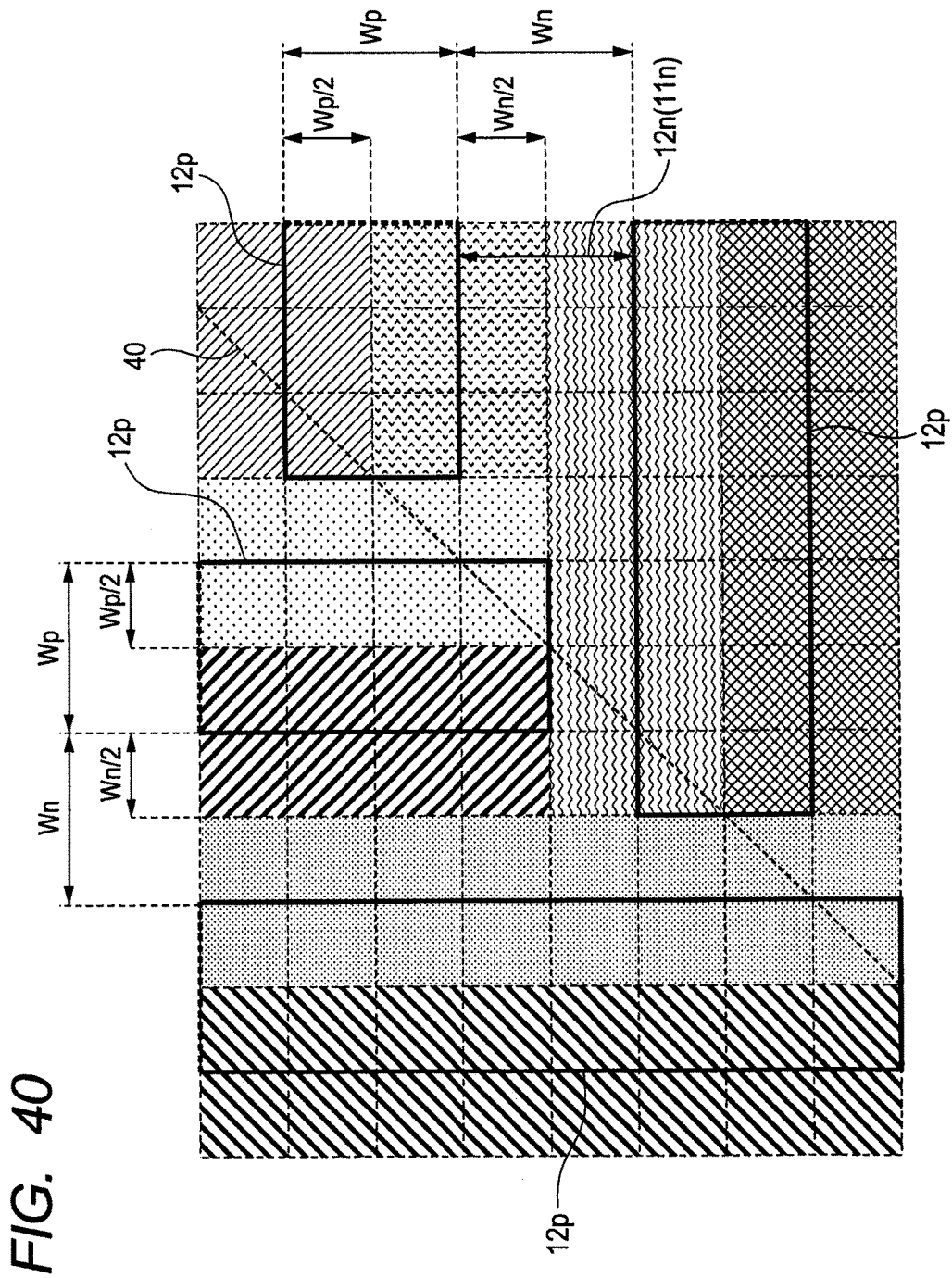
FIG. 40 is a super-junction layout illustrative view of the corner part charge balance processing part partially cut-out region R5 of FIG. 39.

(2) Charge Balance Type Corner-Part Super-Junction Layout (Mainly FIGS. 38 to 40)

The example of this sub-section is a still other modified example with respect to the basic form of the peripheral part super-junction structure (FIGS. 35 and 36).

FIG. 38 is a chip top surface partially enlarged view (charge balance type corner layout) of the chip corner part cut-out region R1 of FIG. 35. FIG. 39 is a chip top surface schematic partially enlarged view for illustrating the super-junction layout and the like of the same portion as FIG. 38. FIG. 40 is a super-junction layout illustrative view of the corner part charge balance processing part partially cut-out region R5 of FIG. 39. Based on these, a description will be given to a modified example and the like (charge balance type corner-part super-junction layout) of the super-junction layout in the peripheral region (edge termination area) regarding the application to the three-dimensional resurf structure.

FIG. 38 shows the P column layout of the charge balance type chip corner part. As shown in FIG. 38, in the active cell part super-junction structure 14, and the peripheral side regions 16a and 16b (16c and 16d), the layout is the same as the non-charge balance type column layout. However, in the peripheral corner regions 17b (17a, 17c, and 17d), as compared with the non-charge balance type bending layout (FIG. 31), the P column regions 12p are separated from each other at a portion along the diagonal line 40. Further, the ends of respective P column regions 12p are in positional relation mutually interpenetrating from opposite sides thereof.

FIG. 39 schematically shows the structure with the P column regions 12p reduced in number for ease of understanding of this point. FIG. 40 shows the corner part charge balance processing part partially cut-out region R5 on an enlarged and deformed scale for illustrating the correlation between the P column regions 12p running in the X and Y directions. In FIG. 40, the thickness Wn of the N column is shown on a reduced scale ("N column reduced-scale presentation") so that the thickness Wn of the N column and the thickness Wp of the P column are roughly equal in the drawing (only in this figure, it is apparently shown in the figure that Wn=Wp). Therefore, the charge amounts included in the same area are equal. As shown in FIG. 40, in the charge balance type corner column layout, the charge amounts of the half-width regions (band-like regions with widths of Wn/2 and Wp/2 each of which is half the thickness of the column) given the same hatching on the opposite sides of the side in the longitudinal direction of the P column region 12p are equal in absolute value, and are opposite in sign to each other. As a result, with a layout such that the hatched parts completely cover the whole region (e.g., the peripheral corner region 17b), the local charge balance is held. This indicates that the following configuration is desirable to this end: for example, the center of the side in the lateral direction of the P column region 12p lies on the diagonal line 40 of the semiconductor chip or the peripheral corner region; and the closest distance between the adjacent P column regions 12p is set at about Wn/2, half the thickness of the N column.

8. Explanation of Application to Other Power Type Active Elements (IGBT, and Power Diode) (Mainly FIGS. 41 and 42)

Up to this point, a specific description was given by mainly taking the case where the metal field plates or the like in the chip peripheral region are applied to the power type semiconductor active element of a power MOSFET or the like as an example. However, in this section, a specific description will be given to the application to elements of other types belonging to the power type semiconductor active elements. However, it is only that the given names such as electrode and impurity-doped region are somewhat changed. The essential part structure such as the drift region is almost the same. Therefore, an overlapping description will be omitted in principle. Further, in this section, an element having a super-junction structure will be mainly described specifically. However, as described in Section 3 or 4, it is naturally understood that the description is also applicable roughly as it is to an element not having a super-junction structure.

Therefore, in this section, there is shown only a device cross-sectional view corresponding to FIG. 4 having a relatively large number of differences.

Figure 41:
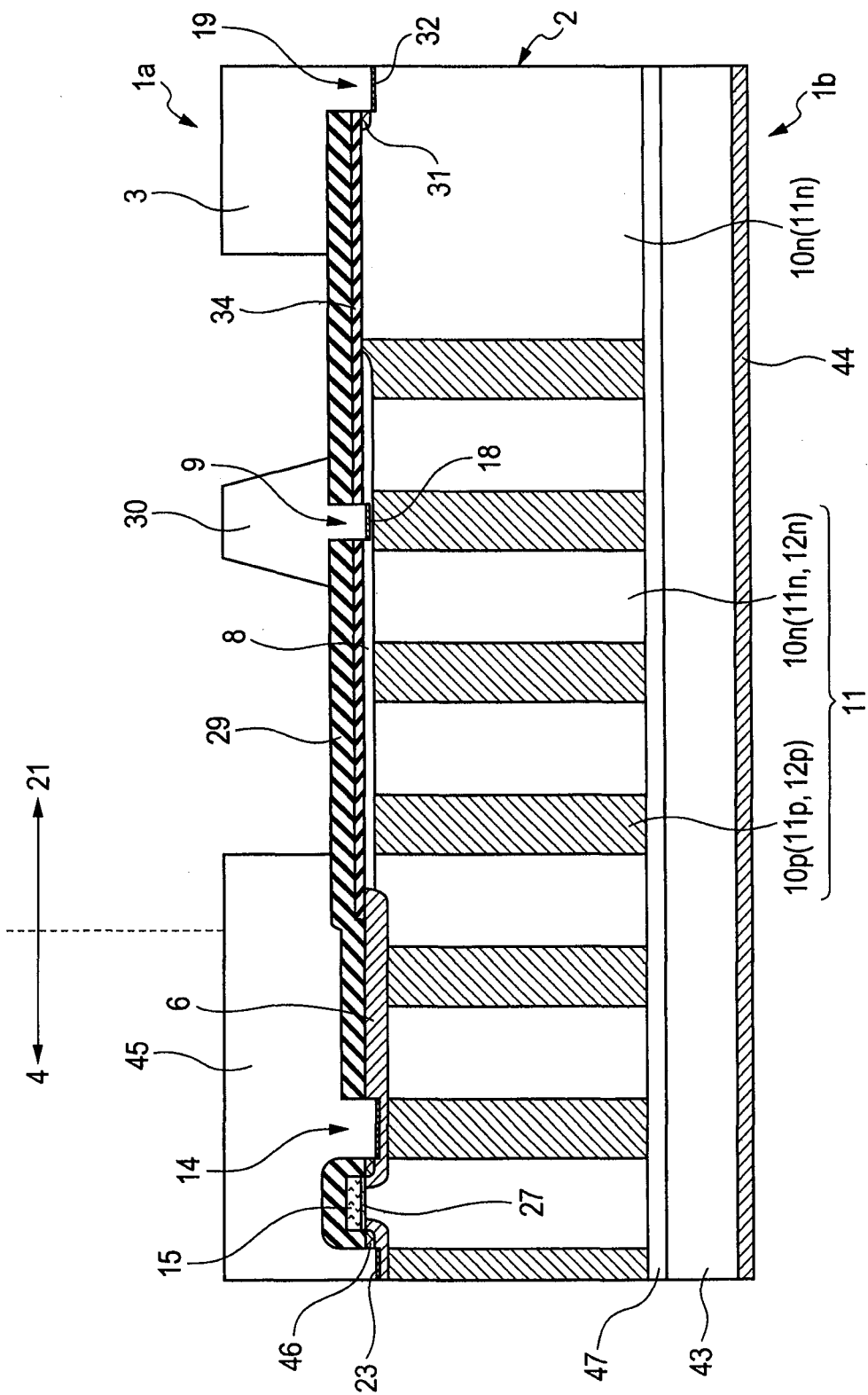
FIG. 41 is a schematic chip cross-sectional view corresponding to FIG. 4 for illustrating the application to another power type active element (IGBT)

(1) Application to IGBT (Mainly FIG. 41)

An IGBT is, from the viewpoint of pure structure, basically obtained by inserting a P type collector region into the back surface of the power MOSFET described in Sections 1 to 7. From the viewpoint of the external terminal, the IGBT can also be regarded as the one obtained by replacing the source and the drain of the already described power MOSFET with an emitter and a collector, respectively.

FIG. 41 is a schematic chip cross-sectional view corresponding to FIG. 4 for illustrating the application to another power type active element (IGBT). Based on this, a description will be given to the application to another power type active element (IGBT).

As shown in FIG. 41, over the surface of the P type collector region 43 of the back surface 1*b* of the chip 2, there is disposed a metal back surface collector electrode 44. Over the P type collector region 43, there are an N type field stop region 47 and a drift region 11. The drift region 11 includes N columns 12*n*, P columns 12*p* (P type drift regions), N type drift regions 11*n*, and the like. In the surface region of the drift region 11, there is disposed the P type main junction 6 (P well, a P body region, or the outer edge thereof). In the P body region 6, there are disposed an N+ emitter region 46, a P+ body contact region 23, and the like. In the outside of the P type main junction 6, there is disposed a P− type surface resurf region 8 coupled therewith. In the surface region of the N type drift region 11*n* at the end of the chip 2, there are disposed an N+ channel stop region 31, a P+ chip peripheral contact region 32, and the like. Over the semiconductor surface between a pair of N+ emitter regions 46, there is disposed a polysilicon gate electrode 15 via a gate insulation film 27. Over the polysilicon gate electrode 15 and the field insulation film 34, there is disposed an interlayer insulation film 29. Over the interlayer insulation film 29, there are formed aluminum type electrode films such as a metal emitter electrode 45 and a metal field plate 30 and a metal guard ring 3 in the chip peripheral region 21. The metal electrodes are electrically coupled with the P+ body contact region 23 (via the contact part 14 in the cell region), via the field plate contact part 9, the contact region 18, and the N+ channel stop region 31 (via the chip peripheral contact part 19, i.e., the peripheral recess part), the P+ chip peripheral contact region 32, and the like, respectively. Incidentally, the width Wn (thickness) of the N column 12*n*, and the width Wp (thickness) of the P column 12*p* are, for example, about 6 micrometers and about 4 micrometers, respectively. Whereas, the impurity concentration of the N column 12*n* is, for example, about $3.3 \times 10^{15}/cm^3$ (e.g., phosphorus). The impurity concentration of the P column 12*p* is, for example, about $5.0 \times 10^{15}/cm^3$ (e.g., boron).

Herein, in this example, between the metal emitter electrode 45 and the metal guard ring 3, there is disposed a nearly ring-shaped metal field plate 30 formed of an aluminum type electrode film or the like at the same layer as these. The metal field plate 30 is electrically coupled (i.e., is in ohmic-contact) with the contact region 18 disposed in the surface 1*a* of the semiconductor substrate 2 via the contact part 9.

Figure 42:
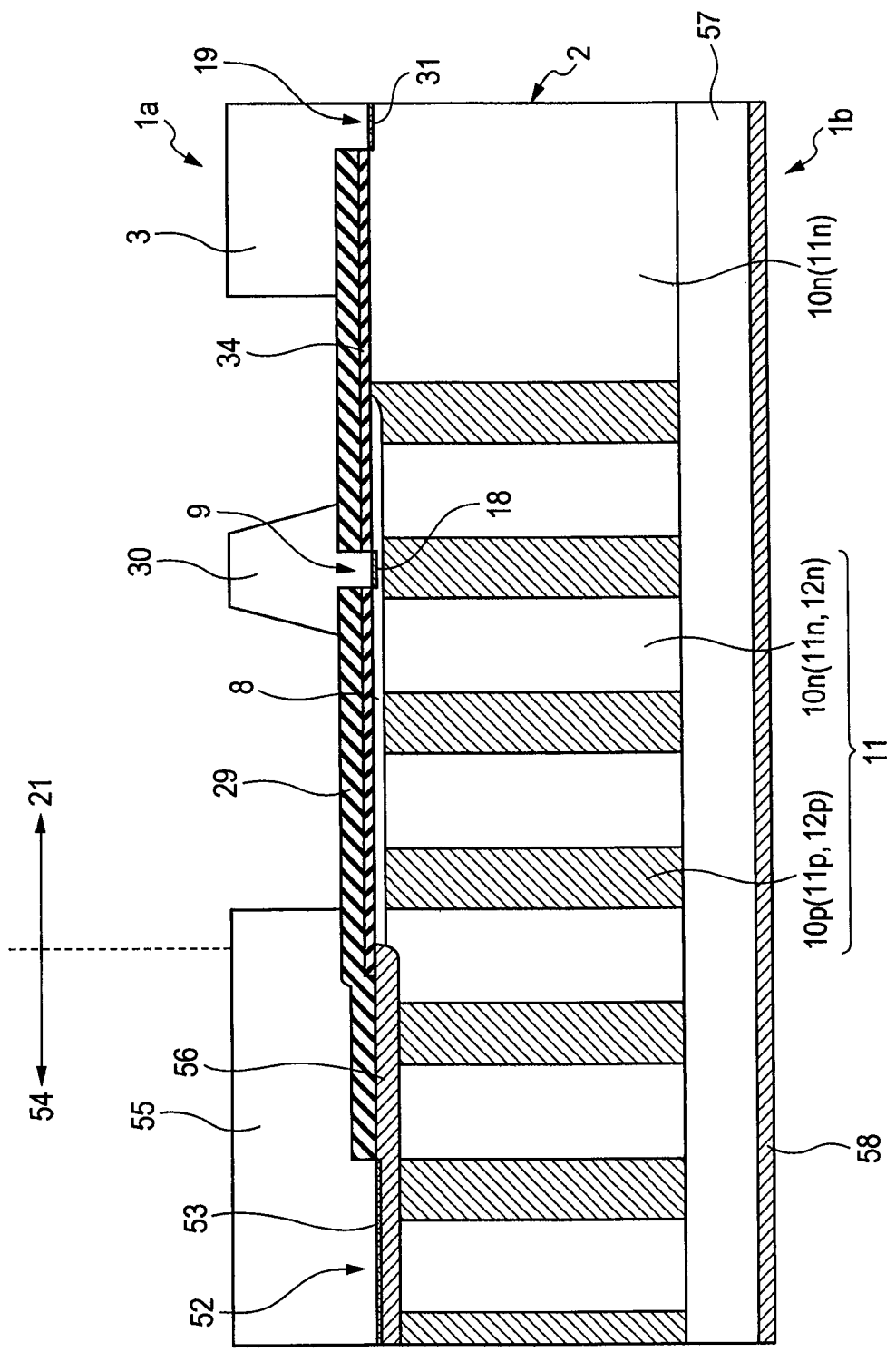
FIG. 42 is a schematic chip cross-sectional view corresponding to FIG. 4 for illustrating the application to a still other power type active element (power diode)

(2) Application to Power Diode (Mainly FIG. 42)

The PIN diode herein shown can be basically regarded as the one obtained by removing the complicated doped structure in the P body region and the gate structure over the substrate in the power MOSFET described in Sections 1 to 7 in terms of pure structure. Further, from the viewpoint of the external terminals, the PIN diode can also be regarded as the one obtained by replacing the source and the drain of the already described power MOSFET with an anode and a cathode, respectively. Incidentally, in the power diode, there is no gate.

Further, in this section, the example of the PIN diode (Pin Diode) will be described specifically. However, it is naturally understood that the present invention is also applicable to a Schottky diode, a composite MPS (Merged Pin-Schottky) diode, a SSD (Static-Shielding-Diode), and the like.

FIG. 42 is a schematic chip cross-sectional view corresponding to FIG. 4 for illustrating the application to another power type active element (power diode). Based on this, a description will be given to the application to another power type active element (power diode).

As shown in FIG. 42, in the surface of the N+ type cathode region 57 on the back surface 1*b* of the chip 2, there is disposed a metal back surface cathode electrode 58. Over the N+ type cathode region 57, there is a drift region 11. The drift region 11 includes N columns 12*n*, P columns 12*p* (P type drift region), N type drift regions 11*n*, and the like. In the surface region of the drift region 11, there is disposed a P type anode region 56. In the P type anode region 56, there are disposed a P+ type contact region 53 and the like. In the outside of the P type anode region 56, there is disposed a P− type surface resurf region 8 coupled therewith. In the surface region of the N type drift region 11*n* at the end of the chip 2, there are disposed an N+ channel stop region 31, a P+ chip peripheral contact region 32, and the like. Over the surface 1*a* of the semiconductor substrate 2, there are disposed a field insulation film 34 and an interlayer insulation film 29. Over the insulation films 29 and 34, there are formed aluminum type electrode films such as a metal anode electrode 55, a metal field plate 30 and a metal guard ring 3 in the chip peripheral region 21. The metal electrodes are electrically coupled with the P+ type contact region 53 via the contact part 52 in the main diode region 54, the contact region 18 via the field plate contact part 9, and the N+ channel stop region 31 (P+ chip peripheral contact region 32) and the like via the chip peripheral contact parts 19, i.e., the peripheral recess part, respectively. Incidentally, the width Wn (thickness) of the N column 12*n*, and the width Wp (thickness) of the P column 12*p* are, for example, about 6 micrometers and about 4 micrometers, respectively. Whereas, the impurity concentration of the N column 12*n* is, for example, about $3.3 \times 10^{15}/cm^3$ (e.g., phosphorus). The impurity concentration of the P column 12*p* is, for example, about $5.0 \times 10^{15}/cm^3$ (e.g., boron).

Herein, in this example, between the metal anode electrode 55 and the metal guard ring 3, there is disposed the nearly ring-shaped metal field plate 30 formed of an aluminum type electrode film or the like at the same layer as these. The metal field plate 30 is electrically coupled (i.e., is in ohmic-contact) with the contact region 18 disposed in the surface 1*a* of the semiconductor substrate 2 via the contact part 9.

9. Consideration of Structure when Cutting is Performed in a Longitudinal Direction Along the Metal Field Plate 30 between the Field Contact Part 9 in the Peripheral Side Region 16*a* and the Field Contact Part 9 in the Peripheral Side Region 16*b* in the Chip Corner Part Cut-Out Region R1 of FIG. 3.

Figure 43:
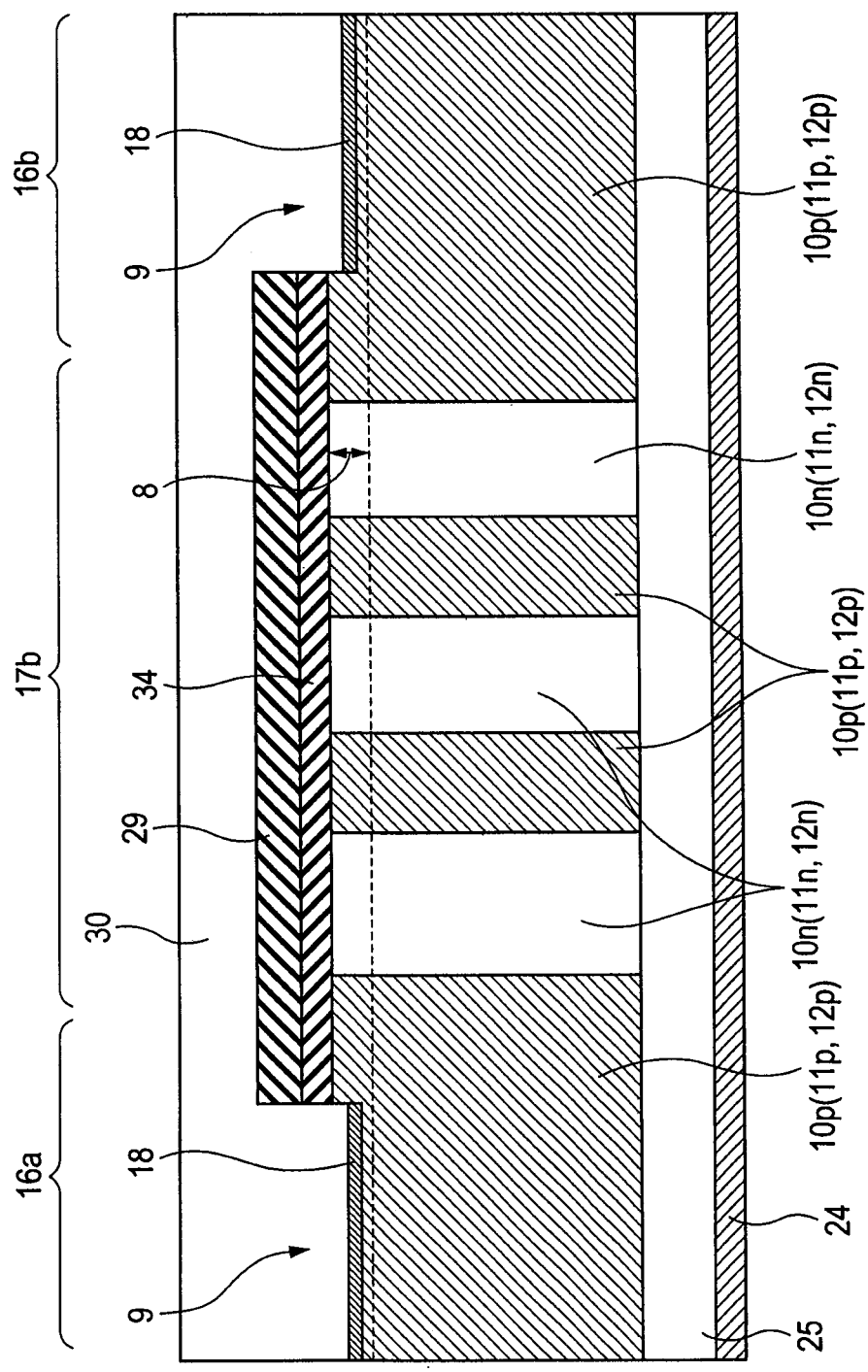
FIG. 43 is a cross-sectional view when cutting is performed in a longitudinal direction along a metal field plate 30 between a contact 9 in a peripheral side region 16a and a contact 9 in a peripheral side region 16b in the chip corner part cut-out region R1 of FIG. 3.

FIG. 43 is a cross-sectional view when cutting is performed in a longitudinal direction along the metal field plate 30 between the field contact part 9 in the peripheral side region 16*a* and the field contact part 9 in the peripheral side region 16*b* in the chip corner part cut-out region R1 of FIG. 3.

As shown in FIG. 43, the metal field plate 30 is electrically coupled (i.e., is in ohmic-contact) with the P type column regions 12*p* at the contact region 18 of the field contact part 9 in the peripheral side region 16*a* and the contact region 18 of the field contact part 9 in the peripheral side region 16*b*. On the other hand, in the peripheral corner region 17*b* (17*a*, 17*c*, or 17*d*), the metal field plate 30 is formed over the interlayer insulation film 29 formed over the field insulation film 34, and is not electrically coupled with the P type column regions 12*p* and the N type column regions 12*n* formed under the field insulation film 34.

Incidentally, it is naturally understood that the portion of the peripheral side region 16b, the peripheral corner region 17c, and the peripheral side region 16c, the portion of the peripheral side region 16c, the peripheral corner region 17d, and the peripheral side region 16d, and the portion of the peripheral side region 16d, the peripheral corner region 17a, and the peripheral side region 16a are also the same as the cross-sectional view of FIG. 43.

Figure 44:
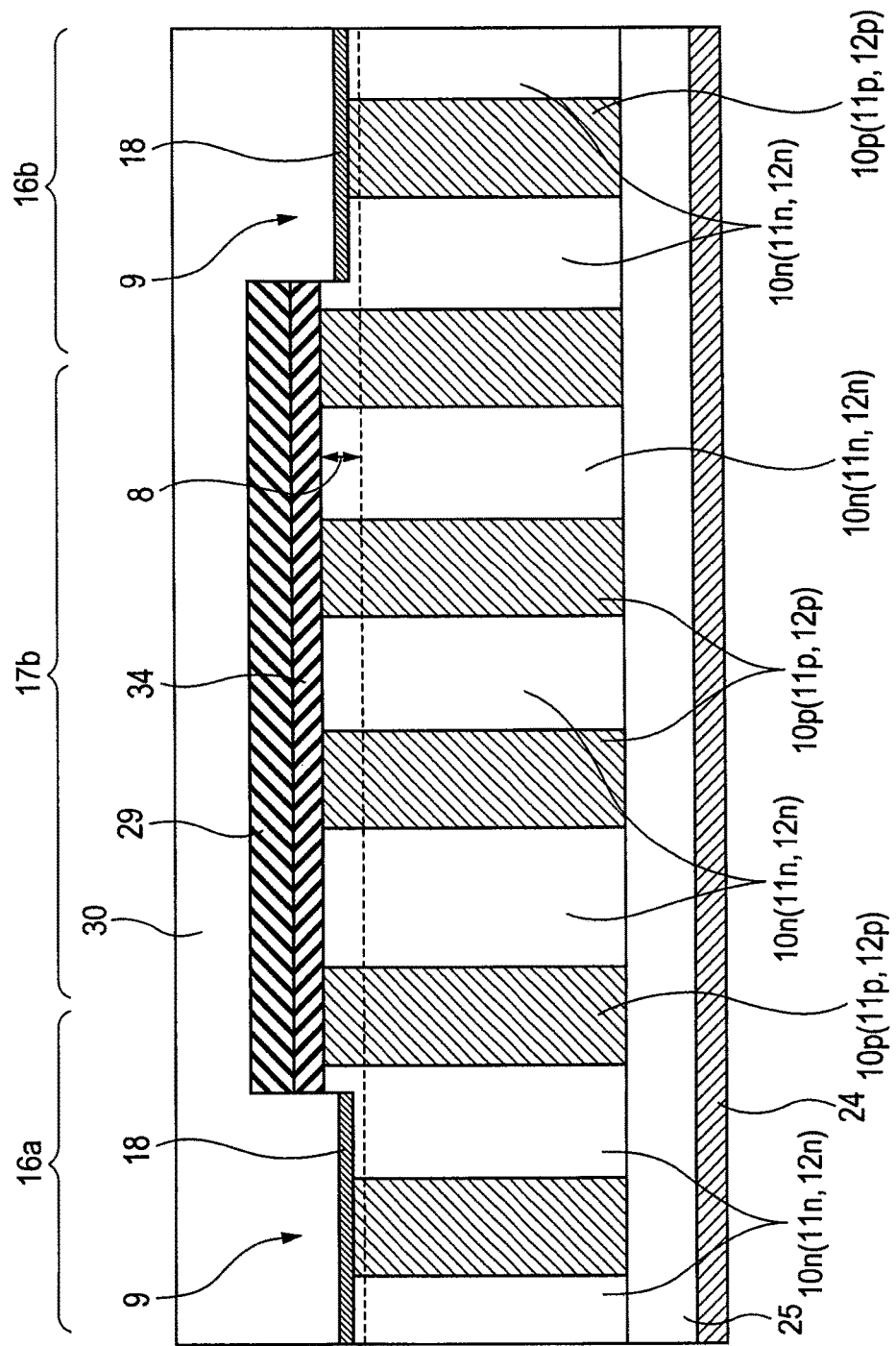
FIG. 44 is a cross-sectional view corresponding to FIG. 43 when the configuration is applied to the super-junction column layout of the three-dimensional resurf structure described in FIGS. 35 to 42.

Further, for the field contact parts 9, the dot-like contact system of FIG. 26 can be adopted. Whereas, for the shape of the metal field plate 30, the right-angle bent shape of FIG. 27 can be used. Still further, for the super-junction layout of the corner part, there can be used FIG. 28, 29, 30, 31, 32, or 33. Furthermore, FIG. 44 is a cross-sectional view corresponding to FIG. 43 when the configuration is applied to the super-junction column layout of the three-dimensional resurf structure described in FIGS. 35 to 42. The peripheral corner region 17b (17a, 17c, or 17d) of an IGBT or a power diode also has the same configuration as the cross-sectional view of FIG. 43 or 44.

10. Supplementary Explanation on Respective Embodiments and the Like, and Overall Consideration The respective embodiments (including modified examples) and the like described up to this point are particularly effective for a power type semiconductor active element having a super junction manufactured by a trench fill system. However, the effect of correcting the undesirable potential distortion at each corner part is also common to a power type semiconductor active element having a super junction manufactured by a multi-epitaxial system. Further, as previously described, the effect is also similarly effective for a device not having a super junction and having a single conductivity type drift region. Further, not limited to the trench fill system performed under the conditions sensitive to the crystal growth direction, the effect is also similarly effective for the trench fill system performed under the conditions relatively not sensitive to the crystal growth direction.

With the respective embodiments (including modified examples) described up to this point, each structure has the field plate 30 in the chip peripheral region 21, has a substrate contact at a portion along the side of the active cell at which the equipotential planes show a flat shape (which is generally also a portion along the side of the chip), and does not have a substrate contact at each chip corner part at which the equipotential planes are curved. As a result, the potential at a portion at which relatively stably changing equipotential planes are flat is applied to the chip corner part via the field plate 30. Namely, in a general case, the ring-shaped field plate 30 includes linear portions (relatively linear portions) along each side (the chip or the active cell region), and the bent portions such as the curved portions or L-shaped portions corresponding to the corner parts.

Incidentally, the field plate 30 may be formed of the aluminum type electrode layer as herein described, or may be formed of another conductive layer such as polysilicon. However, when the filed plate 30 is formed of the aluminum type electrode layer, there occurs a merit of enabling simplification of the process. Further, the electric resistance is also relatively low.

11. Summary

Up to this point, the inventions made by the present inventors were specifically described based on the embodiments. However, the present invention is not limited thereto. It is naturally understood that various modifications may be made within the scope not departing from the gist thereof.

For example, in the embodiments, a specific description was given by taking the MOS structure of the planar type gate structure as an example. However, the present invention is not limited thereto. It is naturally understood that the present invention is also entirely similarly applicable to the trench type gate structure. Further, for the layout of the gate electrodes of the MOSFETs, there was shown an example in which the gate electrodes are arranged in stripes in parallel with the pn columns. However, there are applicable various layouts such as arrangement in the directions orthogonal to the pn columns and arrangement in a grid.

Incidentally, in the embodiments, a specific description was given to the one in which an N channel device is formed over the N epitaxial layer over the N+ silicon single crystal substrate. However, the present invention is not limited thereto. It is also acceptable that a P channel device is formed over the top surface of the N epitaxial layer over the P+ silicon single crystal substrate.

Further, in the embodiments, a specific description was given by taking the power MOSFET as an example. However, the present invention is not limited thereto. It is naturally understood that the present invention is also applicable to power devices having a super-junction structure such as diodes and bipolar transistors (including IGBT). Incidentally, it is naturally understood that the present invention is also applicable to semiconductor integrated circuit devices including therein the power MOSFETs, diodes, bipolar transistors, and the like.

Further, in the embodiments, as the method for forming the super-junction structure, mainly, the trench fill system was specifically described. However, the present invention is not limited thereto. It is naturally understood that the present invention is also applicable to, for example, a multi-epitaxial system.

Still further, in the embodiments, mainly, the devices formed at the silicon type semiconductor substrate were specifically described. However, the present invention is not limited thereto. It is naturally understood that the present invention is also applicable almost as it is to the devices formed at the GaAs type semiconductor substrates, silicon carbide type semiconductor substrates, and silicon nitride type semiconductor substrates.

What is claimed is:

1. A semiconductor device including a power MOSFET having a super-junction structure, comprising:
    a semiconductor substrate having a first main surface and a second main surface opposite each other, the semiconductor substrate having an active cell region in which the power MOSFET is formed and a peripheral region over the first main surface, the peripheral region surrounding the active cell region in a plan view;
    a gate electrode disposed over the first main surface;
    a source electrode disposed over the first main surface;
    a drain electrode disposed over the second main surface;
    a plurality of first N-columns and a plurality of first P-columns disposed in the first main surface;
    a ring-shaped field plate disposed over the first main surface in to surround the active cell region in the plan view, the field plate including a pair of first straight portions opposite each other and a pair of second straight portions opposite each other, each of the pair of the first portions and each of the pair of second portions are disposed in the peripheral region and connected via a plurality of corner portions: and one elongated, or a plurality of dot-like, first contact holes disposed over the first main surface and coupling the field plate and a first one of the plurality of the first P-columns;

wherein the one elongated, or the plurality of dot-like, first contact holes and a first one of the first straight portions of the field plate are overlapped in the plan view, and wherein the one elongated, or the plurality of dot-like, first contact holes extend substantially along a majority of a length of the first one of the first straight portions in the plan view, wherein the one elongated, or the plurality of dot-like, first contact holes do not overlap with the corner portions of the field plate in the plan view, wherein the field plate has a first ohmic contact part that extends over the first one of the plurality of the first P-columns in the peripheral region where the first one of the first straight portions of the field plate and the first one of the plurality of the first P-columns are in ohmic contact via the one elongated, or the plurality of dot-like, first contact holes, and wherein the field plate does not contact the first N-columns and the first P-columns in any of the corner portions.

2. The semiconductor device according to claim 1, wherein the field plate is disposed in such a manner as to surround the source electrode in the plan view.

3. The semiconductor device according to claim 1, wherein each of the plurality of first N-columns is disposed parallel to each of the plurality of first P-columns.

4. The semiconductor device according to claim 1, further comprising:

a plurality of second P-columns disposed in the first main surface in the peripheral region, wherein each of the plurality of the second P-columns is disposed perpendicular to each of the plurality of the first N-columns and P-columns.

5. The semiconductor device according to claim 4, further comprising: one elongated, or a plurality of dot-like, second contact holes disposed over the first main surface and coupling the field plate and a second one of the plurality of the second P-columns, wherein the one elongated, or the plurality of dot-like, second contact holes and a first one of the second straight portions of the field plate are overlapped in the plan view, and wherein the one elongated, or the plurality of dot-like, second contact holes extend substantially along a majority of a length of the first one of the second straight portions in the plan view, wherein the field plate has a second ohmic contact part that extends over the second one of the plurality of the first P-columns in the peripheral region where the first one of the first straight portions of the field plate and the second one of the plurality of the first P-columns are in ohmic contact via the one elongated, or the plurality of dot-like, second contact holes.

6. The semiconductor device according to claim 5, wherein the one elongated, or the plurality of dot-like, second contact holes do not overlap with the corner portions of the field plate in the plan view.

* * * * *